(12) United States Patent
Srinivasan et al.

(10) Patent No.: US 7,143,231 B1
(45) Date of Patent: Nov. 28, 2006

(54) METHOD AND APPARATUS FOR PERFORMING PACKET CLASSIFICATION FOR POLICY-BASED PACKET ROUTING

(75) Inventors: Varadarajan Srinivasan, Los Altos Hills, CA (US); Bindiganavale S. Nataraj, Cupertino, CA (US); Sandeep Khanna, Santa Clara, CA (US)

(73) Assignee: Netlogic Microsystems, Inc., Mountain View, CA (US)

( * ) Notice: Subject to any disclaimer, the term of this patent is extended or adjusted under 35 U.S.C. 154(b) by 0 days.

(21) Appl. No.: 09/406,170

(22) Filed: Sep. 23, 1999

(51) Int. Cl.
*G06F 12/00* (2006.01)
(52) U.S. Cl. ..................... 711/108; 712/300
(58) Field of Classification Search ............. 370/412, 370/229, 230.1, 230, 235, 395.2, 395.42, 370/395.4, 395.41, 428, 429, 395.43; 711/108; 365/49; 712/300
See application file for complete search history.

(56) References Cited

U.S. PATENT DOCUMENTS

| | | | |
|---|---|---|---|
| 3,257,646 A | 6/1966 | Roth | |
| 3,353,159 A | 11/1967 | Lee, III | |
| 3,602,899 A | 8/1971 | Lindquist et al. | 340/172.5 |
| 3,675,211 A | 7/1972 | Raviv | |
| 3,685,020 A | 8/1972 | Meade | 340/172.5 |
| 3,868,642 A | 2/1975 | Sachs | |
| 4,030,077 A * | 6/1977 | Florence et al. | 712/300 |
| 4,112,502 A | 9/1978 | Scheuneman | |
| 4,244,033 A | 1/1981 | Hattori | |
| 4,464,732 A * | 8/1984 | Clark | 712/300 |
| 4,472,805 A | 9/1984 | Wacyk et al. | |
| 4,523,301 A | 6/1985 | Kadota | |
| 4,611,280 A * | 9/1986 | Linderman | 712/300 |
| 4,646,271 A | 2/1987 | Uchiyama | |
| 4,656,626 A | 4/1987 | Yudichak et al. | |
| 4,670,858 A | 6/1987 | Almy | |

(Continued)

FOREIGN PATENT DOCUMENTS

EP 0 267 612 A2 5/1988

(Continued)

OTHER PUBLICATIONS

T.V. Lakshman and D. Stiliadis, "High-Speed Policy-Based Packet Forwarding Using Efficient Multi-dimensional Range Matching," *SIGCOMM*, 1998, pp. 203-214.

(Continued)

*Primary Examiner*—Doris H. To
*Assistant Examiner*—Steve Blount
(74) *Attorney, Agent, or Firm*—Shemwell Mahamedi LLP

(57) ABSTRACT

A method and apparatus for performing packet classification in a digital signal processor for policy-based packet routing. For one embodiment, the digital signal processor includes a policy statement table for storing policy statements. Each policy statement has associated with it a priority number that indicates the priority of the policy statement relative to other policy statements. The priority numbers are separately stored in a priority index table. The priority index table includes priority logic that determines the most significant priority number from among the policy statements that match an incoming packet during a classification of filter operation. The priority logic also identifies the location in the priority index table of the most significant priority number. The identified location in the priority index table can be used to access associated route information or other information stored in a route memory array. New policy statements can be added at any location in the policy statement table, and the associated priority numbers loaded into corresponding locations in the priority index table. Priority numbers of previously stored priority policy statements may be updated such that the new policy statement does not have the same priority number as the previously stored policy statements.

8 Claims, 38 Drawing Sheets

U.S. PATENT DOCUMENTS

| | | | |
|---|---|---|---|
| 4,747,080 A | 5/1988 | Yamada | |
| 4,758,982 A | 7/1988 | Price | |
| 4,780,845 A | 10/1988 | Threewitt | |
| 4,785,398 A | 11/1988 | Joyce et al. | |
| 4,791,606 A | 12/1988 | Threewitt et al. | |
| 4,813,002 A | 3/1989 | Joyce et al. | |
| 4,845,668 A | 7/1989 | Sano et al. | |
| 4,896,261 A * | 1/1990 | Nolan | 710/107 |
| 4,903,234 A | 2/1990 | Sakaraba et al. | |
| 4,928,260 A | 5/1990 | Chuang et al. | |
| 4,958,377 A | 9/1990 | Takahashi | |
| 4,959,811 A | 9/1990 | Szezepanek | |
| 4,975,873 A | 12/1990 | Nakabayashi et al. | |
| 4,991,134 A * | 2/1991 | Ivsin | 712/300 |
| 4,996,666 A * | 2/1991 | Duluk, Jr. | 365/49 |
| 5,010,516 A | 4/1991 | Oates | |
| 5,014,195 A | 5/1991 | Farrell et al. | |
| 5,036,486 A | 7/1991 | Noguchi et al. | |
| 5,051,948 A | 9/1991 | Watabe et al. | |
| 5,053,991 A | 10/1991 | Burrows | |
| 5,068,822 A * | 11/1991 | Lawrence | 712/300 |
| 5,072,422 A | 12/1991 | Rachels | |
| 5,107,501 A | 4/1992 | Zorian | |
| 5,111,427 A | 5/1992 | Kobayashi et al. | |
| 5,226,005 A | 7/1993 | Lee et al. | |
| 5,239,642 A | 8/1993 | Gutierrez et al. | |
| 5,247,688 A * | 9/1993 | Ishigami | 707/7 |
| 5,265,100 A | 11/1993 | McClure et al. | |
| 5,317,756 A * | 5/1994 | Komatsu et al. | 712/300 |
| 5,319,590 A | 6/1994 | Montoye | |
| 5,319,763 A | 6/1994 | Ho et al. | |
| 5,339,268 A | 8/1994 | Machida | |
| 5,383,146 A | 1/1995 | Threewitt | |
| 5,388,189 A * | 2/1995 | Kung | |
| 5,396,449 A | 3/1995 | Atallah et al. | |
| 5,406,508 A | 4/1995 | Hayashibara | |
| 5,414,704 A | 5/1995 | Spinney | |
| 5,422,838 A | 6/1995 | Lin | |
| 5,423,015 A * | 6/1995 | Chung | 711/108 |
| 5,440,709 A | 8/1995 | Edgar | 395/401 |
| 5,440,715 A | 8/1995 | Wyland | |
| 5,446,685 A | 8/1995 | Holst | |
| 5,454,094 A | 9/1995 | Montove | |
| 5,455,576 A | 10/1995 | Clark, II et al. | |
| 5,465,335 A | 11/1995 | Anderson | |
| 5,467,319 A | 11/1995 | Nusinov et al. | |
| 5,469,161 A | 11/1995 | Bezek | |
| 5,475,825 A | 12/1995 | Yonezawa et al. | |
| 5,485,418 A | 1/1996 | Hiraki et al. | |
| 5,490,102 A | 2/1996 | Jubran | |
| 5,491,703 A | 2/1996 | Barnaby et al. | |
| 5,513,134 A | 4/1996 | Cooperman et al. | |
| 5,517,441 A | 5/1996 | Dietz et al. | |
| 5,592,432 A * | 1/1997 | Vishlitzky et al. | |
| 5,598,115 A | 1/1997 | Holst | |
| 5,615,135 A | 3/1997 | Waclawsky et al. | |
| 5,619,676 A | 4/1997 | Fukuda et al. | |
| 5,621,677 A | 4/1997 | Jones | |
| 5,642,114 A | 6/1997 | Komoto | |
| 5,642,322 A | 6/1997 | Yoneda | |
| 5,646,878 A | 7/1997 | Samra | |
| 5,649,149 A | 7/1997 | Stormon et al. | |
| 5,699,288 A | 12/1997 | Kim et al. | |
| 5,706,224 A * | 1/1998 | Srinivasan | |
| 5,740,098 A | 4/1998 | Adams et al. | |
| 5,745,488 A | 4/1998 | Thompson et al. | 370/395 |
| 5,752,069 A | 5/1998 | Roberts et al. | |
| 5,818,786 A | 10/1998 | Yoneda | |
| 5,818,873 A | 10/1998 | Wall et al. | |
| 5,828,324 A | 10/1998 | Clark, II | |
| 5,841,874 A | 11/1998 | Kempke et al. | 380/50 |
| 5,860,085 A | 1/1999 | Stormon et al. | 711/108 |
| 5,870,324 A | 2/1999 | Helwig | |
| 5,893,931 A | 4/1999 | Peng et al. | 711/206 |
| 5,920,886 A | 7/1999 | Feldmeier | 711/108 |
| 5,930,359 A | 7/1999 | Kempke et al. | 380/9 |
| 5,933,363 A | 8/1999 | Shindo | |
| 5,940,852 A | 8/1999 | Rangasayee | |
| 5,946,704 A | 8/1999 | Yoneda et al. | 711/108 |
| 5,949,696 A | 9/1999 | Threewitt | |
| 5,949,734 A | 9/1999 | Matano | |
| 5,978,885 A | 11/1999 | Clark, II | |
| 5,999,435 A | 12/1999 | Henderson et al. | |
| 6,000,008 A | 12/1999 | Simcoe | |
| 6,006,306 A | 12/1999 | Haywood et al. | |
| 6,011,795 A | 1/2000 | Varghese et al. | 370/392 |
| 6,014,732 A | 1/2000 | Naffziger | |
| 6,044,005 A | 3/2000 | Gibson et al. | |
| 6,065,064 A | 5/2000 | Satoh et al. | 709/249 |
| 6,069,573 A | 5/2000 | Clark, II et al. | |
| 6,081,440 A | 6/2000 | Washburn et al. | 365/49 |
| 6,108,227 A | 8/2000 | Voelkel | |
| 6,108,747 A | 8/2000 | Kaganoi | |
| 6,115,365 A * | 9/2000 | Newberg et al. | |
| 6,144,574 A | 11/2000 | Kobayashi et al. | |
| 6,175,514 B1 | 1/2001 | Henderson et al. | |
| 6,181,698 B1 | 1/2001 | Hariguchi | |
| 6,226,710 B1 | 5/2001 | Melchior | |
| 6,237,061 B1 | 5/2001 | Srinivasan | |
| 6,266,262 B1 | 7/2001 | Washburn et al. | |
| 6,289,414 B1 | 9/2001 | Feldmeier et al. | |
| 6,353,873 B1 * | 3/2002 | Melchior | |
| 6,362,993 B1 | 3/2002 | Henderson et al. | |
| 6,460,112 B1 | 10/2002 | Srinivasan et al. | |
| 6,467,019 B1 * | 10/2002 | Washburn | |
| 6,493,791 B1 * | 12/2002 | Akkary | 711/108 |
| 6,499,081 B1 | 12/2002 | Nataraj et al. | |
| 6,502,163 B1 * | 12/2002 | Ramankutty | 711/108 |
| 6,539,455 B1 | 3/2003 | Khanna et al. | |
| 6,567,340 B1 | 5/2003 | Nataraj et al. | |
| 6,748,484 B1 * | 6/2004 | Henderson et al. | 711/108 |

FOREIGN PATENT DOCUMENTS

| | | |
|---|---|---|
| EP | 0267612 A2 | 5/1988 |
| EP | 0 381 249 A2 | 8/1990 |
| EP | 0381249 A2 | 8/1990 |
| EP | 0660332 A1 | 6/1995 |
| EP | 0774758 A2 | 5/1997 |
| EP | 0 872 802 A2 | 10/1998 |
| EP | 0872802 A2 | 10/1998 |
| EP | 0944093 A1 | 9/1999 |
| JP | 08167295 | 6/1996 |
| WO | WO 98/12651 | 3/1998 |
| WO | WO98/12651 | 3/1998 |
| WO | WO 98/31581 | 6/1999 |
| WO | WO99/31581 | 6/1999 |
| WO | WO01/11630 A1 | 2/2001 |

OTHER PUBLICATIONS

Xipeng Xiao and Lionel M. Ni, "Internet QoS: A Big Picture," *IEEE Network*, Mar./Apr. 1999, pp. 8-18.

"White Paper—Introduction to QoS Policies," *Stardust.com*, 1999, pp. 1-22.

"Policy-Based Routing," *Cisco Systems, Inc.*, 1996, pp. 1-7.

Pankaj Gupta and Nick McKeown, "Packet Classification on Multiple Fields," *SIGCOMM* (Sep. 2, 1999), 14 pages.

V. Srinivasan, et al., "Packet Classification using Tuple Space Search," *SIGCOMM* (Sep. 2, 1999), 12 pages.

MUSIC Semiconductors, Advance Information, "MUAA Routing CoProcessor (RCP) Family," (Oct. 1, 1998), Rev. 1b, pp. 1-16.

Ian N. Robinson, "Pattern Addressable Memory", IEEE Micro, Jun. 1992, pp. 20-30.

GEC Plessey Semiconductors, "P2800 2K×64 Bit Multi-Port Content Addressable Memory", Preliminary Information, Feb. 1997, pp. 1-15.

GEC Plessey Semiconductors, "P2800 Multi-port Content Addressable Memory", Functional Product Specification GPS-FPS-2800-12, Jan. 1996.

Music Semiconductors, MU9C2480 LANCAM, Preliminary Data Sheet, Aug. 25, 1995, pp. 1-24.

Music Semiconcutors, MU9C1480 LANCAM Handbook, Nov. 1994.

KLSI KE5B064A1 Address Processor Ver. 2.0.2 Preliminary (believed to be published late 1995 or early 1996).

KLSI KE5B064H Series Address Processor Ver. 1.0.1 (believed to be published in late 1995 or early 1996).

Music Semiconductors, "MU9C1480 LANCAM" Advance Information, Mar. 22, 1990, pp. 1-11.

Music Semiconductors, "MUAA™ CAM Family" Advanced Information, Feb. 24, 1998, Rev. 0, pp. 1-16.

Motorola Semiconductor Technical Data, "Advanced Information 16K×64 CAM", MCM69C432, Jan. 1996, pp. 4 pages.

Advanced Micro Devices, "Final Am99C10A 256×48 Content Addressable Memory" Publication No. 08125, Rev. G, Dec. 1992, pp. 1-21.

Hiroshi Kadota et al., "An 8kbit Content-Addressable and Reentrant Memory", IEEE Journal of Solid-State Circuits, vol. SC-20, No. 5, Oct. 1985, pp. 951-956.

Landrock et al., "Associative Storage Module", IBM Technical Disclosure Bulletin, vol. 25, No. 5, Oct. 1992, pp. 2341-2342.

Sergio R. Ramirez-Chavez, "Encoding Don't Cares in Static and Dynamic Content-Addressable Memories", Transaction Briefs, IEEE Transactions on Circuits and System-II: Analog and Digital Signal Processing, vol. 39, No. 8, Aug. 1992, pp. 575-578.

Keikichi Tamaru, "The Trend of Functional Memory Development", Invited Paper Special Issue on LSI Memories, IEICE Trans. Electron, vol. E76-C, No. 11, Nov. 1993, pp. 1545-1554.

Patent Abstracts of Japan, Publication No. 08273376, Publication date Oct. 18, 1996.

Patent Abstracts of Japan, Application No. 09279525, Filed Sep. 26, 1997.

Waldvogel et al. "Scalable High-Speed Prefix Matching", ACM Transactions on Computer Systems (TOCS), vol. 19, pp. 440-482, Nov. 2001.

Srinivasan et al., "Fast Address Lookups Using Controlled Prefix Expansion", ACM Transactions on Computer Systems (TOCS), vol. 17, pp. 1-40, Feb. 1999.

Waldvogel et al., "Scalable High Speed IP Routing Lookups", Proceedings of the ACM SIGCOMM '97 Conference on Applications, Technologies, Architectures, and Protocols for Computer Communication, pp. 1997.

Engineers, Technical Report of IEICE, IN08-119 (Nov. 1998), pp. 7-12.

Japanese Patent Abstract, Publication No. 04021997A, published Jan. 24, 1992, 1 page.

Japanese Patent Abstract, Publication No. 05182472A, published Jul. 23, 1993, 1 page.

MOSAID, The Next Generation of Content Addressable Memories, MOSAID Technologies Incorporated, Sep. 1999, 8 pages.

C.C. Wang and I.H. Horng, Realization of Bidirection Associative Memory Using a Pseudo-Parallel Searching Approach, 1995 IEEE International Conference on Neural Networks, vol. 3, pp. 1502-1507, Dec. 1995.

Kobayashi, M. et al., "A Processor Based High-Speed Longest Prefix Match Search Engine", IEEE Workshiop on High Performance Switching and Routing, pp. 233-239, 2001.

Kobayashi, M. et al. "A Longest Prefix Match Search Engine For Multi-Gigabit IP Processing", IEEE International Conference on Communications, vol. 3, pp. 1360-1364, 2000.

Hayashi, T. et al., "High-Speed Table Lookup Engine for Ipv6 Longest Prefix Match", Global Telecommunications Conference, vol. 2, pp. 1576-1581, 1999.

Huang et al., "A Novel IP-Routing Lookup Scheme and Hardware Architecture For Multigigabit Switching Routers", IEEE Journal Selected Areas in Communications, pp. 1093-1104, Jun. 1999.

Huang et al., "A Fast Routing Lookup Scheme For Gigabit Switching Routers", Eighteenth Annual Joint Conference of the IEEE Computer and Communications Societies, vol. 3, pp. 1429-1436, 1999.

High Speed Address Search Engine, Document No. S13450EJ3V0PF00 (3rd edition), published Feb. 1999, © NEC Corporation, 2 pages.

Kanad Ghose, "Response Pipelined Cam Chips: The First Generation and Beyond,", 7th International Conference on VLSI Design, Jan. 1994, pp. 365-368.

Anthony McAuley et al., "A Self-Testing Reconfigurable CAM", IEEE Journal of Solid-State Circuits, vol. 26, No. 3, Mar. 1991 pp. 257-261.

Masao Akata, "A Scheduling Content-Addressable Memory for ATM Space Division Switch Control", IEEE International Solid-State Circuits Conference, Feb. 1991, New York.

Sook-ik Chae et al., "Content-Addressable Memory for VLSI Pattern Inspection", IEEE Journal of Solid-State Circuits, vol. 23, No. 1, Feb. 1988, pp. 74-78.

Yong-Chui Shin et al., "A Special-Purpose Content Addressable Memory Chip for Real-Time Image Processing", IEEE Journal of Solid-State Circuits, vol. 27, No. 5, May 1992, pp. 737-744.

Pankaj Gupta et al., "Routing Lookups in Hardware at memory Access Speeds", Proc. Infocom, Apr. 1998, 8 pgs.

Masayoshi Kobayashi et al., "A 50Mpps Longest Prefix Match Search Engine LSI for Multi-gigabit IP Forwarding", Technical Report of IEICE IN08-119, Nov. 1998, pp. 7-12.

Takeshi Ogura et al., "A 4kbit Associative Memory LSI", IEEE Journal of Solid State circuit, vol. SC-20, No. 6, Dec. 1985, pp. 1277-1284.

Simon R. Jones et al., "A 9-kbit Associative Memory for High Speed Parallel Processing Applications", IEEE Journal of Solid-State Circuits, vol. 23, No. 2, Apr. 1988 pp. 543-548.

Masayoshi Kobayashi et al. "A 50 Mpps Longest Prefix Match Search Engine IC for Multi-gigabit IP Forwarding", The Institiute of Electronics Information and Communication, 15 pages, 1998.

"SRAM-Based Counters", IBM Technical Disclosures Bulletin, vol. 34, No. 12, May 1992, p. 269-275.

V. Srinivasan et al., "Fast and Scalable Layer Four Switching" ACM Applications, Technologies, Architectures, and Protocols for Computer Communication, pp. 191-202, 1998.

Yehuda Afek et al. "Routing With a Clue", IEEE/ACM Transactions on Networking, vol. 6, pp. 693-705, 2001.

Yehuda Afek et al. "Routing with a Clue", Computer Communication Review, ACM Sigcomm '99 Conference, Sep. 30, 1999-Oct. 3, 1999, p. 203-213.

* cited by examiner

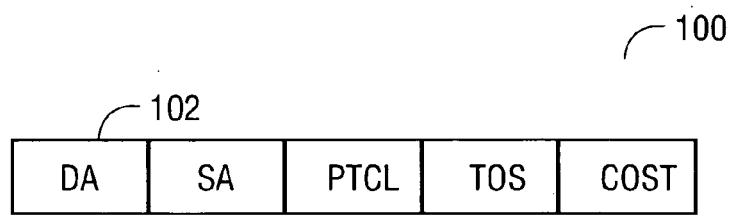
FIG. 1
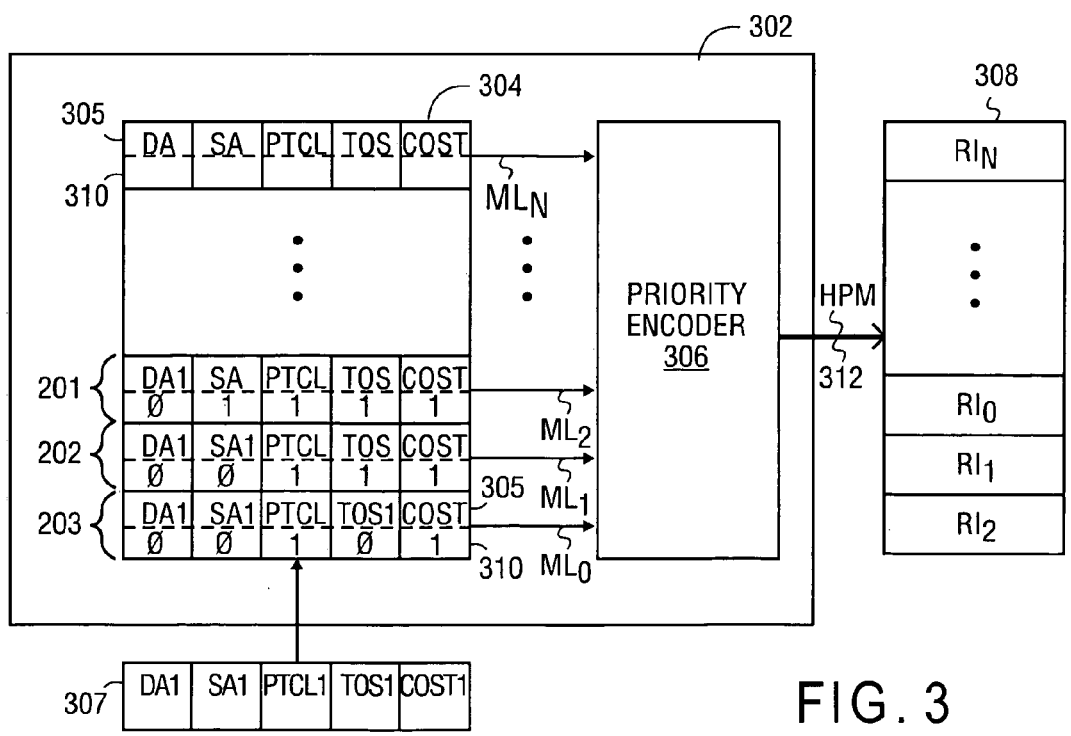
FIG. 2
FIG. 3

METHOD AND APPARATUS FOR PERFORMING PACKET CLASSIFICATION FOR POLICY-BASED PACKET ROUTING

FIELD OF THE INVENTION

The present invention relates generally to performing packet classification for policy-based packet routing.

BACKGROUND

Routers are devices that direct traffic in a network. Each router in the network has a route table that typically includes routing information to enable incoming packets to be forwarded or routed to their destination in the network. Some routers forward packets based only on the destination address indicated in the packet. Other, more complex, routers forward or route packets based on policies defined, for example, by a network administrator. The latter routing schemes are commonly referred to as policy-based routing.

Policy-based routing can enable packets to be forwarded or routed in a network based on any number of criteria, including the source of the packet, the destination of the packet, the cost of forwarding the packet through different routes or paths in the network, or the bandwidth available on different routes in the network. Policy-based routing can also be used to provide a certain Quality of Service (QOS) or Type of Service (TOS) to differentiated traffic in the network. For example, one or more of the various fields (e.g., the TOS bits) in the header of an Internet Protocol (IP) packet can be used by policy-based routers to forward IP packets in a network.

Each policy-based router implements a policy through the use of route maps that define how to forward the packet in the network. Each route map statement or policy statement contains one or more match clauses and a set clause. The match clauses are a series of conditions that are used to determine if an incoming packet satisfies a particular policy. If all of the match clauses of a policy statement are satisfied, the set clause specifies how the router should forward the packet in the network. If one of the match clauses of a particular policy statement is not satisfied, then the policy-based router investigates subsequent policy statements.

FIG. 1 shows exemplary processed policy information 100 of an incoming packet to a policy-based router. Policy information 100 includes several policy fields 102 including a destination address (DA) for the packet, a source address (SA) of the packet, protocol type (PTCL) such as those defined by for an IP packet header, TOS, and COST. Policy information 100 may be received by a policy-based router that implements a policy such as policy 200 shown in FIG. 2. Policy 200 includes three separate policy statements 201 through 203. If policy information 100 satisfies the match clause (i.e., the "if" clause) of one of the policy statements, the set clause (i.e., the "then" clause) of that policy statement determines routing information for the packet in the network. For example, if the destination address of the incoming packet is DA1, the source address is SA1, and the TOS field of the packet is TOS1, then routing information $RI_2$ should be selected.

A policy-based router can use a content addressable memory (CAM)-based system to implement a filtering or classification function to determine whether an incoming packet matches a policy statement. FIG. 3 shows one example of a system 300 that implements policy-based routing using a ternary CAM 302. The policy statements or policy words 201–203 are stored in separate rows in ternary CAM array 304. A ternary CAM array is one that is able to mask entries in a CAM array on a bit-by-bit basis. Ternary CAM array 304 has rows of CAM cells 305 for storing policy field information, and corresponding rows of mask cells 310 for storing mask data. Routing information $RI_0$–$RI_2$ is typically stored in an external memory 308 at addresses corresponding to those at which the respective policy words 201–203 are stored in ternary CAM array 304. Each policy field that corresponds to a match clause for a given policy statement is unmasked by having its corresponding mask bits set, for example, to a logic zero. Conversely, each policy field that does not have a match clause for a given policy statement is masked by having its corresponding mask bits set, for example, to a logic one.

When an incoming packet is received by a policy-based router, it is processed to determine the policy field information. The processed policy field information is provided to system 300 as policy search key 307. For each policy statement in CAM array 304 that matches the policy search key, the corresponding match line $ML_0$–$ML_N$ will be asserted and provided to priority encoder 306. In response to the match lines, priority encoder 306 outputs the address of the highest priority matching entry in CAM array 304 to HPM bus 312. If there is more than one matching policy statement in CAM array 304, priority encoder 306 determines that the highest priority matching policy statement is the one stored at the lowest logical address of CAM array 304. For example, as shown in FIG. 3, if CAM array 304 is loaded with policy statement 203 at address zero (i.e., the lowest logical address), statement 202 at address one, and statement 201 at address 2, and a policy search key of DA1, SA1, PTCL1, TOS1, COST1 is provided to CAM array 304, then each of policy statements 201–203 is identified as a match on match lines $ML_0$–$ML_2$, respectively. Priority encoder 306 outputs address zero on the HPM bus to select route information R12 from address zero in memory 308.

Because priority encoder 306 determines the highest priority matching location based on predetermined logical address assignments, policy statements 201–203 are preordered or prioritized such that higher priority policy statements are stored in lower logical addresses of CAM array 304 than lower priority policy statements. A policy statement has a higher priority than another policy statement when the route information for the first policy statement is to be selected over the second policy statement even though both policy statements may match the policy search key (e.g., with masking). The prioritizing of the policy statements is typically performed by table management hardware and/or software, which adds overhead to the router.

If the table is not prioritized correctly, then an incorrect route may be selected for the incoming packet. FIG. 4 shows an example in which policy statement 201 is incorrectly prioritized such that it, rather than policy statement 203, is loaded into the lowest logical address. In this example, when policy search key 307 is provided to CAM array 304, priority encoder 306 still provides address zero on HPM bus 312. This causes, however, route information $RI_0$ to be selected in memory 308 rather than the desired route information $RI_2$ associated with higher priority policy statement 201. It would be desirable to load policy statements into a CAM array without having to preorder the statements according to their respective priorities.

When a policy is changed by adding a new policy statement that has a higher (or equal) priority than at least one of the policy statements already stored in CAM array 304, the table management hardware and software needs to reprioritize or reorder all or part of CAM array 304. This is typically accomplished by reloading the CAM array with a new prioritized group of policy statements. This can add significant overhead to the router (e.g., delay and additional hardware and software) to change even just one policy statement in a given policy. If the table is not reloaded, CAM 302 may cause an incorrect route to be selected from memory 308. For example, FIG. 5 shows that a new policy statement 204 is loaded into the next free address (i.e., address three) of CAM array 304 without reprioritizing and reloading CAM array 304. Route information $RI_3$, corresponding to policy statement 204, is loaded into a corresponding address in memory 308. If policy statement 204 has a priority greater than that of 201, 202, or 203, then a search with policy search key 307 will not correctly identify policy statement 204 during a compare operation on CAM array 304. Policy statement 203, rather, will be identified as the higher priority statement, and route information $RI_2$ will be selected. It would be desirable to be able to add a new policy statement to a policy without reloading the CAM array storing the policy statements.

SUMMARY OF THE INVENTION

A method and apparatus for performing a classification or filtering function for policy-based packet routing in a digital signal processor (DSP) is disclosed. For one embodiment, the digital signal processor includes a policy statement table for storing policy statements. The policy statement table may be stored in a ternary CAM array that stores the policy statements and associated mask data. Each policy statement has associated with it a priority number that indicates the priority of the policy statement relative to other policy statements. The priority numbers are separately stored in a priority index table. The priority index table includes priority logic that determines the most significant priority number from among the policy statements that match an incoming packet during a classification or filter operation. The priority logic also identifies the location in the priority index table of the most significant priority number. The most significant priority number may be the priority number with the lowest or highest numerical value. The identified location in the priority index table can be used to access associated route information or other information stored in a route memory array located external to, or on the DSP. When the route memory array is external to the DSP, the DSP may include an encoder to encode the identified location in the priority index table into an address for the route memory.

The DSP configuration obviates preloading the policy statements in the policy statement table in a predetermined order. Instead, the priority logic determines the most significant priority number from among matching policy statements regardless of the order in which the policy statements are stored in the table. This can reduce the hardware and/or software needed for table management of the table, and can increase the performance of a router incorporating the DSP.

In addition, new policy statements can be added at any location in the policy statement table, and associated priority numbers loaded into corresponding locations in the priority index table. If a new policy statement has a priority that is greater than or equal to a priority of a policy statement already stored in the policy statement table, the priority number of the previously stored policy statement may be updated to accommodate the new policy statement. Similarly, when a policy statement is removed (i.e., invalidated or overwritten) from the policy statement table, the priority numbers of the previously stored lower priority policy statements may be updated. The updating functions can be performed by the priority logic in the priority index table, or by inequality circuits in the priority index table. The updating functions can be performed without the need to physically reorder the policy statements in the policy statement table, or to physically reorder the priority numbers in the priority index table. This also can reduce the hardware and/or software needed for table management of the policy statement table, and can increase the performance of a router incorporating the DSP.

The DSP can also be used in other non-networking applications. For example, the DSP can be used to process if-then-else functions in other applications.

Other objects, features, and advantages of the present invention will be apparent from the accompanying drawings and from the detailed description that follows below.

BRIEF DESCRIPTION OF THE DRAWINGS

The features and advantages of the present invention are illustrated by way of example and are by no means intended to limit the scope of the present invention to the particular embodiments shown, and in which:

FIG. 1 is an example of policy information;

FIG. 2 is an example of a policy having policy statements;

FIG. 3 is an example of storing a policy in a conventional ternary CAM;

DETAILED DESCRIPTION

Figure 4:
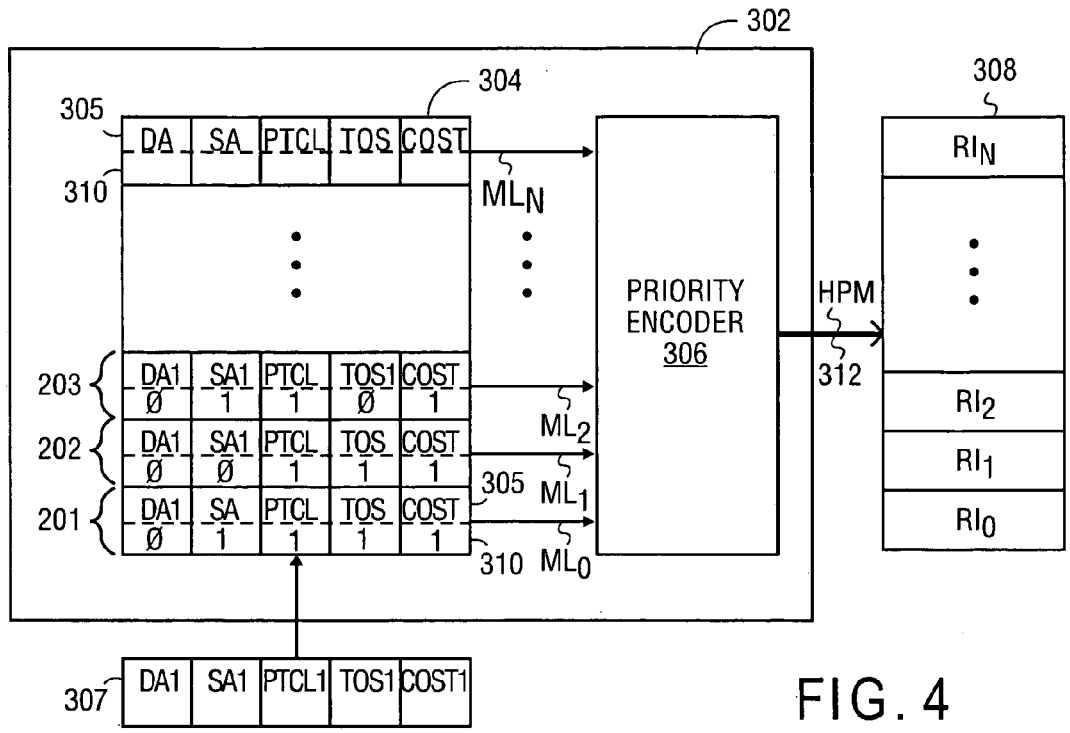
FIG. 4 is an example of storing a particular policy in a conventional ternary CAM and comparing a search key with the policy.
Figure 5:
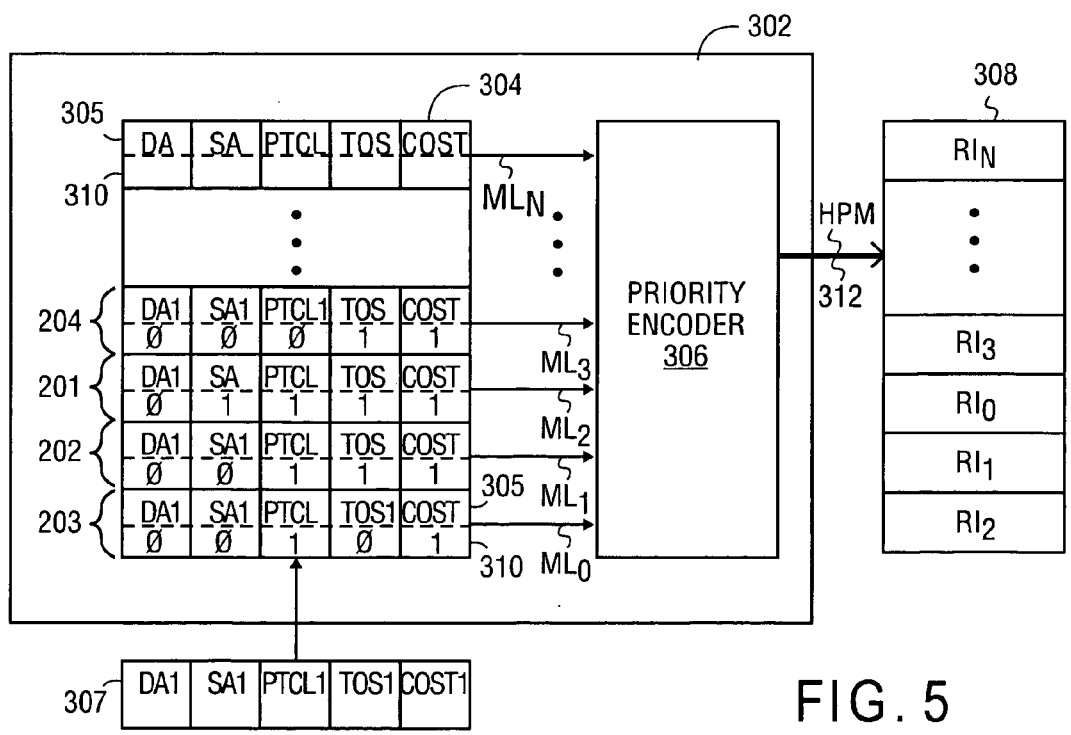
FIG. 5 is another example of storing a particular policy in a conventional ternary CAM and comparing a search key with the policy.

In the following description, for purposes of explanation, specific nomenclature is set forth to provide a thorough understanding of the present invention. However, it will be apparent to one skilled in the art that these specific details may not be required to practice the present invention. In other instances, well known circuits and devices are shown in block diagram form to avoid obscuring the present invention unnecessarily. Additionally, the interconnection between circuit elements or blocks may be shown as buses or as single signal lines. Each of the buses may alternatively be single signal lines, and each of the single signal lines may alternatively be buses. Additionally, the prefix symbol "/" or the suffix "B" attached to signal names indicates that the signal is an active low signal. Each of the active low signals may be changed to active high signals as generally known in the art.

A method and apparatus for performing a classification or filtering function for policy-based packet routing in a digital signal processor (DSP) is disclosed. For one embodiment, the digital signal processor includes a policy statement table for storing policy statements. The policy statement table may be stored in a ternary CAM array that stores the policy statements and associated mask data. Each policy statement has associated with it a priority number that indicates the priority of the policy statement relative to other policy statements. The priority numbers are separately stored in a priority index table. The priority index table includes priority logic that determines the most significant priority number from among the policy statements that match an incoming packet during a classification or filter operation. The priority logic also identifies the location in the priority index table of the most significant priority number. The most significant priority number may be the priority number with the lowest or highest numerical value. The identified location in the priority index table can be used to access associated route information or other information stored in a route memory array located external to, or on the DSP. When the route memory array is external to the DSP, the DSP may include an encoder to encode the identified location in the priority index table into an address for the route memory.

The DSP configuration obviates preloading the policy statements in the policy statement table in a predetermined order. Instead, the priority logic determines the most significant priority number from among matching policy statements regardless of the order in which the policy statements are stored in the table. This can reduce the hardware and/or software needed for table management of the table, and can increase the performance of a router incorporating the DSP.

In addition, new policy statements can be added at any location in the policy statement table, and associated priority numbers loaded into corresponding locations in the priority index table. If a new policy statement has a priority that is greater than or equal to a priority of a policy statement already stored in the policy statement table, the priority number of the previously stored policy statement may be updated to accommodate the new policy statement. Similarly, when a policy statement is removed (i.e., invalidated or overwritten) from the policy statement table, the priority numbers of the previously stored lower priority policy statements may be updated. The updating functions can be performed by the priority logic in the priority index table, or by inequality circuits in the priority index table. The updating functions can be performed without the need to physically reorder the policy statements in the policy statement table, or to physically reorder the priority numbers in the priority index table. This also can reduce the hardware and/or software needed for table management of the policy statement table, and can increase the performance of a router incorporating the DSP.

The DSP can also be used in other non-networking applications. For example, the DSP can be used to process if-then-else functions in other applications.

Classifying or Filtering Policy Statements

Figure 6:
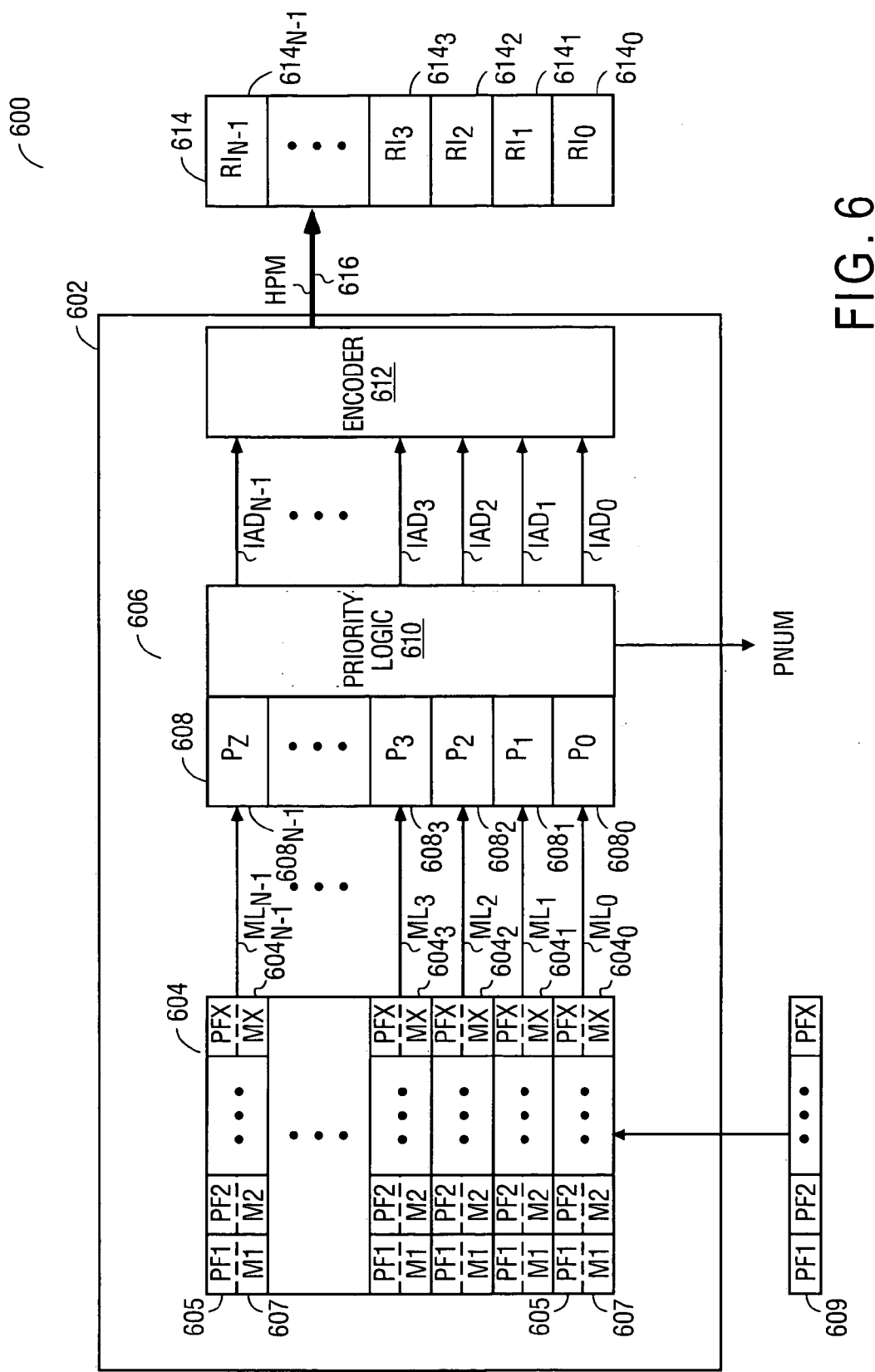
FIG. 6 is one embodiment of a classification system for a policy-based router.

FIG. 6 shows one embodiment of a classification or filtering system 600 for a policy-based router. System 600 includes DSP 602 and route memory 614. DSP 602 includes policy statement table 604, priority index table 606 and encoder 612, and may be an integrated circuit component formed on a single semiconductor substrate.

For this embodiment, policy statement table 604 is stored in a ternary CAM array that stores policy statements or policy words. Ternary CAM array 604 has rows of CAM cells 605 for storing policy field information PF1–PFX, where X is any number. Each policy field PF1–PFX can include any policy information including DA, SA, PTCL, TOS, and COST, or any other type of policy field to assist in the classification or filtering of the policy statement to provide a certain Quality of Service (QoS), Class of Service (CoS), and the like. Each policy field may include any number of bits. Additional information associated with each policy field may be stored in one or more additional binary or ternary CAM cells or other types of memory cells disposed in each row of CAM 604. Ternary CAM 604 also has rows of mask cells 607 for storing mask data M1–MX corresponding to each row of policy fields 605. Global masks (not shown) may be used to mask entire columns in CAM array 604 as generally known in the art. For alternative embodiments, CAM array 604 may be any other type of CAM including a binary CAM, or any other type of memory to store policy statements to be compared with processed policy information of an incoming packet.

Ternary CAM array 604 can be any ternary CAM array that is capable of locally masking each entry on a bit-by-bit basis. Each policy field that corresponds to a match clause for a given policy statement will be unmasked by having its corresponding mask bits set, for example, to a logic zero (or, alternatively, a logic one). Conversely, each policy field that does not have a match clause for a given policy statement will be masked by having its corresponding mask bits set, for example, to a logic one (or, alternatively, a logic zero). As each policy field, and/or individual bits within a policy field, can be masked, DSP 602 also supports rule and route aggregation. That is, DSP 602 supports ranges of addresses or policy field information.

Each policy statement loaded into ternary CAM array 604 has associated with it a priority number $P_0$–$P_z$ and route information $RI_0$–$RI_{N-1}$. The priority number indicates the priority of the policy statement relative to other policy statements in a given policy. The policy numbers may be assigned by a user of DSP 602 including, for example, a network administrator or the router itself. The priority numbers $P_0$–$P_z$ are separately stored at locations $608_0$–$608_{N-1}$, respectively, of priority memory 608 of priority index table 606. Route information $RI_0$–$RI_{N-1}$ for the particular policy statements are stored at locations $614_0$–$614_{N-1}$, respectively, in route memory 614. The route information may include, for example, forwarding or next hop information, authentication information, QOS, TOS, time to live information or other packet filtering and classification information for an incoming packet to the router incorporating system 600. A policy statement, its priority number, and its route information are each stored at the corresponding addresses in each of their respective memory arrays.

Priority memory 608 and route memory 614 may each be any type of memory array including volatile, non-volatile, random access memory (RAM), and/or read only access memory (ROM). For one embodiment, priority memory 608 comprises a CAM array.

Priority memory 608 may be n bits wide to accommodate $Z=2^n$ priority numbers, where n is any number. The number of addressable locations N in priority memory 608 may be greater than, less than, or equal to Z. For one example, priority memory 608 may be 20 bits wide to accommodate up to $2^{20}$ or 1 Meg (i.e., 1,048,576) priority numbers.

The priority numbers may be assigned in ascending priority order such that zero is the highest priority number and $2^n-1$ is the lowest priority number. Alternatively, the priority numbers may be assigned in descending priority order such that $2^n-1$ is the highest priority number and zero is the lowest priority number. Each priority number may be assigned so as to identify the priority of each policy statement relative to other policy statements. For one embodiment, the priority numbers may be assigned consecutively. For example, the highest priority policy statement can be assigned the highest priority number (e.g., zero or $2^n-1$), the next lower priority policy statement can be assigned the next lower priority number (e.g., one or $2^n-2$), and so forth. For another embodiment, gaps may be left in the priority number assignments to allow for the addition of future priority numbers associated with new policy statements.

Priority index table 606 also includes priority logic 610 that compares the priority numbers with each other for all corresponding policy statements that match an incoming packet. Priority logic 610 identifies the most significant priority number PNUM in memory 608 from among the compared priority numbers, and further identifies the location of PNUM in priority memory 608. PNUM has the lowest numerical value when the priority numbers are assigned is ascending priority order, and PNUM has the highest numerical value when the priority numbers are assigned in descending priority order. Priority logic 610 may also output PNUM from DSP 602. The identified location of PNUM in the priority memory is provided on internal address lines $IAD_0$–$IAD_{N-1}$ to encoder 612. For one example, one of $IAD_0$–$IAD_{N-1}$ is asserted to indicate the location in priority memory 608 of PNUM from among the compared priority numbers. This location also corresponds to the location of the highest priority matching policy statement in ternary CAM array 604.

The address of the identified location of the highest priority matching policy statement in ternary CAM array 604 is determined by encoder 612 and output to HPM bus 616. The encoded address can then be used to access the corresponding route information from memory 614. Encoder 612 may be any encoding logic that takes the information on address lines $IAD_0$–$IAD_{N-1}$ and generates an encoded address. For one embodiment, encoder 612 is a ROM.

For another embodiment, route memory 614 may also be included within DSP 602. For this embodiment, encoder 612 may be omitted and route memory 614 may be accessed directly by internal address lines $IAD_0$–$IAD_{N-1}$.

Figure 7:
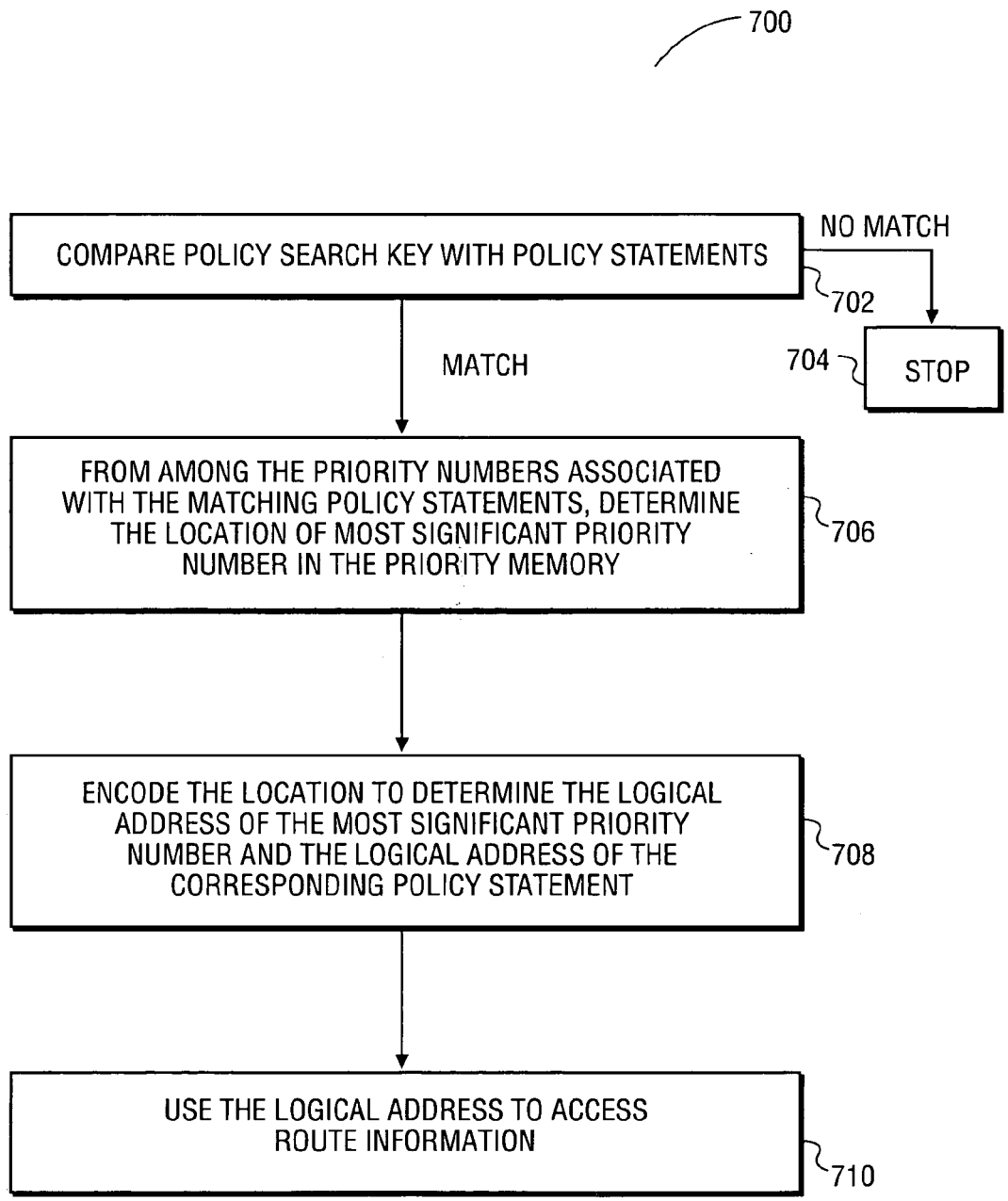
FIG. 7 is one embodiment of performing the classification operation for the system of FIG. 6.

FIG. 7 summarizes the classification or filtering function 700 (i.e., search or compare operation) performed by DSP 602 for an incoming packet according to a policy stored in ternary CAM 604. An incoming packet received by a policy-based router incorporating system 600 is initially processed to determine the policy field information. The policy field information is provided to system 600 as policy search key 609. At step 702, the policy fields of policy search key 609 are compared with the policy statements stored in ternary CAM array 604. For each policy statement that matches the policy search key, the corresponding match line $ML_0$–$ML_{N-1}$ is asserted. If no match is found, then the process stops at step 704.

At step 706, priority logic 610 determines PNUM and identifies its location in priority memory 608. The identified location is provided on internal address lines $IAD_0$–$IAD_{N-1}$ to encoder 612. At step 708, encoder 612 determines the address of the identified location in priority index table 606. This encoded address is also the logical address of the highest priority matching policy statement in ternary CAM array 604. Encoder 612 outputs the encoded address to HPM bus 616. The encoded address can then be used at step 710 to access the corresponding route information in memory 614. Steps 708 and/or 710 may be omitted when encoder 612 is removed from DSP 602, and priority logic 610 may directly access the route information in memory 614.

For another embodiment, $IAD_0$–$IAD_{N-1}$ are provided to CAM array 604 to access the highest priority matching policy statement, which may then be read from DSP 602. Alternatively, HPM bus 616 may be provided to CAM array 604 (e.g., through a decoder) to access the highest priority matching policy statement.

Figure 8:
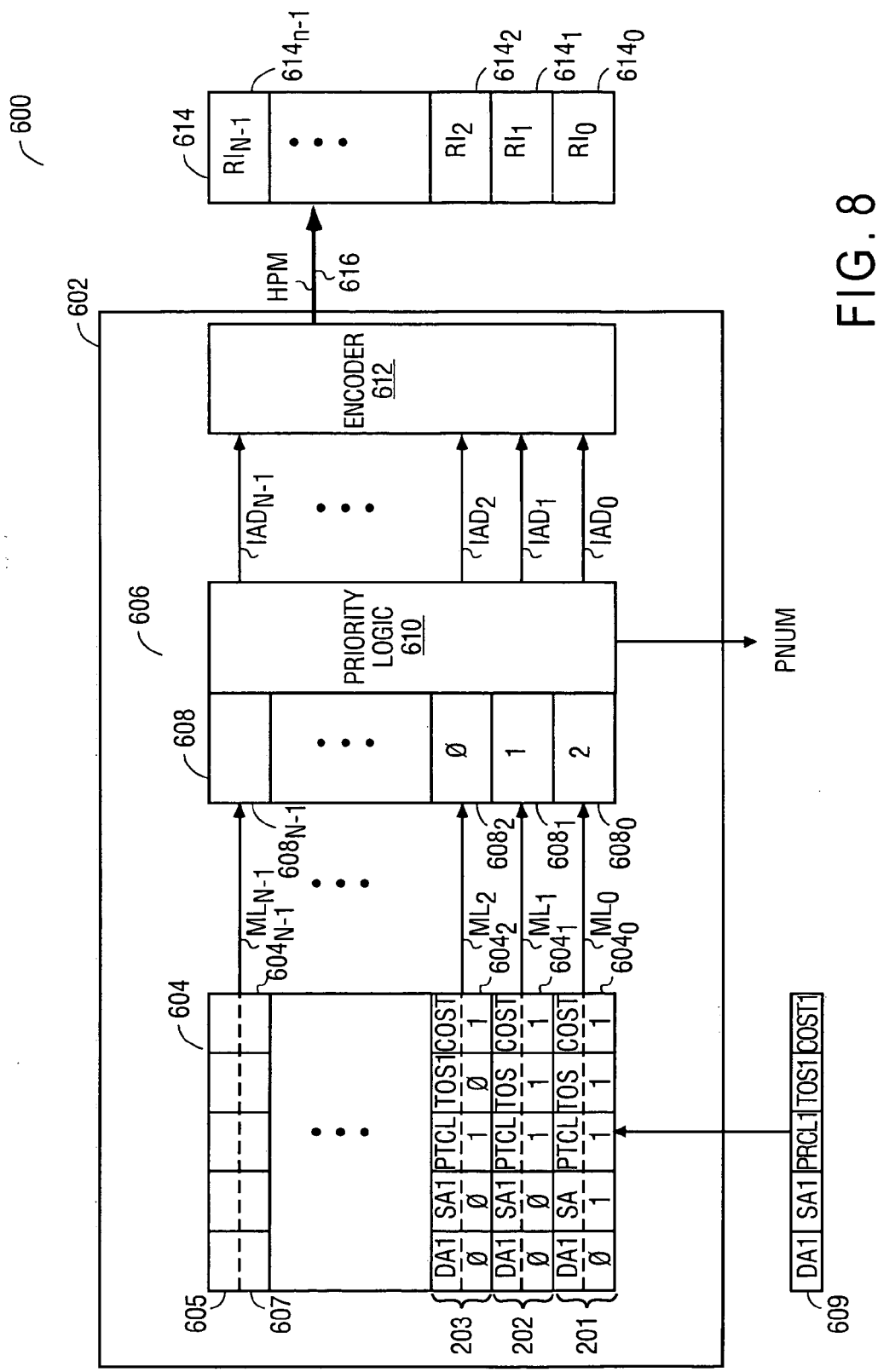
FIG. 8 is one example of performing the classification operation on a particular policy stored in the CAM array of FIG. 6.

FIG. 8 shows one example in which policy statements 201, 202, and 203 from FIG. 2 are stored at locations $604_0$, $604_1$, and $604_2$ (i.e., addresses 0, 1, and 2), respectively, of ternary CAM array 604. The corresponding priority numbers 2, 1, and 0 are stored at locations $608_0$, $608_1$, and $608_2$, respectively, in memory 608. Additionally, the corresponding route information $RI_0$, $RI_1$, and $RI_2$, are stored at locations $614_0$, $614_1$, and $614_2$, respectively of route memory 614. The policy statements and priority numbers are written into their respective memories using conventional write circuits, counters, and/or address decoders, etc. (not shown).

For this embodiment, the priority numbers have been assigned in ascending priority order such that policy statement 203 is identified as the highest priority policy statement by being assigned priority number 0, the lowest numerical value; policy statement 201 is identified as the having the lowest priority policy statement by being assigned priority number 2, the highest numerical value; and, policy statement 202 is identified as having a priority greater than that of policy statement 201, but less than that of policy statement 203, by being assigned priority number 1.

For an alternative embodiment, the priority numbers may be assigned in descending priority order such that policy statement 201 is identified as the highest priority policy statement by being assigned priority number 2, the highest numerical value; policy statement 203 is identified as having the lowest priority policy statement by being assigned priority number 0, the lowest numerical value; and, policy statement 202 is identified as having a priority greater than that of policy statement 201, but less than that of policy statement 203, by being assigned priority number 1.

The process of determining the route information for policy search key 609 is illustrated with the aid of FIG. 7. At step 702, the policy fields of policy search key 609 are compared with the policy statements stored in ternary CAM array 604. In this example, the policy search key has policy fields of DA=DA1, SA=SA1, PTCL=PTCL1, TOS=TOS1, and COST=COST1. CAM array 604 determines that each of the policy statements 201–203, as masked by their respective mask data, matches policy search key 609. In response, each of match lines $ML_0$–$ML_2$ is asserted.

At step 706, priority logic 610 compares, with each other, priority numbers 0, 1, and 2 associated with matching policy statements 203, 202, and 201 respectively. Priority logic 610 determines that priority number 0 is the most significant priority number, asserts $IAD_2$, and de-asserts the other internal address lines. Encoder 612 encodes the internal address information, at step 708, and generates an external address of 2 on HPM bus 616. The external address can be used to access route information $RI_2$ stored at address two in route memory 614.

In contrast to the conventional system shown in FIG. 4, DSP 602 is able to identify the highest priority matching policy statement stored in ternary CAM array 604 regardless of where the policy statements are stored in CAM array 604.

The process illustrated in FIG. 7 identifies the location in priority memory 608 of the most significant priority number from among the compared priority numbers. Once this location is identified, the priority number stored at the identified location can be read out from DSP 602 by a read circuit (not shown), or a new priority number can be written into that location by a write circuit (not shown). In the former case, the user of the DSP (e.g., a network administrator or the policy-based router itself) can determine what priorities have been assigned to policy statements already stored in CAM array 604. In the latter case, priority numbers can be updated by the user for already stored policy statements. This provides the user with flexibility in the control and management of the policy statements stored in DSP 602.

For added flexibility, the user can read a policy statement (e.g., one or more of the policy fields and/or one or more of the corresponding mask data) based on priority numbers already stored in the priority memory, or write a new policy statement for a priority number already stored in the priority memory. For these embodiments, priority memory 608 may be a CAM. For an alternative embodiment, each priority number may be separately compared by a comparison circuit with an externally applied priority number.

Figure 9:
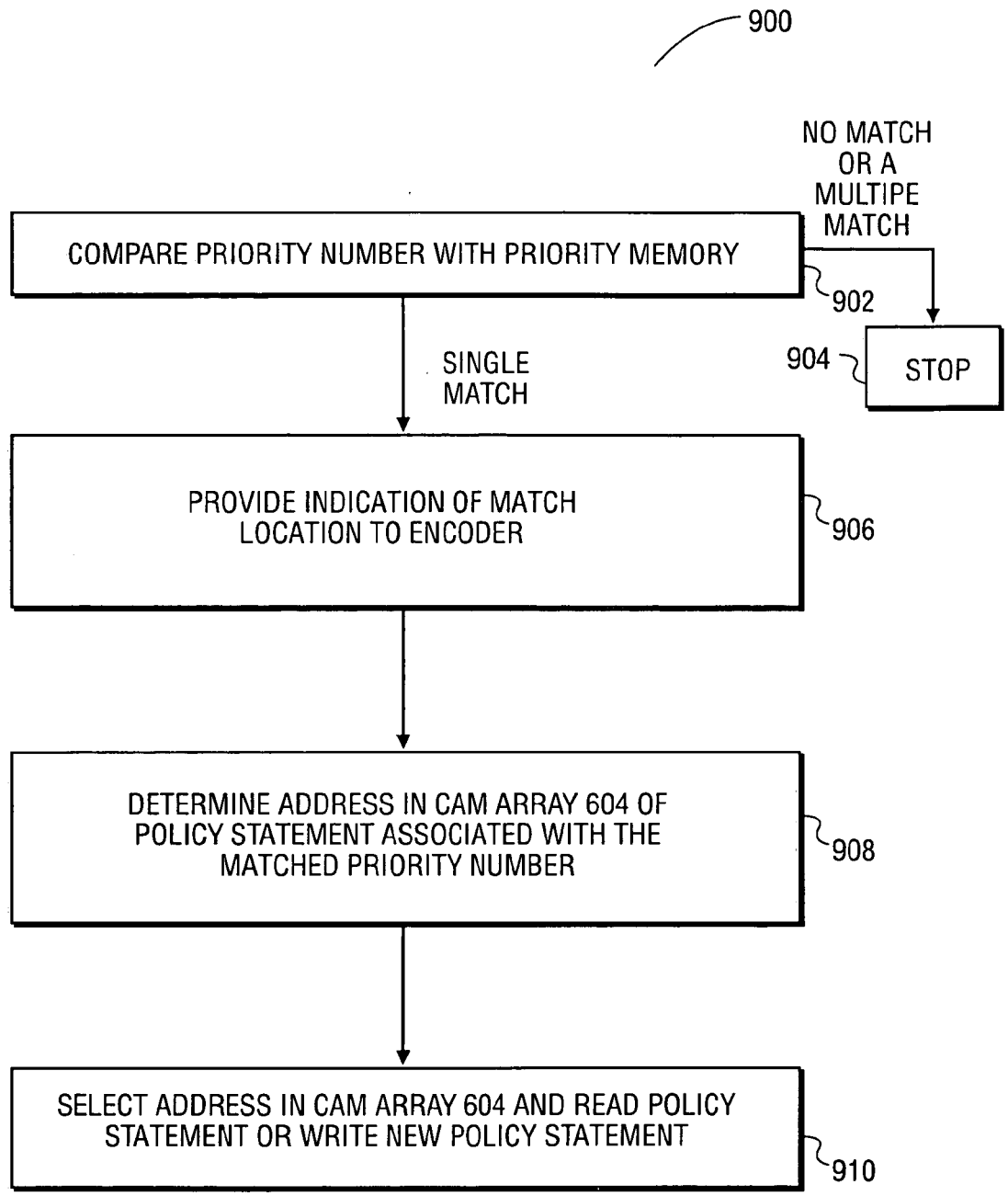
FIG. 9 is one embodiment of reading or writing a policy statement based on a priority number stored in the priority memory of FIG. 6.

FIG. 9 shows one embodiment of a process 900 for reading or writing a policy statement based on a priority number already stored in the priority memory. At step 902, an external priority number is compared with the priority numbers stored in priority memory 608. The valid priority numbers stored in memory 608 may be indicated by one or more validity bits (not shown) stored in CAM memory 604 or memory 608. If there is no match, or more than one match (i.e., a multiple match), then the process stops at step 904. Alternatively, a priority encoder circuit can be coupled to priority index table 606 to select one of the multiple matches for step 906.

If there is a single match, then an indication of the matching location is provided on lines $IAD_0$–$IAD_{N-1}$ to encoder 612 at step 906. When priority memory 608 is implemented as a CAM, $IAD_0$–$IAD_{N-1}$ may be the match lines associated with each priority number storage location. At step 908, encoder 612 determines the address of the matching location in priority memory 608 and provides this address on HFM bus 616. This address is also the address of the corresponding policy statement in CAM array 604. At step 910, the encoded address can then be provided to CAM array 604 (e.g., through a decoder), and the policy statement stored at that address either read from DSP 602, or overwritten. For an alternative embodiment, $IAD_0$–$IAD_{N-1}$ may be provided directly to CAM array 604 to access the desired policy statement and the process may omit step 908. Additionally, a new priority number can be written to priority memory 608 at the address determined in step 910.

Figure 10:
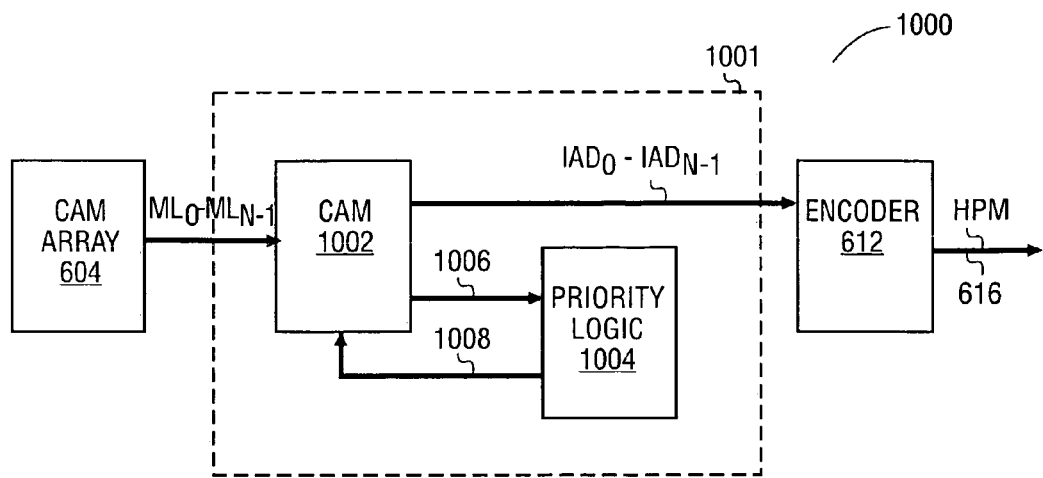
FIG. 10 is one embodiment of the priority index table of FIG. 6.

With reference again to FIGS. 6 and 7, priority index table 606 stores priority numbers in priority memory 608, and priority logic 610 determines the most significant priority number among those associated with policy statements that match policy search key 609. FIG. 10 shows DSP 1000 that includes priority index table 1001 that is one embodiment of priority index table 606. In this embodiment, CAM array 1002 is one embodiment of priority memory 608, and priority logic 1004 is one embodiment of priority logic 610.

DSP 1000 performs the filtering function of FIG. 7 as follows. At step 702, a policy search key is compared with the policy fields stored in CAM array 604 and match lines $ML_0$–$ML_{N-1}$ are asserted for the matching locations. The asserted match lines access the associated priority numbers stored in CAM array 1002. For one embodiment, $ML_0$–$ML_{N-1}$ are coupled to corresponding word lines of the rows of CAM cells in CAM array 1002. In response to the asserted match lines, CAM array 1002 provides the selected priority numbers to priority logic 1004 over bus 1006 to determine which priority number is the most significant priority number. The priority numbers may be provided one at a time over bus 1006, or in parallel.

Priority logic 1004 includes one or more compare circuits to compare the priority numbers and determine the most significant priority number. For one embodiment, priority logic 1004 includes a compare circuit and a register. The first priority number provided on bus 1006 is stored in the register and compared with the second priority number. Each subsequent priority number provided over bus 1006 is then compared and the result (either greater than or less than) is then stored in the register. This process continues until no more priority numbers are provided over bus 1006. For another embodiment, multiple compare circuits may be provided to compare multiple priority numbers at the same time to generate the most significant priority number.

Once the most significant priority number is determined, it is provided over bus 1008 to CAM 1002 and searched against the stored priority numbers to determine where it is located in CAM array 1002. The indicated location is provided on internal address lines $IAD_0$–$IAD_{N-1}$, which may correspond to the match lines of CAM array 1002. Steps 708 and 710 may then be performed as previously described above.

Figure 11:
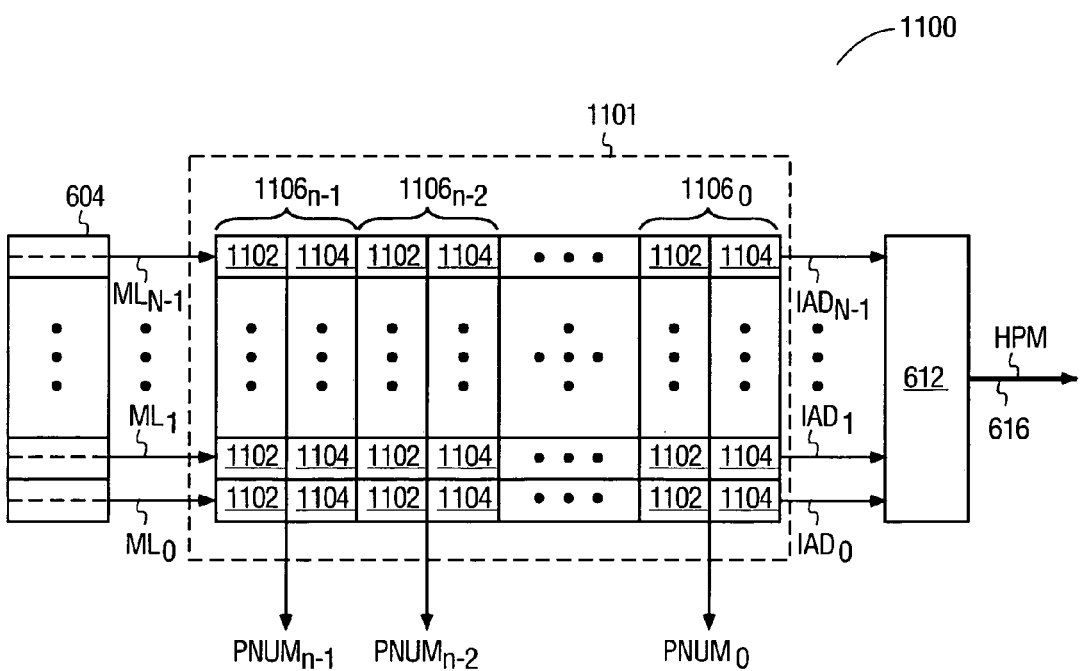
FIG. 11 is another embodiment of the priority index table of FIG. 6.

FIG. 11 shows DSP 1100 that includes priority index table 1101 that is another embodiment of priority index table 606. In this embodiment, priority memory 608 and priority logic 610 are merged together on a bit-by-bit basis to form priority index table 1101. The priority memory includes memory elements 1102 that each store one bit of a priority number for a given row. Each memory element may be any type of storage mechanism including volatile or non-volatile memory cells. The priority logic includes priority logic elements 1104. Each priority logic element 1104 is associated with, or corresponds to, one of the memory elements 1102 such that columns $1106_0$–$1106_{n-1}$ of priority index table 1101 have a memory element/priority logic element pair for each of its rows. Each priority logic element 1104 effectively compares the priority number bit stored in its associated memory element 1102 with the priority number bits stored in every other memory element of its column to determine one of bits $PNUM_0$–$PNUM_{n-1}$ for the most significant priority number. Bits $PNUM_0$–$PNUM_{n-1}$ comprise the most significant priority number from among the policy statements that match a policy search key.

Figure 12A:
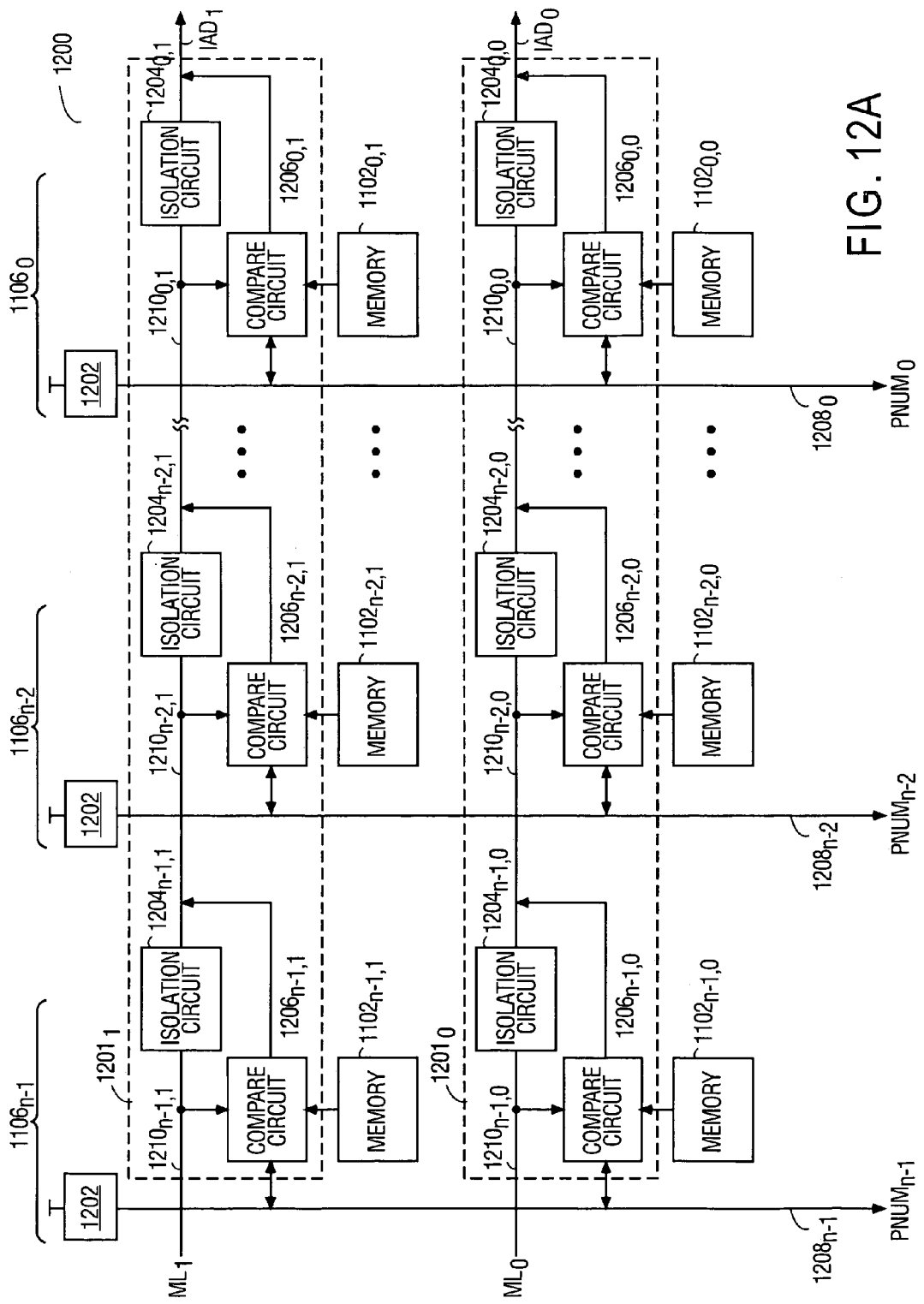
FIG. 12A is one embodiment of two rows of the priority index table of FIG. 11.

FIG. 12A shows priority index table 1200 that is one embodiment of two rows of priority index table 1101. For this embodiment, each priority logic element 1104 includes a compare circuit 1206 and an isolation circuit 1204. Each compare circuit 1206 is connected in a wired-OR configuration with the other compare circuits in its respective column by one of priority signal lines $1208_0$–$1208_{n-1}$. Each priority signal line may be pre-charged towards a power supply voltage (or any other predetermined voltage) by a pre-charge circuit 1202. Each compare circuit 1206 may be any digital or analog compare circuit that, when executing step 706 of FIG. 7, effectively compares the priority number bit stored in its respective storage element 1102 with the priority number bits stored in every other storage element 1102 of the same column. Additionally, each compare circuit monitors the comparison result of the more significant priority number bits through the logical states of match line segments 1210. Match line segments 1210 are coupled between match lines $ML_0$–$ML_{N-1}$ and internal address lines $IAD_0$–$IAD_{N-1}$ by isolation circuits 1204. The isolation circuits isolate the comparison results generated for less significant priority bit locations from affecting the comparison results generated for more significant priority bit locations. The isolation circuits may also work together with the comparison circuits to control the state of the match line segments.

Figure 13:
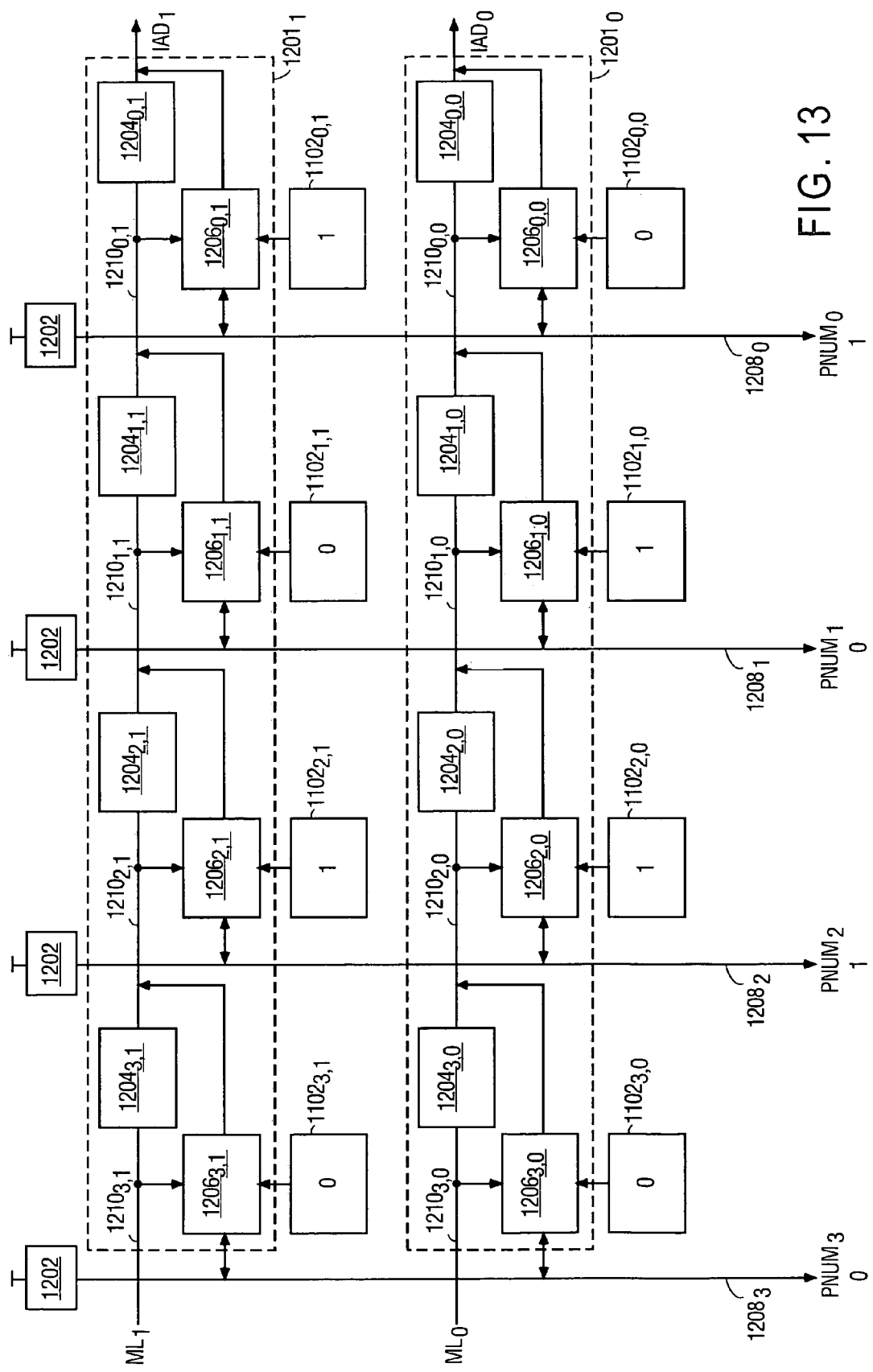
FIG. 13 is one example of determining the most significant priority number stored in the rows of the priority index table.

The operation of priority index table 1200 can be illustrated with an example shown in FIG. 13 and with the aid of FIG. 7. In this example, priority index table 1200 comprises a 2×4 matrix of rows and columns. For other embodiments, any numbers of rows and columns can be used. Row zero stores priority number 0110 having the decimal equivalent of the number 6, and row one stores priority number 0101 having the decimal equivalent of the number 5. For this example, each of row zero and row one of CAM array 604 have policy statements that match the policy search key such that match lines $ML_0$ and $ML_1$ are asserted (step 702). Also, for this example, the priority numbers are stored in ascending priority order such that 0101 is the more significant priority number between 0101 and 0110.

At step 706, compare circuits $1206_{0,0}$–$1206_{3,1}$ determine that 0101 is the more significant priority number PNUM, and cause $IAD_1$ to be asserted to indicate that 0101 is stored in row one of the priority index table. Compare circuits $1206_{0,0}$–$1206_{3,1}$ determine that PNUM is 0101 as follows. The most significant bit $PNUM_3$ is resolved first. When any memory element 1102 stores a logic zero and the corresponding match line segment 1210 is asserted, the corresponding priority signal line 1208 is discharged. Thus, each of compare circuits $1206_{3,1}$ and $1206_{3,0}$ discharge signal line $1208_3$ such that $PNUM_3$ is a logic zero. Additionally, compare circuit $1206_{3,1}$ compares the state of priority signal line $1208_3$ with the priority number bit stored in $1102_{3,1}$, and determines that both have the same logic state. This causes compare circuit $1206_{3,1}$ not to affect the logical state of match line segment $1210_{2,1}$ such that match line segment $1210_{2,1}$ has the same logic state as match line segment $1210_{3,1}$ ($ML_1$). Similarly, compare circuit $1206_{3,0}$ compares the state of priority signal line $1208_3$ with the priority number bit stored in $1102_{3,0}$ and determines that both have the same state. This causes compare circuit $1206_{3,0}$ not to affect the logical state of match line segment $12102_{2,0}$ such that match line segment $1210_{2,0}$ has the same logic state as match line segment $1210_{3,0}$ ($ML_0$).

The next most significant bit $PNUM_2$ is then resolved. Memory elements 1102 that store a logic one do not discharge their corresponding priority signal lines 1208. Since memory elements $1102_{2,1}$ and $1102_{2,0}$ both store logic one states, signal line $1208_2$ remains pre-charged such that $PNUM_2$ is a logic one. Additionally, compare circuit $1206_{2,1}$ compares the state of priority signal line $1208_2$ with the priority number bit stored in $1102_{2,1}$, and determines that both have the same logic state. This causes compare circuit $1206_{2,1}$ not to affect the logical state of match line segment $1210_{1,1}$ such that match line segment $1210_{1,1}$ has the same logic state as match line segment $1210_{2,1}$. Similarly, compare circuit $1206_{2,0}$ compares the state of priority signal line $1208_2$ with the priority number bit stored in $1102_{2,0}$ and determines that both have the same logic state. This causes compare circuit $1206_{2,0}$ to not affect the logical state of match line segment $1210_{1,0}$ such that match line segment $1210_{1,0}$ has the same logic state as match line segment $1210_{2,0}$.

$PNUM_1$ is resolved next. Since memory element $1102_{1,1}$ stores a logic zero and match line segment $1210_{1,1}$ is asserted, compare circuit $1206_{1,1}$ discharges priority signal line $1208_1$. This causes $PNUM_1$ to be a logic zero. Additionally, compare circuit $1206_{1,1}$ compares the logic zero state of priority signal line $1208_1$ with the logic zero stored in $1102_{1,1}$ and allows match line segment $1210_{1,1}$ to have the same state as match line segment $1210_{1,1}$. Compare circuit $1206_{1,0}$, however, compares the logic zero on priority signal line $1208_1$ with the logic one stored in memory element $1102_{1,0}$, and de-asserts match line segment $1210_{0,0}$. When a match line segment is de-asserted, all subsequent compare circuits for that row will de-assert the remaining match line segments of the row such that the corresponding internal address line IAD will be de-asserted. When IAD is de-asserted for a particular row, this indicates that the most significant priority number is not stored in that row. Additionally, when the remaining match line segments are de-asserted for a row, the compare circuits for that row do not discharge the remaining priority signal lines regardless of the logic states stored in the corresponding memory elements of that row. For example, compare circuit $1206_{0,0}$ does not discharge priority signal line $1208_0$ even though memory element $1102_{0,0}$ stores a logic zero. Additionally, isolation circuits $1204_{3,0}$, $1204_{2,0}$, and $1204_{1,0}$ isolate the de-asserted match line segment $1210_{0,0}$ from match line segment $1210_{3,0}$, $1210_{2,0}$, and $1210_{1,0}$ such that $PNUM_3$, $PNUM_2$, and $PNUM_1$ are not affected by the de-assertion of match line segment $1210_{0,0}$.

Lastly, the least significant bit $PNUM_0$ is resolved. Compare circuit $1206_{0,1}$ alone determines $PNUM_0$ since compare circuit $1206_{0,0}$ can not discharge priority signal line $1208_0$. Since memory element $1102_{0,1}$ stores a logic one and match line segment $1210_{0,1}$ is asserted, compare circuit $1206_{0,1}$ leaves priority signal line $1208_0$ pre-charged, and $PNUM_0$ is a logic one. Additionally, compare circuit $1206_{0,1}$ allows $IAD_1$ to have the same state as match line segment $1210_{0,1}$. Since match line segment $1210_{0,1}$ is asserted, $IAD_1$ will be asserted indicating that the most significant priority number is stored in that row.

Thus, when the processing of step 706 is completed, bits $PNUM_3$–$PNUM_0$ indicate that the most significant priority number stored in the priority index table is 0101, and $IAD_1$ is asserted identifying that 0101 is stored in row one.

Any circuits may be used for compare circuits 1206 and/or isolation circuits 1204 to implement the process illustrated above. Table 1 shows one example of a truth table for implementing each compare circuit 1206, where X (column) and Y (row) are any integers. Other truth tables may be used (and corresponding logic generated accordingly) including those that logically complement one of more or the signals indicated in Table 1.

TABLE 1

| STATE | 1208 | 1102 | $1210_{X,Y}$ | $1210_{X-1,Y}$ |
|---|---|---|---|---|
| 0 | 0 | 0 | 0 | 0 |
| 1 | 0 | 0 | 1 | 1 |
| 2 | 0 | 1 | 0 | 0 |

TABLE 1-continued

| STATE | 1208 | 1102 | $1210_{X,Y}$ | $1210_{X-1,Y}$ |
|---|---|---|---|---|
| 3 | 0 | 1 | 1 | 0 |
| 4 | 1 | 0 | 0 | 0 |
| 5 | 1 | 0 | 1 | 1 |
| 6 | 1 | 1 | 0 | 0 |
| 7 | 1 | 1 | 1 | 1 |

Note that state 5 may not occur since priority signal line 1208 will not be a logic one when a memory element 1102 stores a logic zero and the corresponding match line segment 1210 is asserted to a logic one state. For other truth tables, state 5 may occur.

Figure 14:
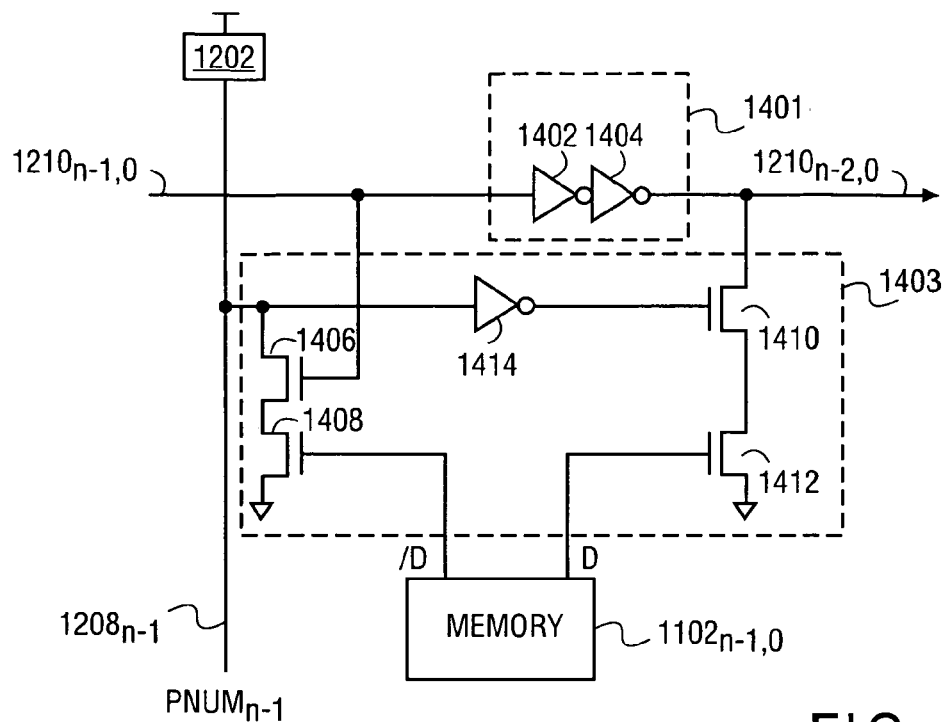
FIG. 14 is one embodiment of a compare circuit and an isolation circuit for the priority logic element of FIG. 11.

Any logic or circuitry may be used to implement the truth table of Table 1. FIG. 14 shows one embodiment of compare circuit $1206_{n-1,0}$ and isolation circuit $1204_{n-1,0}$ for implementing the truth table of Table 1. Compare circuit 1403 is one embodiment of compare circuit $1206_{n-1,0}$ and isolation circuit 1401 is one embodiment of isolation circuit $1204_{n-1,0}$. The embodiment of FIG. 14 may be used to implement all of the priority logic elements 1104 in the priority index table.

Compare circuit 1403 includes inverter 1414, transistors 1406 and 1408 connected in series between priority signal line $1208_{n-1}$ and ground, and transistors 1410 and 1412 connected in series between match line segment $1210_{n-2,0}$ and ground. N-channel transistor 1406 has its drain coupled to signal line $1208_{n-1}$, it gate coupled to match line segment $1210_{n-1,0}$, and its source coupled to the drain of n-channel transistor 1408. Transistor 1408 has its gate coupled to receive the logical complement of the priority number bit (/D) stored in memory element $1102_{n-1,0}$, and its source coupled to ground. N-channel transistor 1410 has its drain coupled to match line segment $1210_{n-2,0}$, its gate coupled to signal line $1208_{n-1}$ via inverter 1414, and its source coupled to the drain of n-channel transistor 1412. Transistor 1412 has its gate coupled to receive the priority number bit (D) stored in memory element $1102_{n-1,0}$, and its source coupled to ground. Any of transistors 1406, 1408, 1410, and 1412 can be replaced with other types of transistors and the logic adjusted accordingly.

Isolation circuit 1401 includes inverters 1402 and 1404. For alternative embodiments, only one inverter may be used and the logic of the next compare circuit adjusted accordingly. For other embodiments, other isolation circuits such as one or more AND, OR, or XOR logic gates or pass gates may be used.

Figure 15:
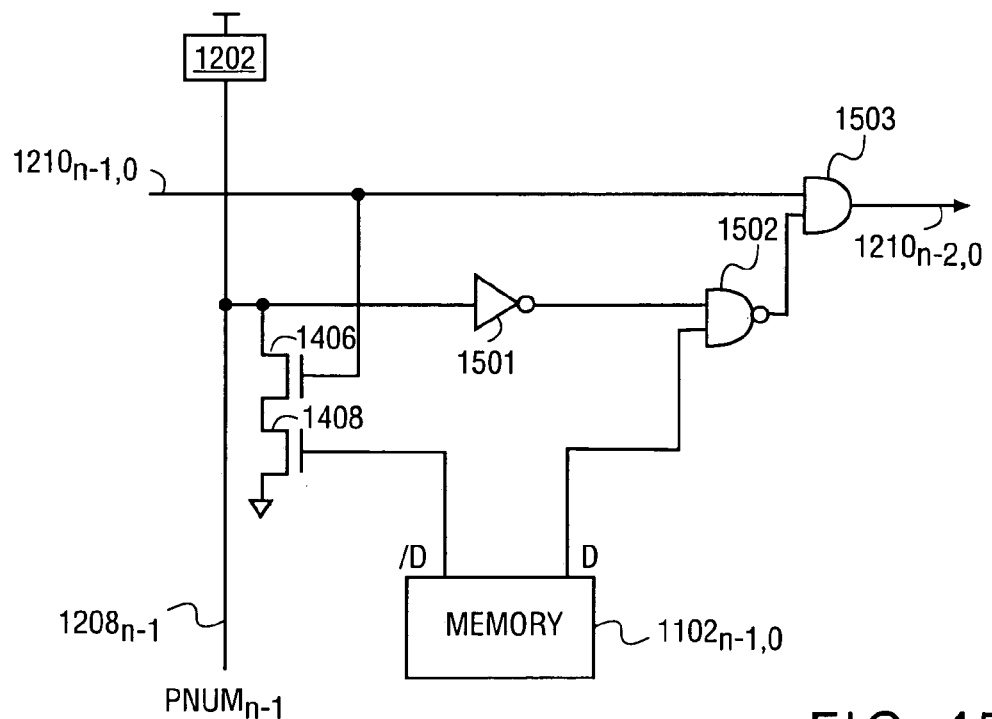
FIG. 15 is another embodiment of a compare circuit and an isolation circuit for the priority logic element of FIG. 11.

FIG. 15 shows another embodiment of compare circuit $1206_{n-1,0}$ and isolation circuit $1204_{n-1,0}$ for implementing the truth table of Table 1. In this embodiment, the compare circuit and isolation circuit are merged into the same logic that includes transistors 1406 and 1408 configured as in FIG. 14, inverter 1501, NAND gate 1502, and AND gate 1503. NAND gate 1502 has one input coupled to signal line $1208_{n-1}$ via inverter 1501, and another input coupled to receive the priority number bit (D) stored in memory element $1102_{n-1,0}$. AND gate 1503 has one input coupled to match line segment $1210_{n-1,0}$, another input coupled to the output of NAND gate 1502, and an output coupled to match line segment $1210_{n-2,0}$.

Figure 16:
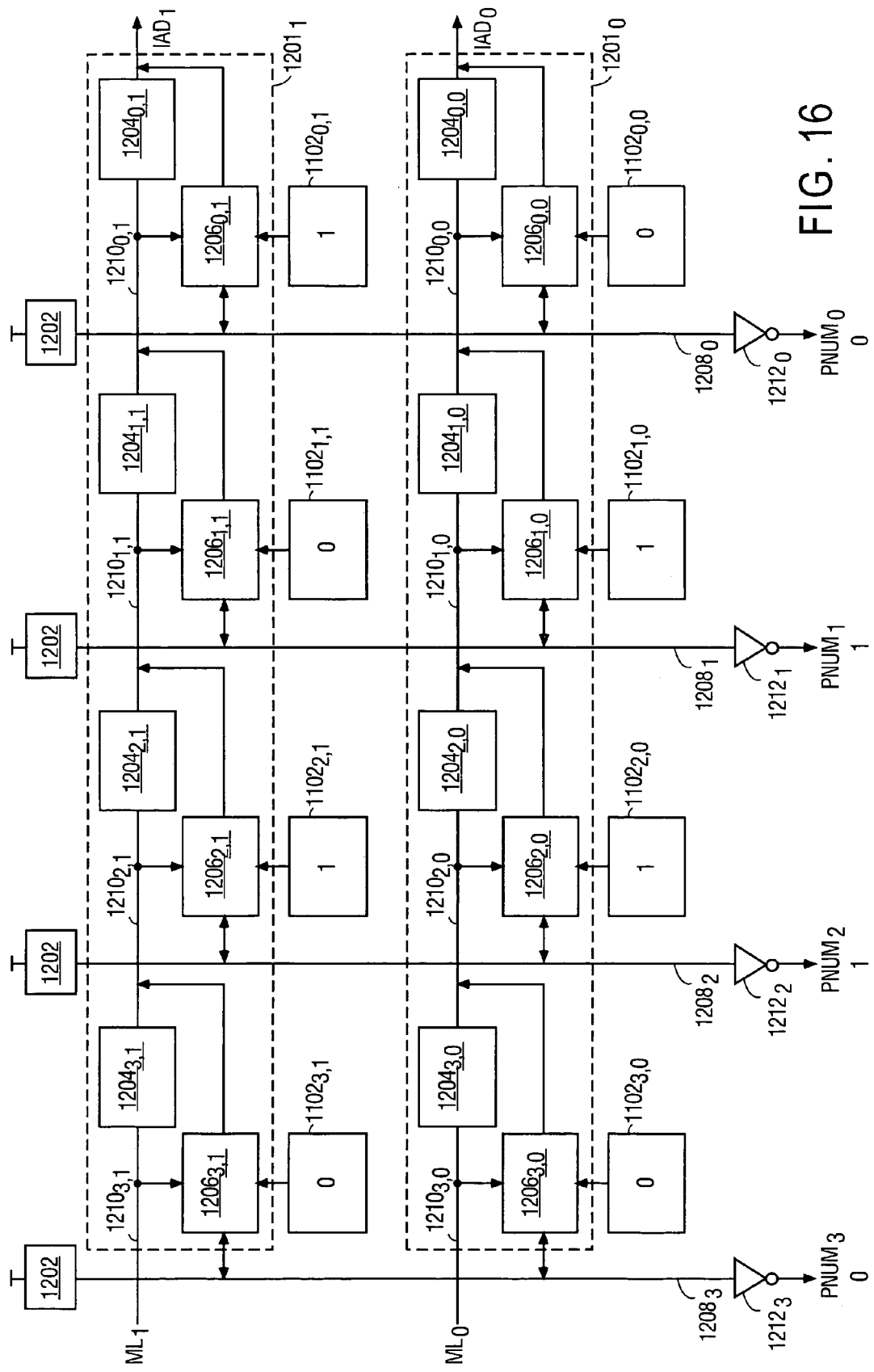
FIG. 16 is another example of determining the most significant priority number stored in the rows of the priority index table.

For the example described above with respect to FIG. 13, the most significant priority number is the lowest number such that 0101 is the most significant number between 0101 and 0110. For another embodiment, the priority numbers are stored in descending priority order such that 0110 is the most significant priority number between 0101 and 0110. For this embodiment, compare circuits $1206_{0,0}$–$1206_{3,1}$ determine that 0110 is the most significant priority number, and assert $IAD_0$ to indicate that 0110 is stored in row zero of the priority index table. For this embodiment, as shown in FIG. 16, inverters $1212_3$–$1212_0$ output the logical states of priority signal lines $1208_3$–$1208_0$, respectively, as $PNUM_3$–$PNUM_0$. For other embodiments, inverters $1212_3$–$1212_0$ are not required. Compare circuits $1206_{0,0}$–$1206_{3,1}$ and isolation circuits $1204_{0,0}$–$1204_{3,1}$ determine that 0110 is the highest priority number as follows.

As in the previous embodiment, the most significant bit $PNUM_3$ is resolved first. For this embodiment, memory elements 1102 that store a logic zero do not discharge their corresponding priority signal lines 1208. Since both of memory elements $1102_{3,1}$, and $1102_{3,0}$ store logic zero states, signal line $1208_3$ remains pre-charged such that $PNUM_3$ is a logic zero. Additionally, compare circuit $1206_{3,1}$ compares the state of priority signal line $1208_3$ with the priority number bit stored in $1102_{3,1}$ and determines that both have different logical states. This causes compare circuit $1102_{3,1}$ to not affect the logical state of match line segment $1210_{2,1}$ such that match line segment $1210_{2,1}$ has the same logic state as match line segment $1210_{3,1}$. Similarly, compare circuit $1206_{3,0}$ compares the state of priority signal line $1208_3$ with the priority number bit stored in $1102_{3,0}$ and determines that both have the different logical states. This causes compare circuit $1102_{3,0}$ to not affect the logical state of match line segment $1210_{2,0}$ such that match line segment $1210_{2,0}$ has the same logic state as match line segment $1210_{3,0}$.

$PNUM_2$ is resolved next. When any memory element 1102 stores a logic one and the corresponding match line segment 1210 is asserted, the corresponding priority signal line 1208 is discharged. Thus, each of memory compare circuits $1206_{2,1}$ and $1206_{2,0}$ discharge signal line $1208_2$ such that $PNUM_2$ is a logic one. Additionally, compare circuit $1206_{2,1}$ does not affect match line segment $1210_{1,1}$ because memory element $1102_{2,1}$ and priority signal line $1208_2$ have different logic states. Thus, match line segment $1210_{1,1}$ will have the same logic state as match line segment $1210_{2,1}$. Similarly, compare circuit $1206_{2,0}$ does not affect match line segment $1210_{1,0}$ because memory element $1102_{2,0}$ and priority signal line $1208_2$ have different logic states. Thus, match line segment $1210_{1,0}$ has the same state as match line segment $1210_{2,0}$.

$PNUM_1$ is resolved next. Since memory element $1102_{1,0}$ stores a logic one and match line segment $1210_{1,0}$ is asserted, compare circuit $1206_{1,0}$ discharges priority signal line $1208_1$. This causes $PNUM_1$ to be a logic one. Additionally, compare circuit $1206_{1,0}$ compares the logic zero state of priority signal line $1208_1$ with the logic one stored in $1102_{1,0}$ and allows match line segment $1210_{0,0}$ to have the same logic state as match line segment $12101,o$. Compare circuit $1206_{1,1}$, however, compares the logic zero on priority signal line $1208_1$ with the logic zero stored in memory element $1102_{1,1}$, and de-asserts match line segment $1210_{0,1}$. As in the example of FIG. 13, when a match line segment is de-asserted, all subsequent compare circuits for that row will de-assert the remaining match line segments for the row such that the corresponding internal address line IAD will be de-asserted. When IAD is de-asserted for a particular row, this indicates that the most significant priority number in not stored in that row. Additionally, when the remaining match line segments are de-asserted, the compare circuits for that row do not discharge the remaining priority signal lines regardless of the logic states stored in their corresponding memory elements of that row. For example, compare circuit $1206_{0,1}$ does not discharge priority signal line $1208_0$ even though memory element $1102_{0,1}$ stores a logic one. Additionally, isolation circuits $1204_{3,1}$, $1204_{2,1}$, and $1204_{1,1}$ isolate the de-asserted match line segment $1210_{0,1}$ from match line segments $1210_{3,1}$, $1210_{2,1}$, and $1210_{1,1}$ such that the $PNUM_3$, $PNUM_2$, $PNUM_1$ and are not affected by de-asserted match line segment $1210_{0,1}$.

Lastly, the least significant priority number bit $PNUM_0$ is resolved. Compare circuit $1206_{0,0}$ alone determines $PNUM_0$ since compare circuit $1206_{0,1}$ can not discharge priority signal line $1208_0$. Since memory element $1102_{0,0}$ stores a logic zero and match line segment $1210_{0,0}$ is asserted, compare circuit $1206_{0,0}$ leaves priority signal line $1208_0$ pre-charged, and $PNUM_0$ is a logic zero. Additionally, compare circuit $1206_{0,0}$ allows $IAD_0$ to have the same logic state as match line segment $1210_{0,0}$. Since match line segment $1210_{0,0}$ is asserted, $IAD_0$ will be asserted indicating that the most significant priority number is stored in that row.

Thus, when the processing of step 706 is completed, $PNUM_3$–$PNUM_0$, for this embodiment, indicate that the most significant priority number stored in the priority index table is 0110, and $IAD_0$ is asserted identifying that 0110 is stored in row zero.

Any circuits may be used for compare circuits 1206 and/or isolation circuits 1204 to implement the process illustrated above for FIG. 16. Table 2 shows one example of a truth table for implementing each compare circuit 1206, where X (column) and Y (row) are any integers. Other truth tables may be used (and corresponding logic generated accordingly) including those that logically complement one of more of the signals indicated in Table 2.

TABLE 2

| STATE | PNUM | 1102 | $1210_{X,Y}$ | $1210_{X-1,Y}$ |
|-------|------|------|--------------|----------------|
| 0 | 0 | 0 | 0 | 0 |
| 1 | 0 | 0 | 1 | 1 |
| 2 | 0 | 1 | 0 | 0 |
| 3 | 0 | 1 | 1 | 1 |
| 4 | 1 | 0 | 0 | 0 |
| 5 | 1 | 0 | 1 | 0 |
| 6 | 1 | 1 | 0 | 0 |
| 7 | 1 | 1 | 1 | 1 |

Note that state 3 may not occur since PNUM will not be a logic zero when a memory element 1102 stores a logic one and the corresponding match line segment 1210 is asserted to a logic one state. For other truth tables, state 3 may occur.

Any logic or circuitry may be used to implement the truth table of Table 2. For one embodiment, the compare circuit 1403 and isolation circuit 1401 of FIG. 14 may be used. For this embodiment, transistor 1408 has its gate coupled to receive the priority number bit (D) stored in memory element $1102_{n-1,0}$, and transistor 1412 has its gate coupled to receive the logical complement of the priority number bit (/D) stored in memory element $1102_{n-1,0}$. Additionally, signal line $1208_{n-1}$ provides the logical complement of $PNUM_{n-1}$.

For another embodiment, the logic and circuitry of FIG. 15 may be used to implement the truth table of Table 2. For this embodiment, transistor 1408 has its gate coupled to receive the priority number bit (D) stored in memory element $1102_{n-1,0}$, and NAND gate 1502 has an input coupled to receive the logical complement of the priority number bit (/D) stored in memory element $1102_{n-1,0}$. Additionally, signal line $1208_{n-1}$ provides the logical complement of $PNUM_{n-1}$.

Figure 12B:
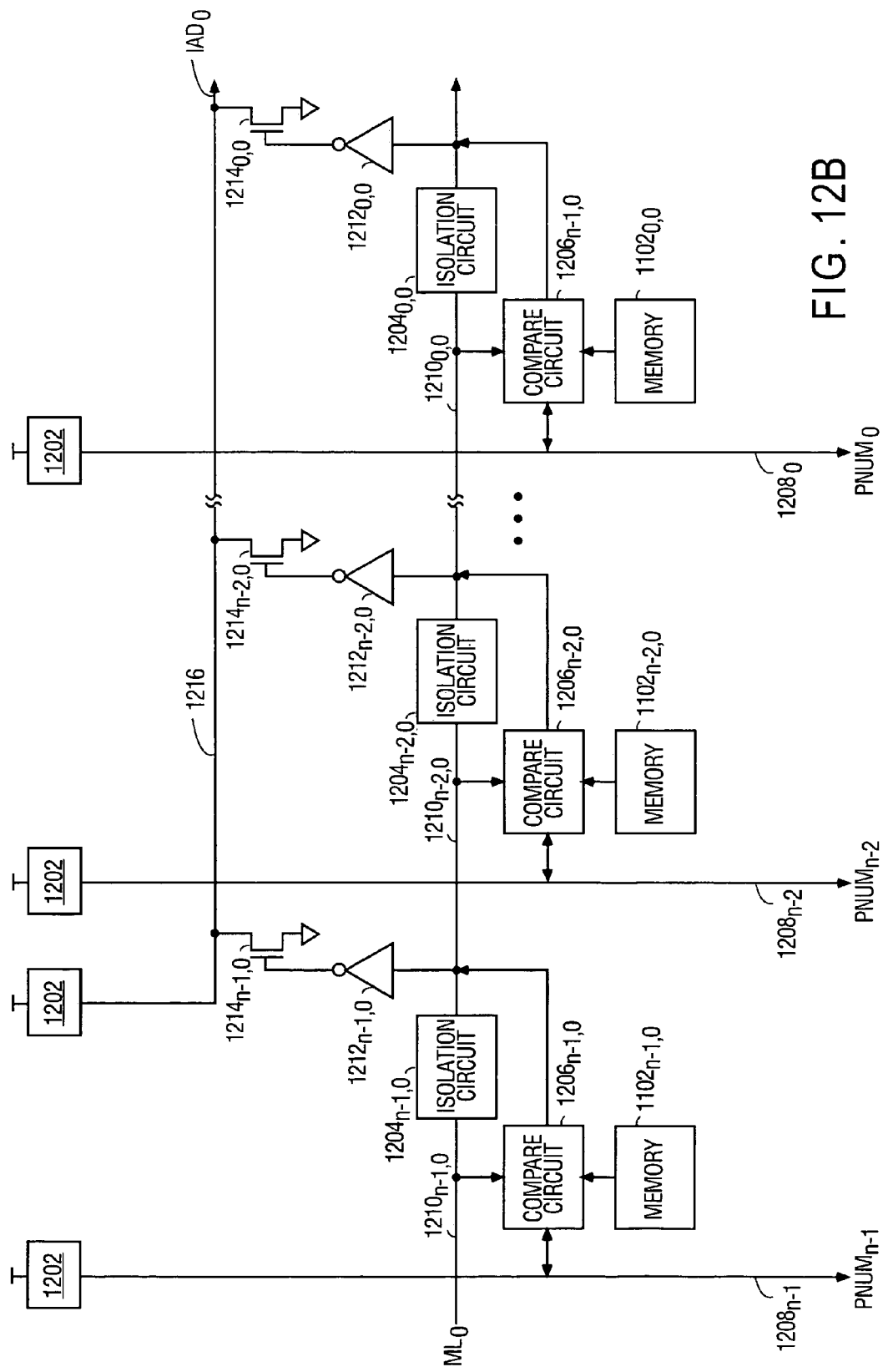
FIG. 12B is another embodiment of two rows of the priority index table of FIG. 11.

FIG. 12B shows another embodiment of $1201_0$ of the priority index table. For this embodiment, $IAD_0$ is determined on signal line 1216 that is separate from the match line segments. As shown in FIG. 12B, each match line signal line is coupled to a discharge circuit that includes an inverter-transistor pair (i.e., inverters $1212_{n-1,0}$–$1212_{0,0}$ and corresponding transistors $1214_{n-1,0}$–$1214_{0,0}$) such that if any of the match line segments is discharged, then signal line 1216 is discharged to a low logic state. For other embodiments, other discharge circuitry may be used. Signal line 1216 is pre-charged to a high logic state by pre-charge circuit 1202. For an alternative embodiment, signal line 1216 may be driven directly by the match line segments.

The previously described embodiments of system 600 of FIG. 6 show that policy statements can be loaded into CAM array 604 in any order. When an incoming packet is received, DSP 602 can identify the address in CAM array 604 of the highest priority policy statement that matches the policy information of the incoming packet. The identified address can then be used to access routing information stored in route memory 614. DSP 602 can perform this function without the user having to preorder the policy statements for entry into the CAM array. This can reduce the hardware and/or software needed for table management of the CAM array, and can increase the performance of a router incorporating the DSP.

DSP 602 can operate asynchronously or synchronously. When DSP 602 operates synchronously, it receives a clock signal that may be used to clock in the policy search key and an instruction that causes the process of FIG. 7 to be performed by DSP 602. DSP 602 may implement the classification function of FIG. 7 in one or more clock cycles.

Inserting and Deleting Policy Statements

As previously described, priority numbers for policy statements may be assigned in ascending or descending priority order such that there are gaps left between the numbers to accommodate the new priority numbers associated with new policy statements to be stored in CAM array 604. Alternatively, the priority numbers may be assigned in consecutive ascending or descending priority order. New policy statements and their associated priority numbers can be added to the tables 604 and 608 in conformance with either assignment method without having to reload or physically reorder the policy statements or the priority numbers in the respective tables.

Each new policy statement can be loaded into any location (e.g., the next free location) in CAM array 604, and can be assigned a new priority number without having to reload or reorder CAM array 604 and priority memory 608. When a new policy statement is received, its priority number can be compared with the existing priority numbers already stored in priority memory 608 to determine if a policy statement already exists that has been assigned that priority. It is generally desirable that no two policy statements have the same priority number. Thus, if the priority number already exists, the network administrator or the policy-based router itself can assign the new policy statement a new priority number, or the priority number of the existing policy statement can be updated (i.e., incremented or decremented). Since the existing priority numbers are stored in ascending or descending order, updating one priority number may also result in the need to update other priority numbers such that no two priority numbers are the same.

For one embodiment, DSP 602 may include additional circuitry to determine if at least one of the existing priority numbers stored in memory 608 is greater than or equal to (e.g., for ascending priority order), or, alternatively, less than or equal to (e.g., for descending priority order), the new priority number. If so, the existing priority numbers that are identified by the comparison may be updated such that a new policy statement does not have the same priority number as an existing policy statement. For other embodiments described below, priority logic 610 itself in priority index table 606 may perform the additional compare function(s) and control the updating function(s).

Figure 17:
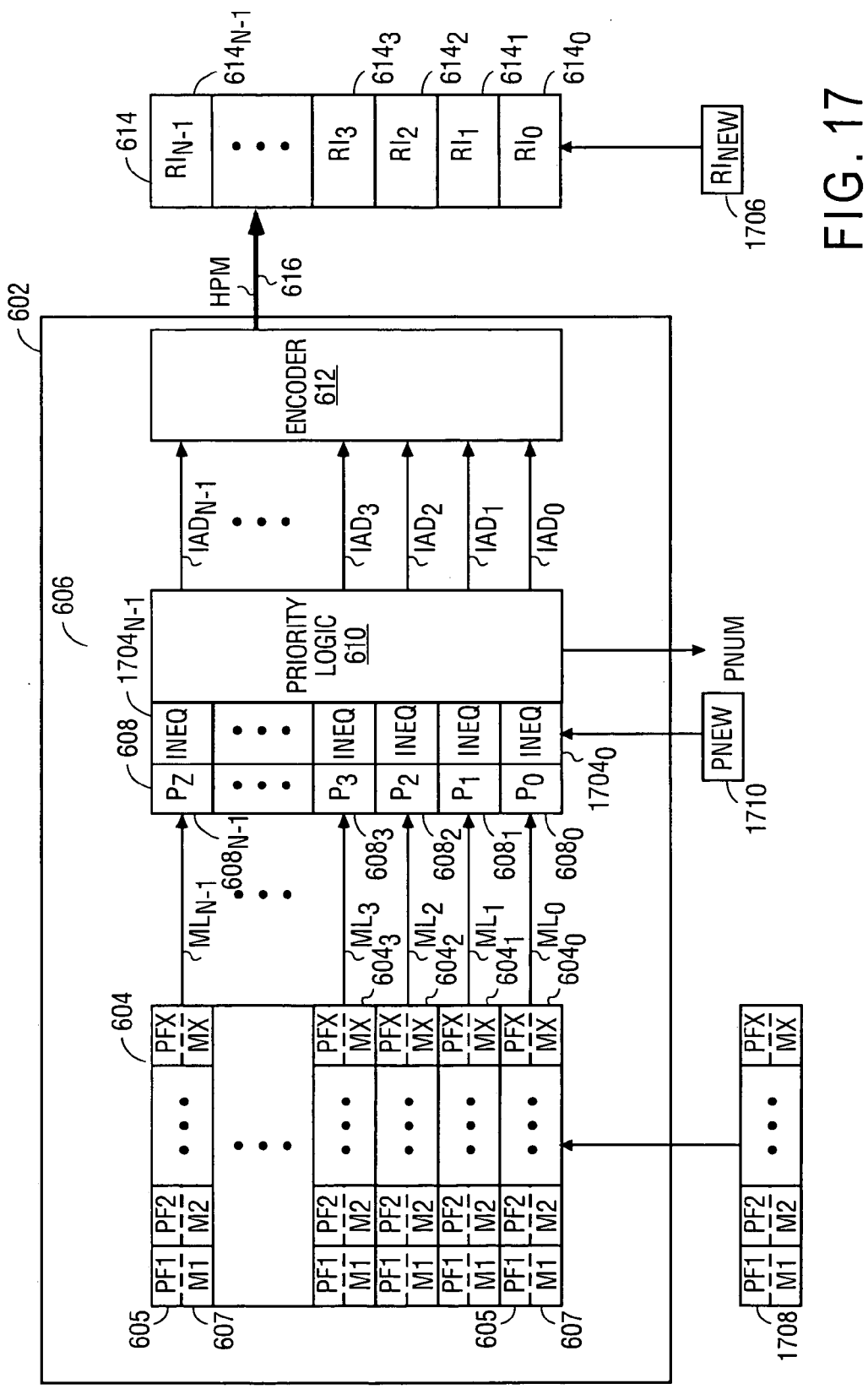
FIG. 17 is another embodiment of the priority index table of FIG. 6 including inequality circuits.

FIG. 17 shows one embodiment of priority index table 606 of FIG. 6 including inequality circuits INEQ $1704_0$–$1704_{N-1}$ that perform the additional comparison functions and control the updating functions. The inequality circuits determine if a new priority number PNEW 1710 of a new policy statement 1708 is the same, higher, or, alternatively, lower than any of the priority numbers already stored in memory 608. The inequality circuits also update the priorities of the existing policy statements in order to insert the new policy statement. The new policy statement and its associated priority number do not need to be physically inserted between the existing entries; rather, they can be loaded into any desirable address (e.g., the next free address) in the CAM array and priority memory, and the priority numbers of the existing policy statements updated accordingly. Similarly, when a policy statement is removed (i.e., invalidated or overwritten) from the CAM array, the inequality circuits may update the priority numbers of the previously stored policy statements. These updating functions can be performed by the inequality circuits without the need to physically reorder the policy statements in the CAM array, or to physically reorder the priority numbers in the priority index table. This can reduce the hardware and/or software needed for table management of the CAM array, and can increase the performance of a router incorporating the DSP.

For an alternative embodiment, the inequality circuits do not update the existing, stored priority numbers during or after an insert or delete operation. For this embodiment, gaps may be left in the priority numbers after an insert or delete function. These gaps may or may not be filled with subsequent priority numbers.

As shown in FIG. 17, each location $608_0$–$608_{N-1}$ in the priority memory has a corresponding inequality circuit $1704_0$–$1704_{N-1}$ that compares the new priority number PNEW 1710 with the priority number $P_0$–$P_Z$ stored at that location. If PNEW is the same or a higher priority (e.g., is greater than or equal to, or, alternatively less than or equal to) than an existing priority number, an inequality circuit will update the existing priority number. The new policy statement 1708, PNEW, and the associated route information $RI_{NEW}$, can then be written into CAM array 604, priority memory 608, and route memory 614, respectively, using conventional write circuits, counters, address decoders, etc. (not shown).

Inequality circuits $1704_0$–$1704_{N-1}$ may be part of priority index table 606 as shown in FIG. 17. Alternatively, inequality circuits $1704_0$–$1704_{N-1}$ may be separate from priority index table 606. The inequality circuits may be any inequality circuit that determines whether one number is greater than or equal to, greater than, less than or equal to, or less than another number. For an alternative embodiment, inequality circuits $1704_0$–$1704_{N-1}$ may be one circuit that consecutively, or in parallel, compares PNEW with each of the priority numbers $P_0$–$P_Z$.

Figure 18:
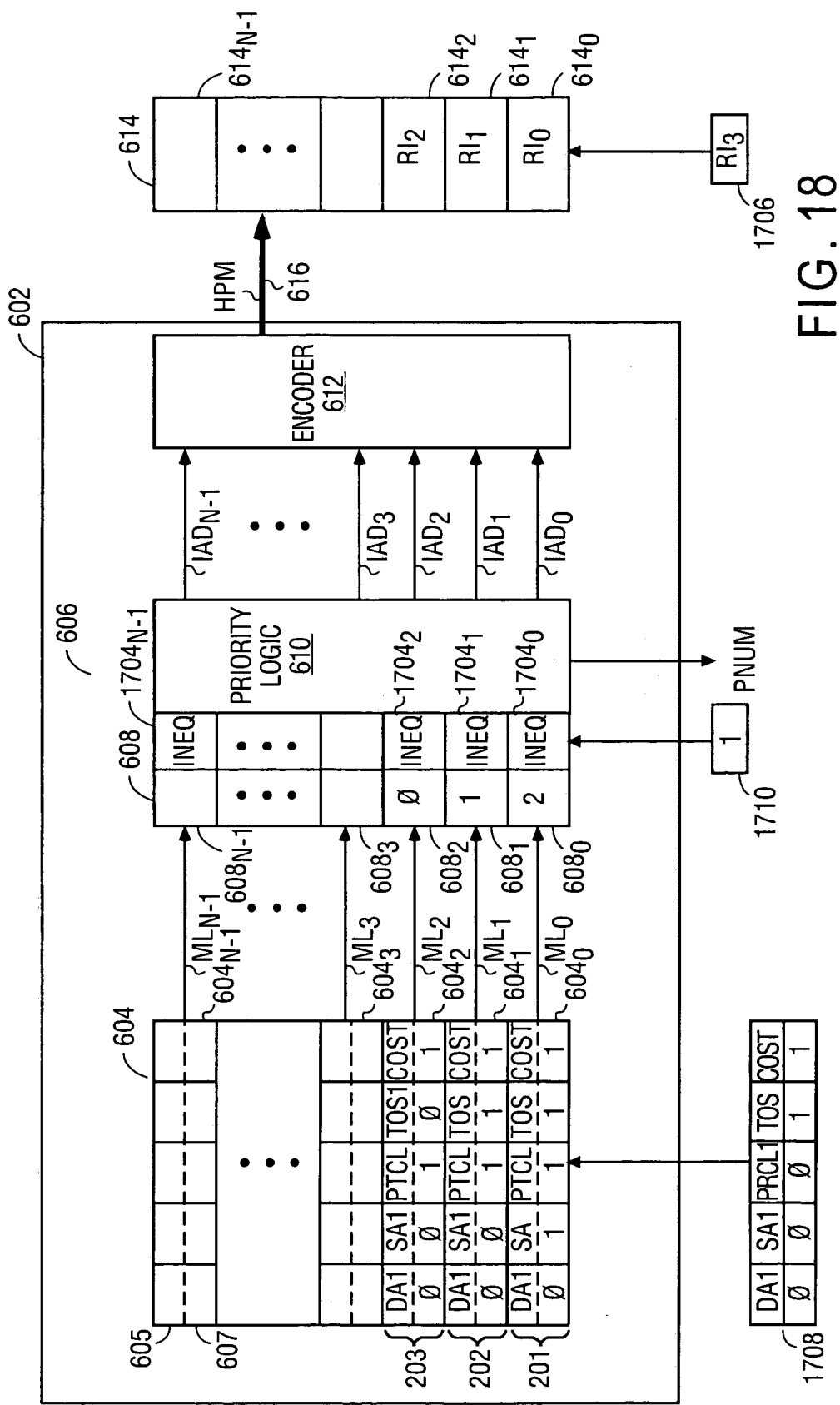
FIG. 18 is one example of a policy stored in the digital signal processor of FIG. 17.

FIG. 18 shows one example of adding new policy statement 1708 to CAM array 604 at the next free address of CAM array 604 (location 6043) and updating the existing priority numbers stored in memory 608. New policy statement 1708 is assigned priority number 1, and has route information $RI_3$. CAM array 604 already includes policy statements 201, 202, and 203 stored at locations $604_0$, $604_1$, and $604_2$, respectively. The corresponding priority numbers 2, 1, and 0 are stored at locations $608_0$, $608_1$, and $608_2$, respectively, in priority memory 608. Additionally, the corresponding route information $RI_0$, $RI_1$, and $RI_2$, are stored at locations $614_0$, $614_1$, and $614_2$, respectively, of route memory 614. For this embodiment, the policy statements are assigned priority numbers in ascending priority order such that policy statement 203 is identified as the highest priority policy statement by being assigned priority number 0; policy statement 201 is identified as the lowest priority policy statement by being assigned priority number 2; and, policy statement 202 is identified as having a priority greater than that of policy statement 201, but less than that of policy statement 203, by being assigned priority number 1.

Figure 19:
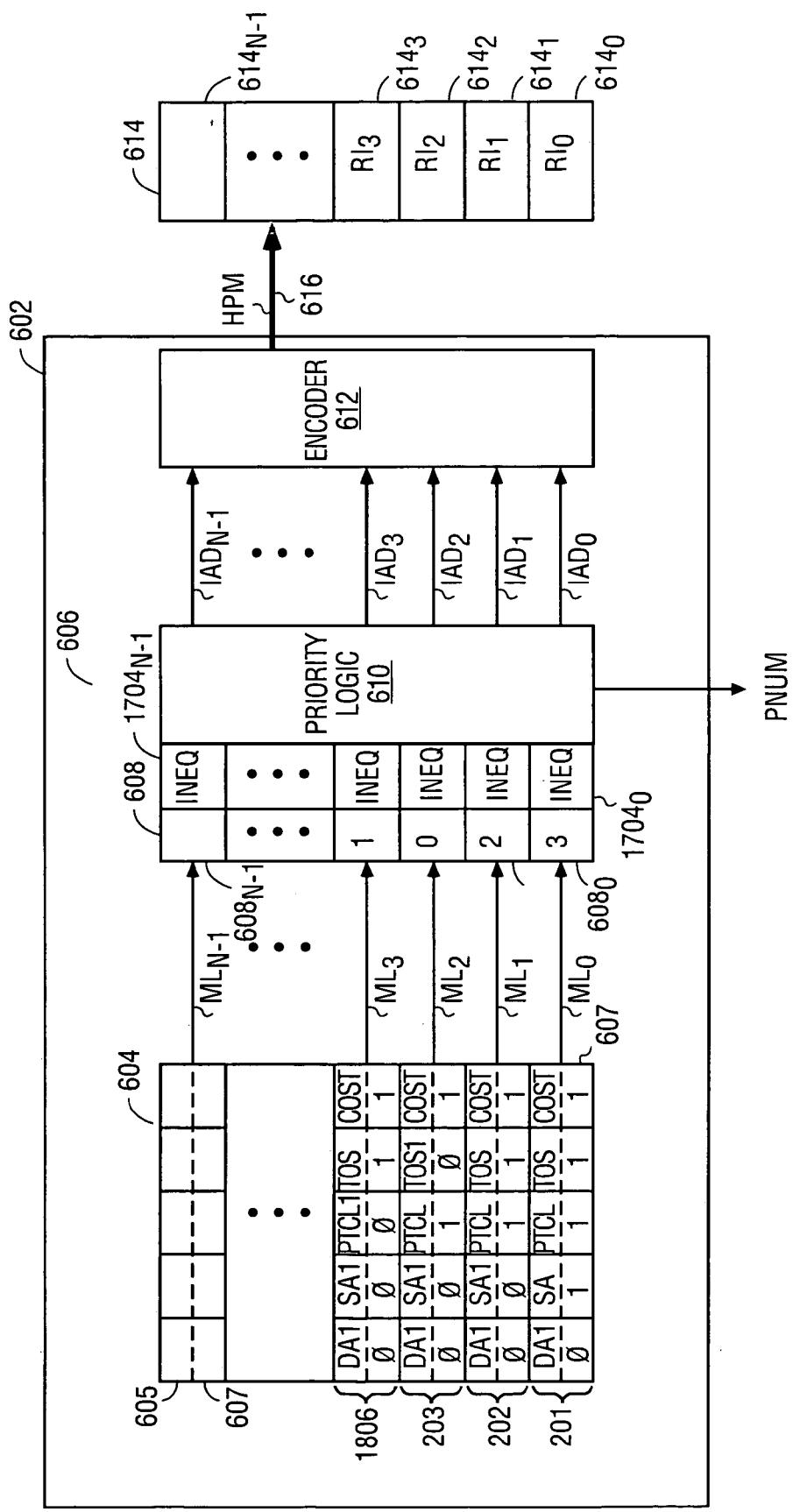
FIG. 19 is one example of loading a new policy statement into the digital signal processor of FIG. 18.

Inequality circuits $1704_0$–$1704_2$ compare PNEW with the exiting priority numbers as follows. The comparisons are made in parallel by each inequality circuit, however, they may also be made consecutively or in groups. Inequality circuit $1704_2$ compares its corresponding priority number 0 with the new priority number 1 and determines that 0 is a higher priority than 1 (i.e., that 0 is numerically less than 1). The priority number for policy statement 203 is not updated. Inequality circuit $1704_1$ compares its corresponding priority number 1 with the new priority number 1 and determines that they have the same priority. The priority number for policy statement 202 is incremented (updated) by one to the number 2. Inequality circuit $1704_0$ compares its corresponding priority number 2 with the new priority number 1 and determines that 1 is a higher priority than 2 (i.e., that 1 is numerically less than 2). The priority number for policy statement 201 is then incremented to 3. The modified table entries after the insertion of the new policy statement and its associated priority number are shown in FIG. 19.

Figure 20:
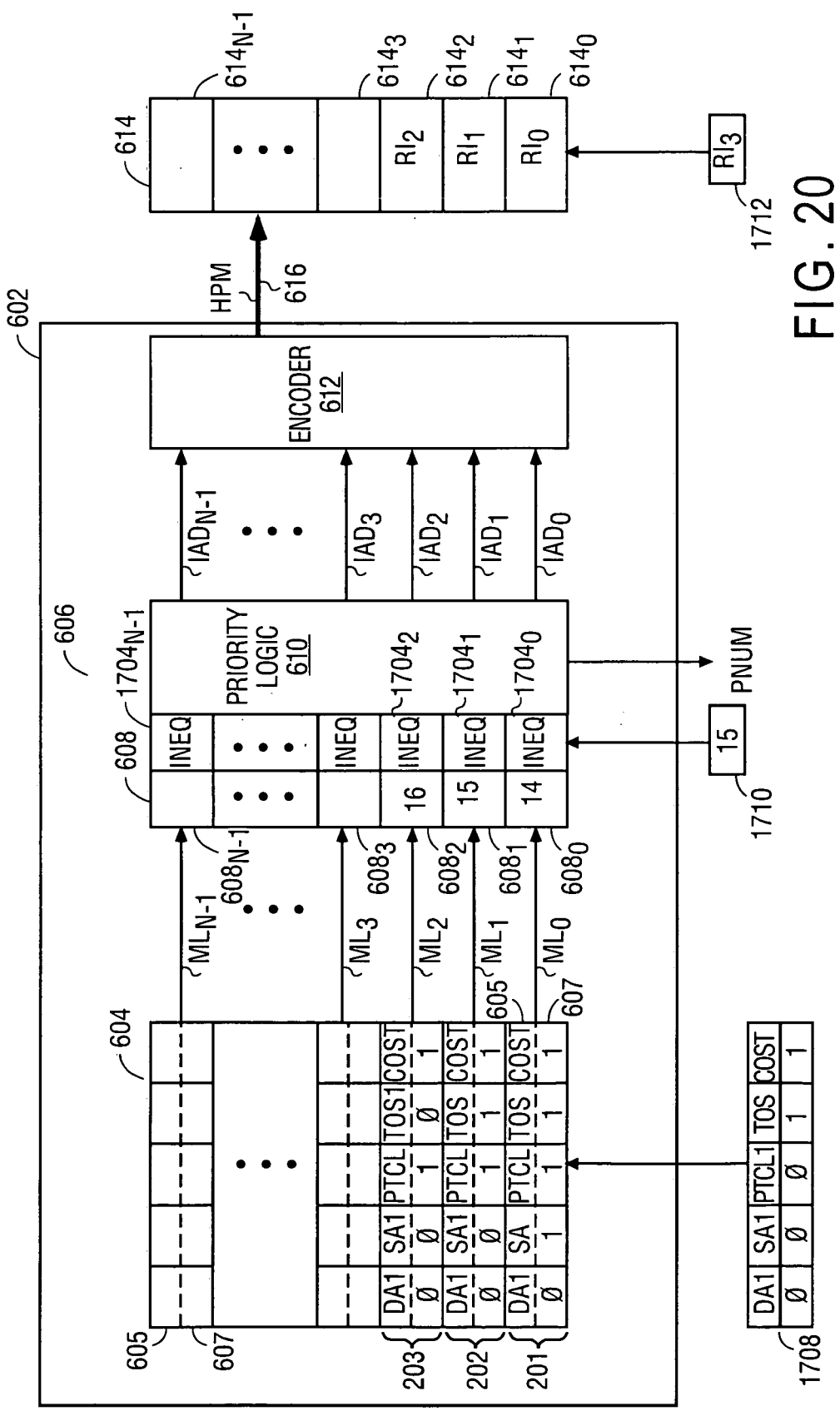
FIG. 20 is another example of a policy stored in the digital signal processor of FIG. 17.

FIG. 20 shows another example of adding new policy statement 1708 to CAM array 604 at the next free address of CAM array 604 (location 6043). For this embodiment, policy statements 201, 202, and 203 have priority numbers 14, 15, and 16, respectively, and the new policy statement has priority number 15. The policy statements are assigned in descending priority order such that policy statement 203 is identified as the highest priority policy statement by being assigned priority number 16; policy statement 201 is identified as the lowest priority policy statement by being assigned priority number 14; and, policy statement 202 is identified as having a priority greater than that of policy statement 201, but less than that of policy statement 203, by being assigned priority number 15.

Figure 21:
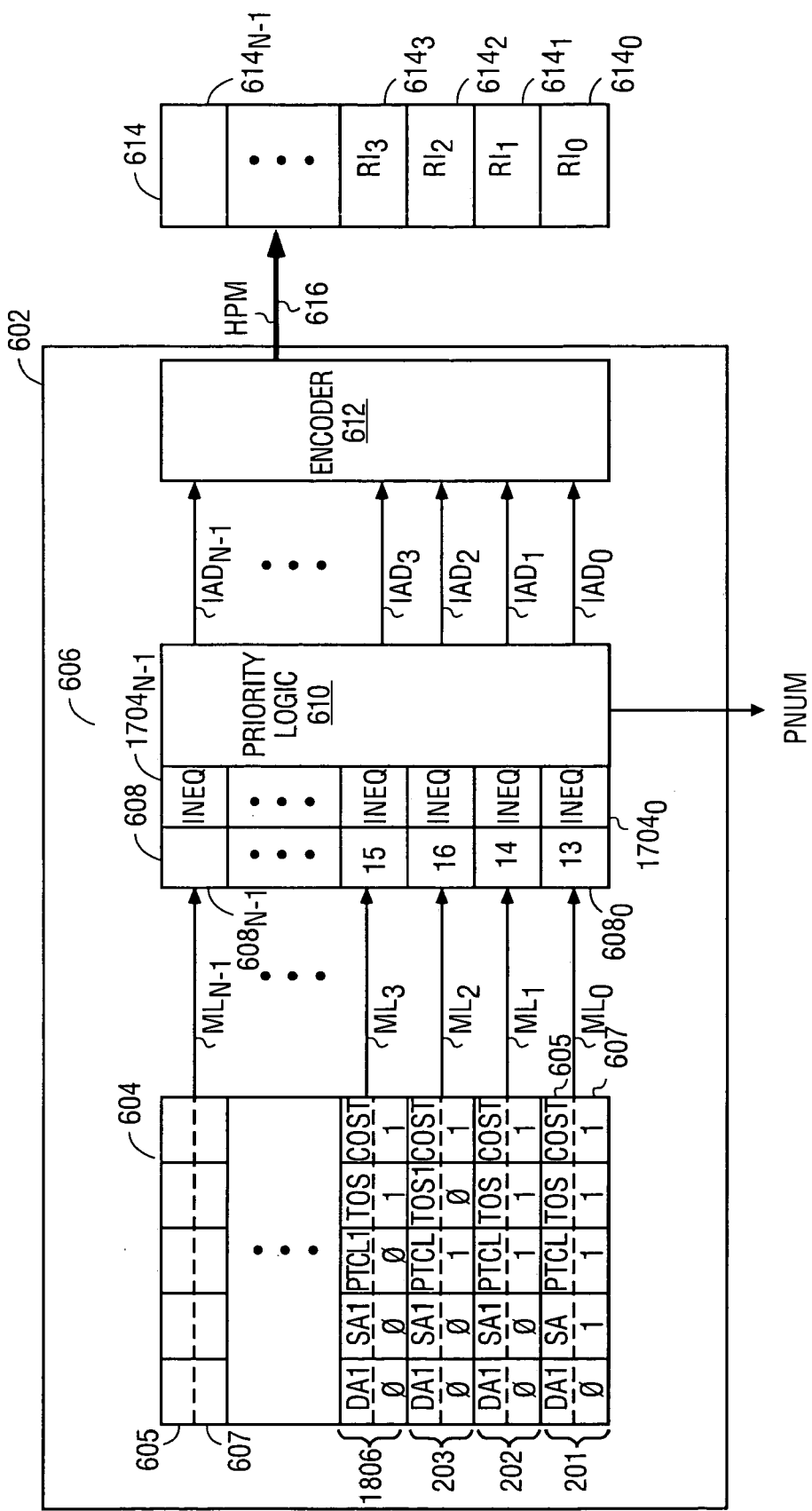
FIG. 21 is one example of loading a new policy statement into the digital signal processor of FIG. 20.

Inequality circuit $1704_2$ compares its corresponding priority number 16 with the new priority number 15 and determines that 16 is a higher priority than 15 (i.e., that 16 is numerically greater than 15). The priority number for policy statement 203 is not updated. Inequality circuit $1704_1$ compares its corresponding priority number 15 with the new priority number 15 and determines that they have the same priority. The priority number for policy statement 202 is decremented (updated) by one to the number 14. Inequality circuit $1704_0$ compares its corresponding priority number 14 with the new priority number 15 and determines that 15 is a higher priority than 14 (i.e., that 14 is numerically less than 15). The priority number for policy statement 201 is then decremented to 13. The modified table entries after the insertion of the new policy statement and its associated priority number is shown in FIG. 21.

Figure 22:
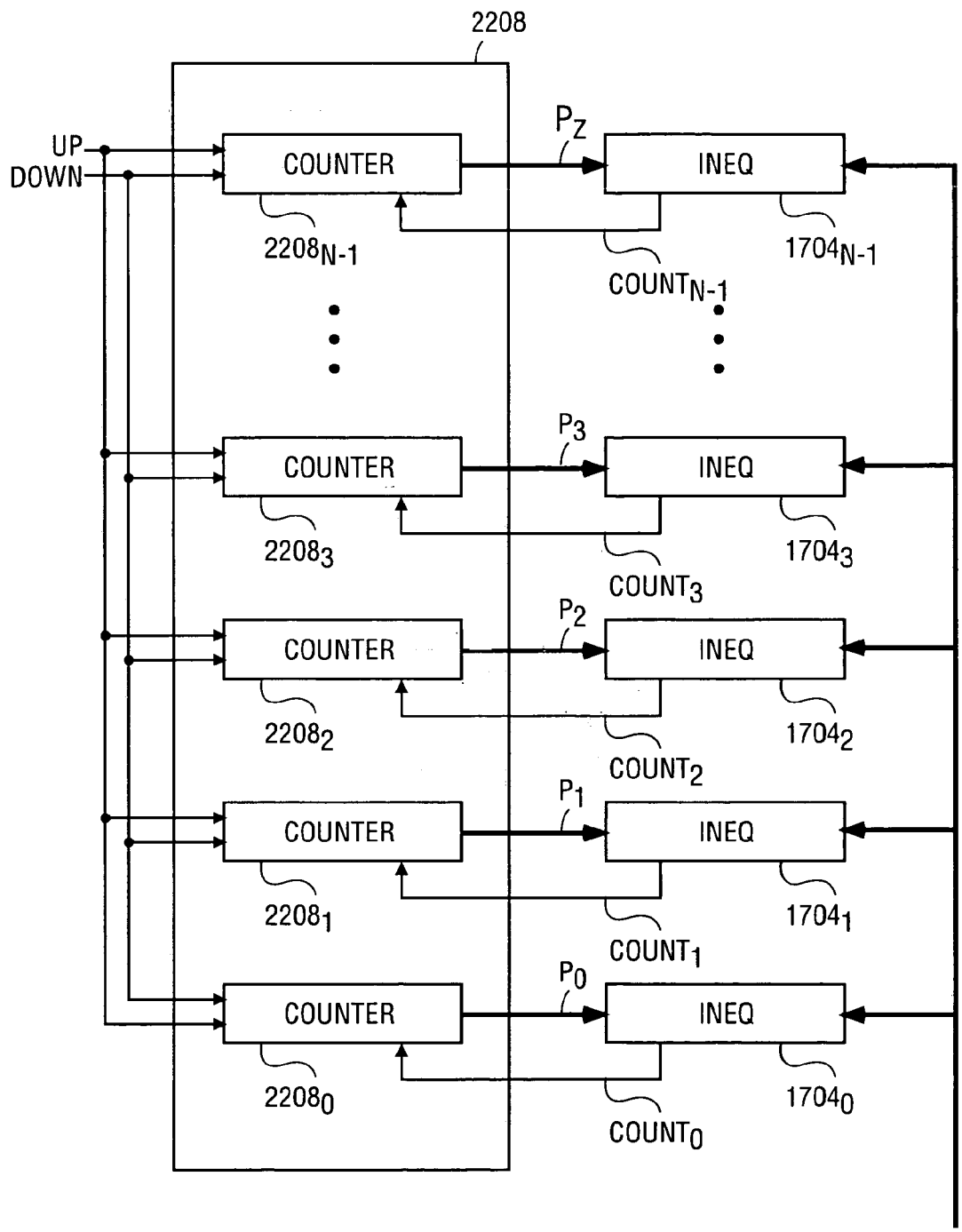
FIG. 22 is one embodiment of the rows of the priority index table of FIG. 17, in which the priority memory locations are configured as counters.

As indicated above, the priority numbers can be incremented, decremented, or left unchanged after PNEW is compared with the priority number. FIG. 22 shows priority memory 2208 that is one embodiment of priority memory 608. Priority memory 2208 includes counters $2208_0$–$2208_{N-1}$. Each counter corresponds to priority memory location $608_1$–$608_{N-1}$, respectively, and stores the priority number for that location. The counters can be loaded (i.e., written to) using write circuits, read from using read circuits, or reset as generally known in the art. Additionally, each counter $2208_0$–$2208_{N-1}$ provides its stored priority number $P_0$–$P_Z$ to a corresponding inequality circuit $1704_0$–$1704_{N-1}$ for comparison with PNEW. When PNEW has a higher priority than the stored priority number for a given location, then the inequality circuit will assert its count signal $COUNT_0$–$COUNT_{N-1}$ such that the corresponding counter is incremented (or, alternatively, decremented). The counter will be incremented if the UP signal is asserted, or will be decremented if the DOWN signal is asserted. The UP and DOWN signals may be generated by an instruction decoder (not shown) on DSP 602 that receives and decodes an insert (write) instruction or a delete (invalidate) instruction to the DSP. For an alternative embodiment, the inequality circuits may each output UP and DOWN signals to their corresponding counters directly in response to one or more signals from the instruction decoder. The counters may be updated synchronously or asynchronously.

Figure 23:
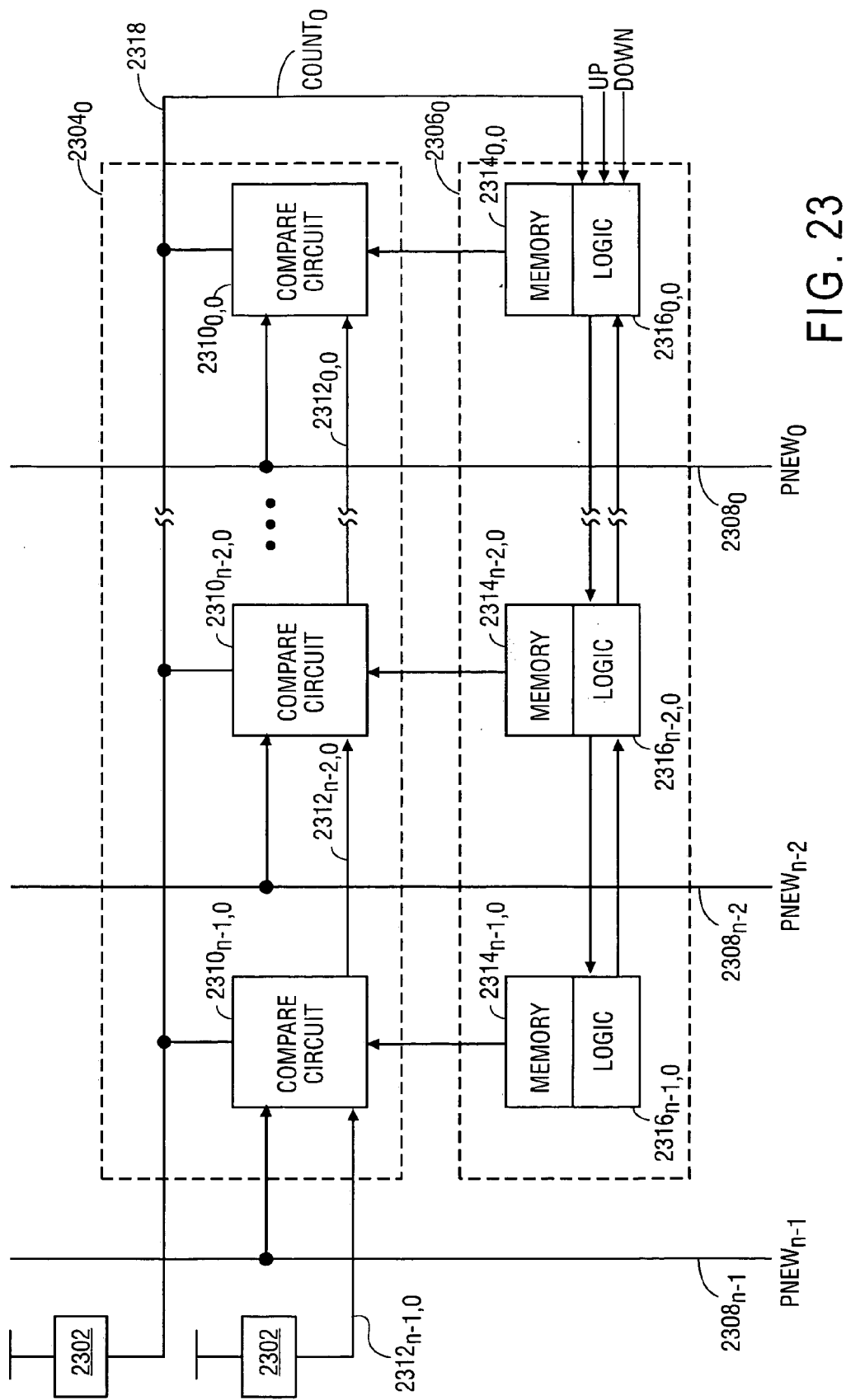
FIG. 23 is one embodiment of an inequality circuit and counter of FIG. 22.

Inequality circuits $1704_0$–$1704_{N-1}$ may be disposed external to priority memory 2208, or they may be integrated into the priority memory itself. FIG. 23 shows one embodiment of integrating an inequality circuit with a counter in the priority memory. For this embodiment, inequality circuit $2304_0$ is one embodiment of inequality circuit $1704_0$, and may also be used for any of inequality circuits $1704_1$–$1704_{N-1}$. Counter $2306_0$ is one embodiment of counter $2208_0$, and may also be used for any of counters $2208_1$–$2208_{N-1}$.

As shown in FIG. 23, memory storage elements $2314_{n-1,0}$–$2314_{0,0}$ have associated counter logic circuits $2316_{n-1,0}$–$2316_{0,0}$ to form a conventional counter. Each memory storage element can be a volatile or non-volatile RAM or ROM storage element such as memory storage elements 1102 of FIG. 11. The memory storage elements each store one bit of a priority number such that memory storage element $2314_{n-1,0}$ stores the most significant priority number bit, $2314_{n-2,0}$ stores the next most significant priority number bit, and $2314_{0,0}$ stores the least significant priority number bit. Logic circuits $2316_{n-1,0}$–$2316_{0,0}$ receive the UP, DOWN, and $COUNT_0$ signals that indicate when the counter should increment, decrement, or leave unchanged the priority number stored in the counter. The counter can be configured to form any type of counter including the up/down counter shown. Additionally, load and reset signals can be provided to the logic circuits to write or reset the counter. Bit lines, word lines, and read/write circuits generally known in the art may also be included to access the priority number bits stored in the memory storage elements.

Inequality circuit $2304_0$ includes compare circuits $2310_{n-1,0}$–$2310_{0,0}$. Each compare circuit can be any digital or analog compare circuits. Each compare circuit $2310_{n-1,0}$–$2310_{0,0}$ compares a priority number bit, stored in a corresponding memory storage element $2314_{n-1,0}$–$2314_{0,0}$, with one of the corresponding bits $PNEW_n$–$PNEW_0$ provided on signal lines $2308_{n-1}$–$2308_0$. Additionally, each compare circuit monitors the comparison result of the more significant priority number bits with PNEW via the logical states of control line segments $2312_{n-2,0}$–$2312_{0,0}$. The first control line segment $2312_{n-1,0}$ may be pre-charged by pre-charge circuit 2302 to indicate that it is the first control line segment. Alternatively, control line segment $2312_{n-1,0}$ may be initially discharged to indicate that it is the first control line segment.

For this embodiment, the logical state of $COUNT_0$ on signal line 2318 indicates the comparison result between PNEW and the priority number stored in counter $2306_0$. $COUNT_0$ is initially pre-charged by a pre-charge circuit 2302 to a high logic state. If $COUNT_0$ remains pre-charged after each compare circuit performs its comparison function, then the priority number in counter $2306_0$ is updated. Alternatively, if $COUNT_0$ is discharged by one of the compare circuits, then the priority number in counter $2306_0$ is updated. For other embodiments, $COUNT_0$ may be initially discharged to a logic low state, and counter 2306 updated if $COUNT_0$ remains discharged, or, alternatively, if $COUNT_0$ is charged to a logic one state by one of the compare circuits. For yet another embodiment, signal line 2318 may be segmented like control line segments 2312 between compare circuits, and the segmented signal line 2318 output from compare circuit $2310_{0,0}$ provided to counter logic circuit $2316_{0,0}$ as $COUNT_0$.

Figure 24:
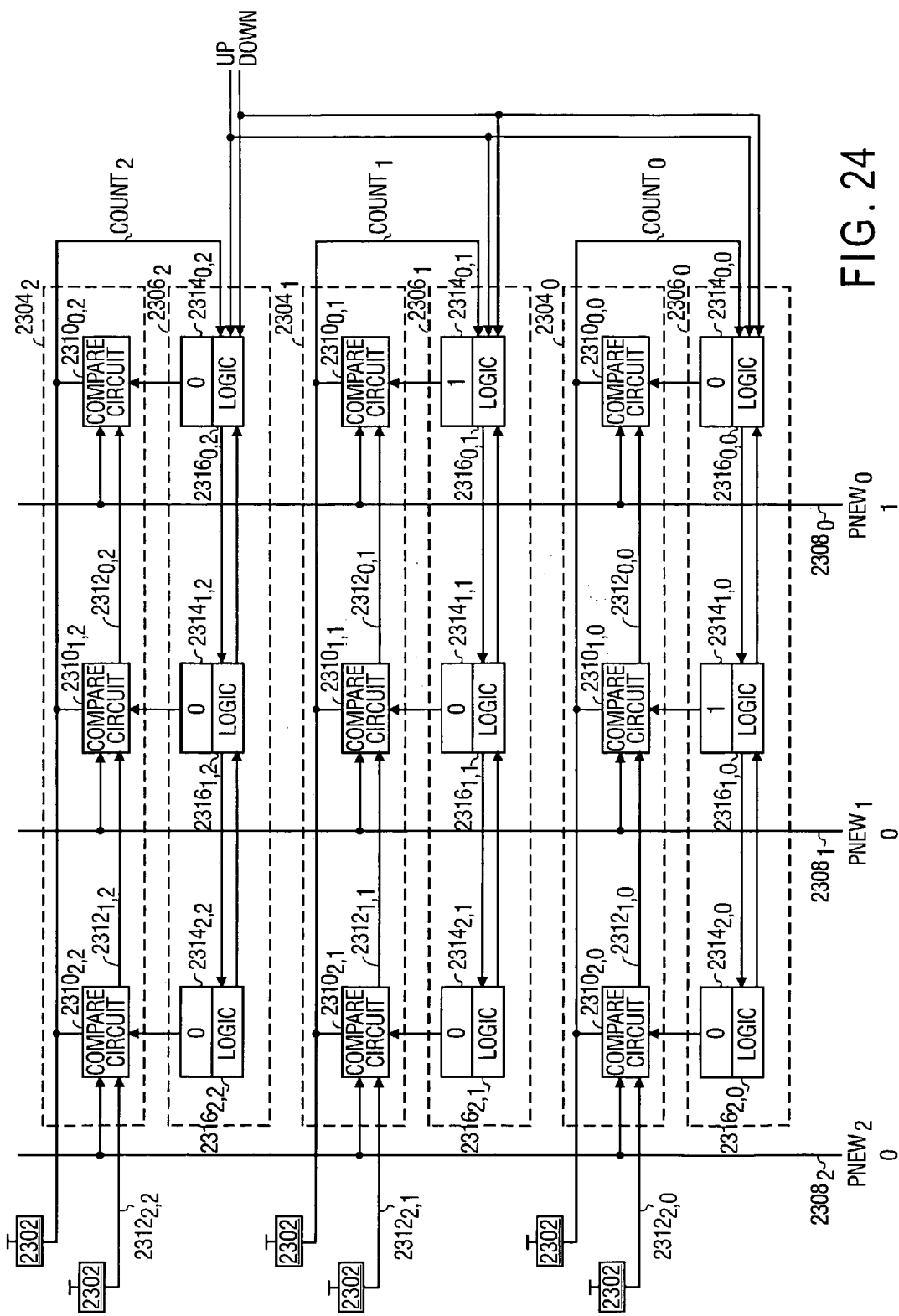
FIG. 24 is one example of determining whether a new number is greater than or equal to priority numbers stored in the priority memory of FIG. 17.

The operation of the embodiment of FIG. 23 can be illustrated with the example shown in FIG. 24. In this example, a 3×3 matrix of rows and columns stores three priority numbers. For other embodiments, any numbers of rows and columns can be used. Row 0 stores priority number 010 having the decimal equivalent of the number 2, row 1 stores priority number 001 having the decimal equivalent of the number 1, and row 2 stores priority number 000 having the decimal equivalent of the number 0. For this example, the priority numbers are assigned in ascending priority order such that 000 is the most significant priority number, 001 is the next most significant priority number, and 010 is the least significant priority number.

When a new policy statement having PNEW 001 is to be loaded into CAM array 604, inequality circuits $2304_2$–$2304_0$ compare PNEW with their corresponding priority numbers stored in counters $2306_2$–$2306_0$, respectively. Inequality circuit $2304_2$ determines that 000 is a higher priority than PNEW; inequality circuit $2304_1$ determines that 001 is equal to PNEW; and inequality circuit $2304_0$ determines that 010 is a lower priority than PNEW. Inequality circuit $2304_2$ leaves its priority number unchanged. Inequality circuits $2304_1$ and $2304_0$ cause counters $2306_1$ and $2306_0$ to increment by one their existing priority numbers such that they do not have the same priority number as PNEW. The new policy statement and PNEW can then be loaded into CAM array 604 and priority memory 608, respectively.

Inequality circuits $2304_1$ and $2304_0$ cause their corresponding counters $2306_1$ and $2306_0$ to be incremented as follows. The comparisons of the most significant bit $PNEW_2$ with the most significant bits stored in counters $2306_2$–$2306_0$ are resolved first. When an individual compare circuit determines that its corresponding memory storage element stores the same logic state as the PNEW bit, the compare circuit leaves the COUNT signal line unaffected, and drives the next control line segment to the same logical state of the previous control line segment. Since each of memory storage elements $2314_{2,2}$, $2314_{2,1}$, and $2314_{2,0}$ store a logic zero and $PNEW_2$ is a logic zero, $COUNT_2$, $COUNT_1$, and $COUNT_0$ remain unaffected. Additionally, control signals on control line segments $2312_{1,2}$, $2312_{1,1}$, and $2312_{1,0}$ are asserted to high logic states. The inequality circuits cannot yet determine, based on the most significant bits alone, whether PNEW is greater than or equal to any of the stored priority numbers.

The comparison of the next most significant bit $PNEW_1$ with priority number bits stored in memory elements $2314_{1,0}$, $2314_{1,1}$, and $2314_{1,2}$ is then resolved. Since memory elements $2314_{1,2}$ and $2314_{1,1}$ store the same logic states as $PNEW_1$, $COUNT_2$ and $COUNT_1$ remain unaffected, and control signals on control line segments $2312_{0,2}$ and $2310_{0,1}$ are asserted to high logic states. Compare circuit $2310_{1,0}$, however, determines that the priority number stored in counter $2306_0$ is greater than PNEW because: (1) memory element $2314_{1,0}$ stores a logic one; (2) the control signal is high on control line segment $2312_{1,0}$; and (3) $PNEW_1$ is a logic zero on signal line $2308_1$. When compare circuit $2310_{1,0}$ makes this determination, it leaves $COUNT_0$ unaffected so that it will remain pre-charged to update the priority number stored in counter $2306_0$. Additionally, compare circuit $2310_{1,0}$ asserts the control signal on control line segment $2312_{0,0}$ to a low logic state. When the control signal on control line segment $2310_{0,0}$ is low, the control signals on all subsequent control line segments are also asserted to low logic states. When the control signals are low, all lower priority compare circuits are rendered incapable of discharging $COUNT_0$ regardless of what is stored in their corresponding memory elements, and regardless of the logical states of the subsequent PNEW bits. For example, $2310_{0,0}$ will be rendered incapable of discharging $COUNT_0$ even though $PNEW_0$, a logic one, is greater than the logic zero stored in memory element $2314_{0,0}$.

Lastly, the comparison of the least significant bit $PNEW_0$ with priority number bits stored in memory elements $2314_{0,0}$, $2314_{0,1}$ and $2314_{0,2}$ is resolved. As indicated above, inequality circuit $2304_0$ has already determined that 010 is greater than 001 and thus $COUNT_0$ remains pre-charged to update the priority number stored in counter $2306_0$. Since the control signal on control line segment $2312_{0,1}$ is high, compare circuit $2310_{0,1}$ compares the logic one stored in memory element $2314_{0,1}$ with the logic one of $PNEW_0$ and determines that PNEW is the same number as that stored in counter $2306_1$. In response, $COUNT_1$ remains in a pre-charged state to update the priority number stored in counter $2306_1$. Compare circuit $2310_{0,2}$, however, determines that $PNEW_0$ is greater than the logic zero stored in memory element $2314_{0,2}$. Since the control signal is high on control line segment $2312_{0,2}$, compare circuit $2310_{0,2}$ discharges $COUNT_2$ such that the priority number 000 stored in counter $2306_2$ will not be updated. After a sufficient amount of time has passed such that all of the bit comparisons have had time to resolve, the UP signal can be asserted such that the priority numbers in counters $2306_1$ and $2306_0$ are incremented. For one embodiment, the COUNT signals can be latched prior to providing the UP signal.

Any compare circuits may be used for compare circuits 2310 to implement the process illustrated above. Table 3 shows one example of a truth table for implementing each compare circuit 2310, where X (column) and Y (row) are any integers. Other truth tables may be used (and corresponding logic generated accordingly) including those that logically complement one or more of the signals indicated in Table 3.

TABLE 3

| PNEW$_X$ | 2314$_{X,Y}$ | 2312$_{X,Y}$ | 2312$_{X-1,Y}$ | COUNT |
|---|---|---|---|---|
| 0 | 0 | 0 | 0 | COUNT |
| 0 | 0 | 1 | 1 | COUNT |
| 0 | 1 | 0 | 0 | COUNT |
| 0 | 1 | 1 | 0 | COUNT |
| 1 | 0 | 0 | 0 | COUNT |
| 1 | 0 | 1 | 1 | 0 |
| 1 | 1 | 0 | 0 | COUNT |
| 1 | 1 | 1 | 1 | COUNT |

Figure 25A:
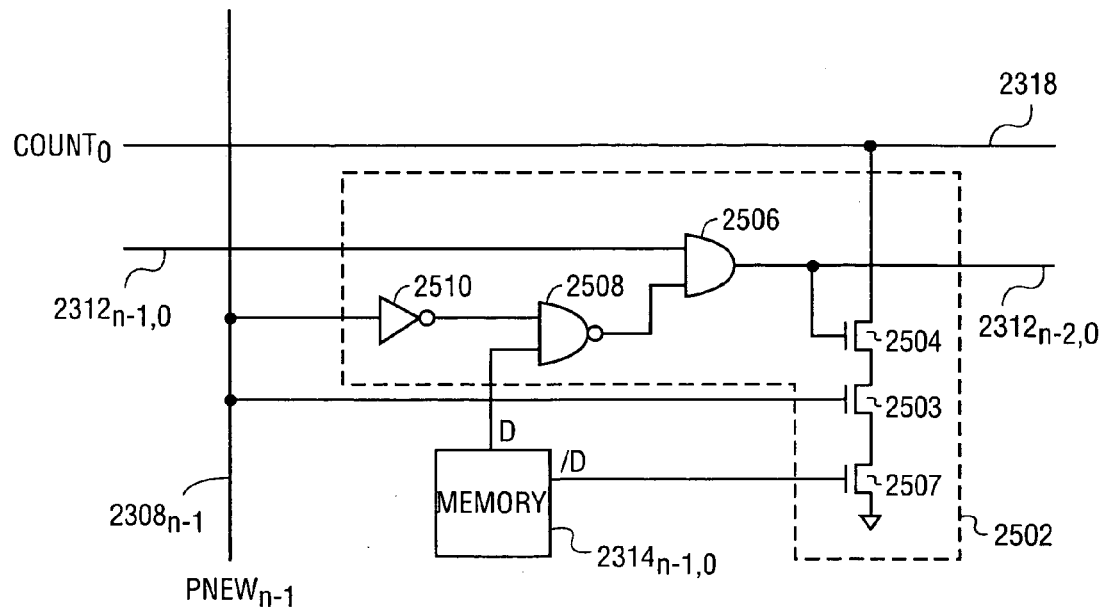
FIG. 25A is one embodiment of a compare circuit of FIG. 24.

Any logic or circuitry may be used to implement the truth table of Table 3. FIG. 25A shows compare circuit 2502 that is one embodiment of compare circuit 2310$_{n-1,0}$ for implementing the truth table of Table 3. The embodiment of FIG. 25A may be used to implement all of the compare circuits 2310.

Compare circuit 2502 includes inverter 2510, NAND gate 2508, AND gate 2506, and n-channel transistors 2504, 2503, and 2507. NAND gate 2508 has one input coupled to signal line 2308$_{n-1}$ via inverter 2510, and another input coupled to receive the data (D) stored in memory element 2314$_{n-1,0}$. AND gate 2506 has one input coupled to the output of NAND gate 2508, another input coupled to control line segment 2312$_{n-1,0}$, and an output coupled to control line segment 2312$_{n-2,0}$. Transistor 2504 has its drain coupled to the signal line 2318, its gate coupled to the output of AND gate 2506, and its source coupled to the drain of transistor 2503. Transistor 2503 also has its gate controlled by signal line 2308$_{n-1}$, and its source coupled to the drain of transistor 2507. Transistor 2507 also has its gate coupled to receive /D from memory 2314$_{n-1,0}$, and its source coupled to ground.

Figure 25B:
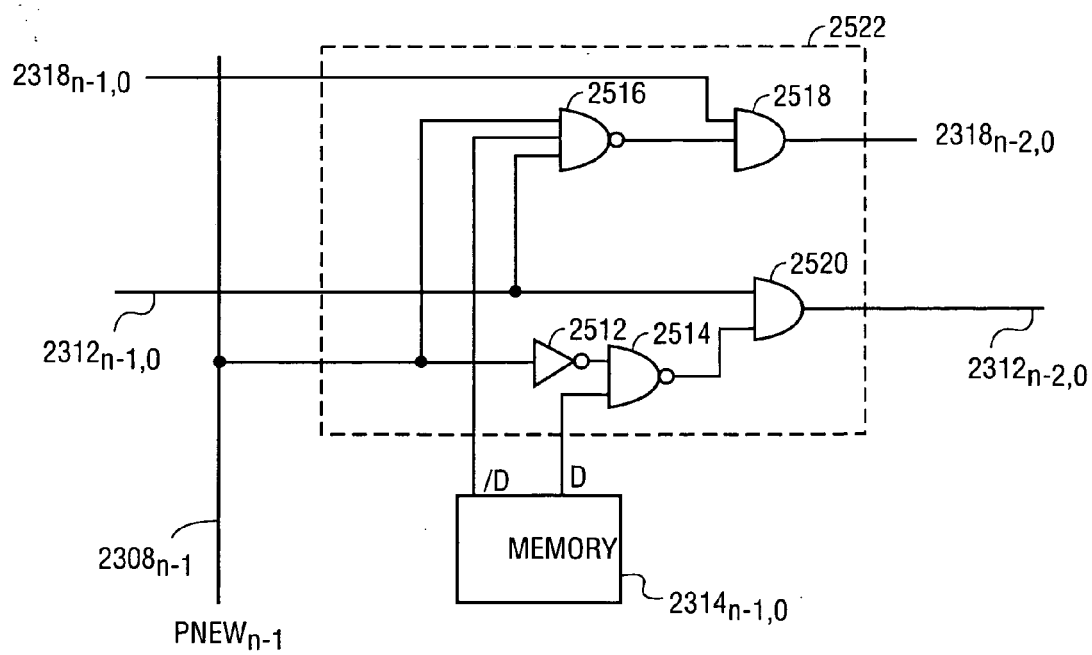
FIG. 25B is another embodiment of a compare circuit of FIG. 24.

FIG. 25B shows compare circuit 2522 that is another embodiment of compare circuit 2310$_{n-1,0}$ for implementing the truth table of Table 3. In this embodiment, signal line 2318 is segmented into separate control line segments. The embodiment of FIG. 25B may be used to implement all of the compare circuits 2310.

Compare circuit 2522 includes inverter 2512, NAND gates 2514 and 2516, and AND gates 2518 and 2520. NAND gate 2514 has one input coupled to signal line 2308$_{n-1}$ via inverter 2512, and another input coupled to D of memory 2314$_{n-1,0}$. AND gate 2520 has one input coupled to control line segment 2312$_{n-1,0}$, another input coupled to the output of NAND gate 2514, and an output coupled to control line segment 2312$_{n-2,0}$. NAND gate 2516 has a first input coupled to control line segment 2312$_{n-1,0}$, a second input coupled to /D of memory 2314$_{n-1,0}$, and a third input coupled to signal line 2308$_{n-1}$. AND gate 2518 has a first input coupled to count line segment 2318$_{n-1,0}$, a second input coupled to the output of NAND gate 2516, and an output coupled to count line segment 2318$_{n-2,0}$.

Figure 26:
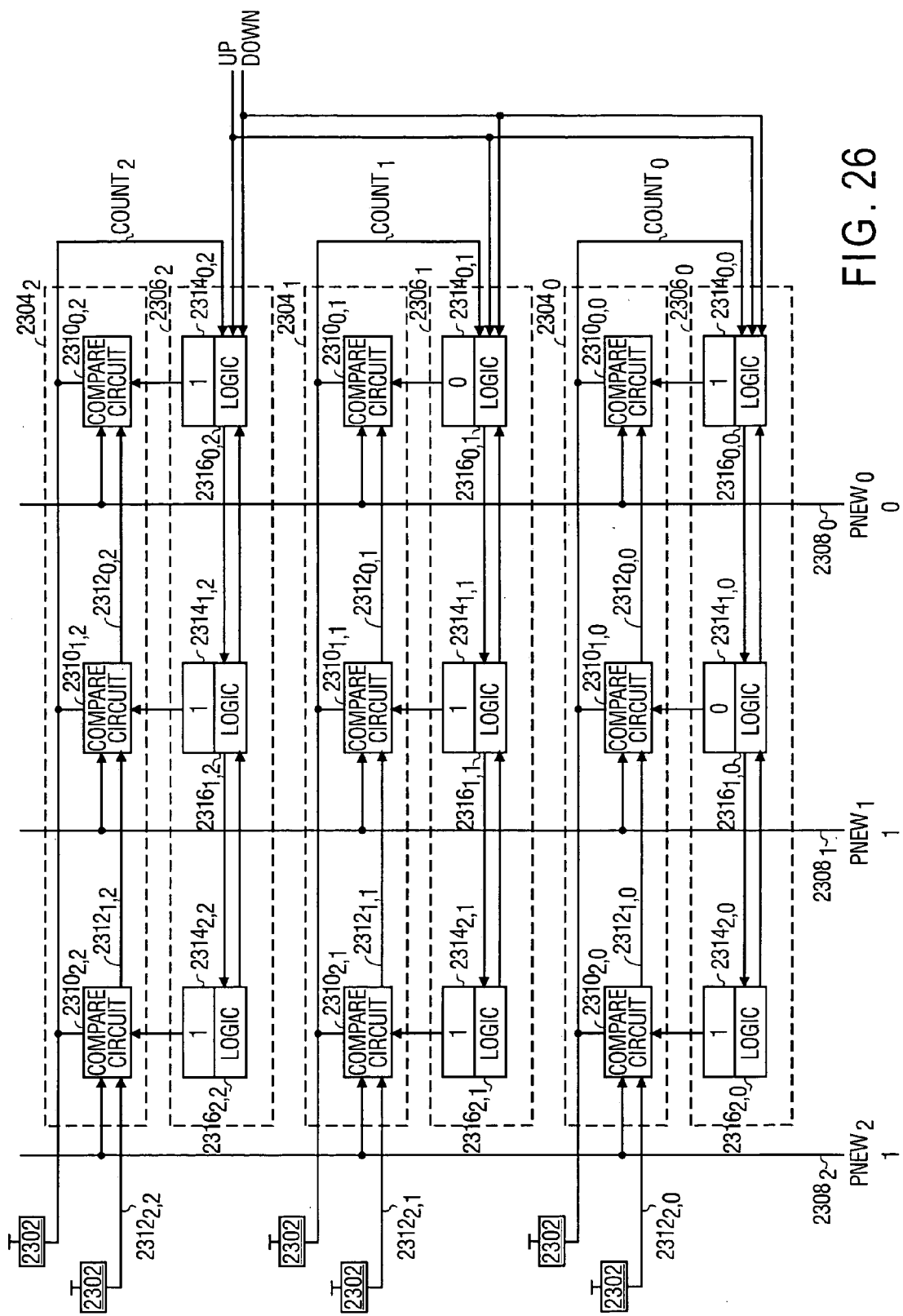
FIG. 26 is one example of determining whether a new number is less than or equal to priority numbers stored in the priority memory of FIG. 17.

For the example described above with respect to FIG. 24, the most significant number is the lowest number such that 000 is the most significant number between 000, 001, and 010. For another embodiment, the priority numbers are assigned in descending priority order such that the most significant priority number is the priority number with the highest numerical value, and the least significant priority number is the priority number with the lowest numerical value. FIG. 26 shows such an example in which the 3×3 matrix of FIG. 24 includes the binary priority number 111 (decimal equivalent of 7) stored in counter 2306$_2$, priority number 110 (decimal equivalent of 6) stored in counter 2306$_1$, and priority number 101 (decimal equivalent of 5) stored in counter 2306$_0$. Numbers 7, 6, and 5 are stored in rows 2, 1, and 0, respectively. In this example, 111 is the most significant priority number, 110 is the next most significant priority number, and 101 is the least significant priority number.

When a new policy statement having PNEW 110 is to be loaded into CAM array 604, the logical complement of PNEW (i.e., 001) is provided to signal lines 2308$_2$–2308$_0$. Inequality circuits 2304$_2$–2304$_0$ compare PNEW with their corresponding priority numbers stored in counters 2306$_2$–2306$_0$, respectively. Inequality circuit 2304$_2$ determines that 111 is a higher priority than PNEW; inequality circuit 2304$_1$ determines that 110 is equal to PNEW; and inequality circuit 2304$_0$ determines that 101 is a lower priority than PNEW. Inequality circuit 2304$_2$ leaves its priority number unchanged. Inequality circuits 2304$_{0,1}$ and 2304$_{0,0}$ each cause their corresponding counters 2306$_1$ and 2306$_0$ to decrement by one their existing priority numbers such that they do not have the same priority number as PNEW. The new policy statement and PNEW can then be loaded into CAM array 604 and priority memory 604, respectively.

Inequality circuits 2304$_1$ and 2304$_0$ cause their corresponding counters 2306$_1$ and 2306$_0$ to be decremented as follows. The comparisons of the most significant bit PNEW$_2$ with the most significant bits stored in counters 2306$_2$–2306$_0$ are resolved first. When an individual compare circuit determines that its corresponding memory storage element stores the same logic state as the PNEW bit, the compare circuit leaves the COUNT signal line unaffected, and drives the next control line segment to the same logical state of the previous control line segment. Since each of memory storage elements 2314$_{2,2}$, 2314$_{2,1}$, and 2314$_{2,0}$ store a logic one and PNEW$_2$ is a logic one, COUNT$_2$, COUNT$_1$, and COUNT$_0$ remain unaffected. Additionally, control signals on control line segments 2312$_{1,2}$, 2312$_{1,1}$, and 2312$_{1,0}$ are asserted to high logic states. The inequality circuits cannot yet determine, based on the most significant bits alone, whether PNEW is less than or equal to any of the stored priority numbers.

The comparison of the next most significant bit PNEW$_1$ with priority number bits stored in memory elements 2314$_{1,0}$, 2314$_{1,1}$ and 2314$_{1,2}$ is then resolved. Since memory elements 2314$_{1,2}$ and 2314$_{1,1}$ store the same logic states as PNEW$_1$, COUNT$_2$ and COUNT$_1$ remain unaffected, and control signals on control line segments 2312$_{0,2}$ and 2310$_{0,1}$ are asserted to high logic states. Compare circuit 2310$_{1,0}$, however, determines that the priority number stored in counter 2306$_0$ is less than PNEW because: (1) memory element 2314$_{1,0}$ stores a logic zero; (2) the control signal is high on control line segment 2312$_{1,0}$; and (3) PNEW$_1$ is a logic one. When compare circuit 2310$_{1,0}$ makes this determination, it leaves COUNT$_0$ unaffected so that it will remain pre-charged to update the priority number stored in counter 2306$_0$. Additionally, compare circuit 2310$_{1,0}$ asserts the control signal on control line segment 2312$_{0,0}$ to a low logic state. When the control signal on control line segment 2310$_{0,0}$ is low, the control signals on all subsequent control line segments are also asserted to low logic states. When the control signals are low, all lower priority compare circuits are rendered incapable of discharging COUNT$_0$ regardless of what is stored in their corresponding memory elements, and regardless of the logical states of the subsequent PNEW bits. For example, 2310$_{0,0}$ will be rendered incapable of discharging COUNT$_0$ even though PNEW$_0$, a logic zero, is less than the logic one stored in memory element 2314$_{0,0}$.

Lastly, the comparison of the least significant bit $PNEW_0$ with priority number bits stored in memory elements $2314_{0,2}$, $2314_{0,1}$ and $2314_{0,0}$ is resolved. As indicated above, inequality circuit $2304_0$ has already determined that 101 is less than 110 and thus $COUNT_0$ remains pre-charged to update the priority number stored in counter $2306_0$. Since the control signal on control line segment $2312_{0,1}$ is high, compare circuit $2310_{0,1}$ compares the logic zero stored in memory element $2314_{0,1}$ with the logic one on line $2308_0$ and determines that PNEW is the same number as that stored in counter $2306_1$. In response, $COUNT_1$ remains in a pre-charged state to update the priority number stored in counter $2306_1$. Compare circuit $2310_{0,2}$, however, determines that $PNEW_0$ is less than the logical one stored in memory element $2314_{0,2}$. Since the control signal is high on control line segment $2312_{0,2}$, compare circuit $2310_{0,2}$ discharges $COUNT_2$ such that the priority number 111 stored in counter $2306_2$ will not be updated. After a sufficient amount of time has passed such that all of the bit comparisons have had time to resolve, the DOWN signal can be asserted such that the priority numbers in counters $2306_1$ and $2306_0$ are decremented. For one embodiment, the COUNT signals can be latched prior to providing the DOWN signal.

Any compare circuits may be used for compare circuits 2310 to implement the process illustrated above. Table 4 shows one example of a truth table for implementing each compare circuit 2310, where X (column) and Y (row) are any integers. Other truth tables may be used (and corresponding logic generated accordingly) including those that logically complement one or more of the signals indicated in Table 4.

TABLE 4

| $PNEW_X$ | $2314_{X,Y}$ | $2312_{X,Y}$ | $2312_{X-1,Y}$ | COUNT |
|---|---|---|---|---|
| 0 | 0 | 0 | 0 | COUNT |
| 0 | 0 | 1 | 1 | COUNT |
| 0 | 1 | 0 | 0 | COUNT |
| 0 | 1 | 1 | 1 | 0 |
| 1 | 0 | 0 | 0 | COUNT |
| 1 | 0 | 1 | 0 | COUNT |
| 1 | 1 | 0 | 0 | COUNT |
| 1 | 1 | 1 | 1 | COUNT |

Figure 27A:
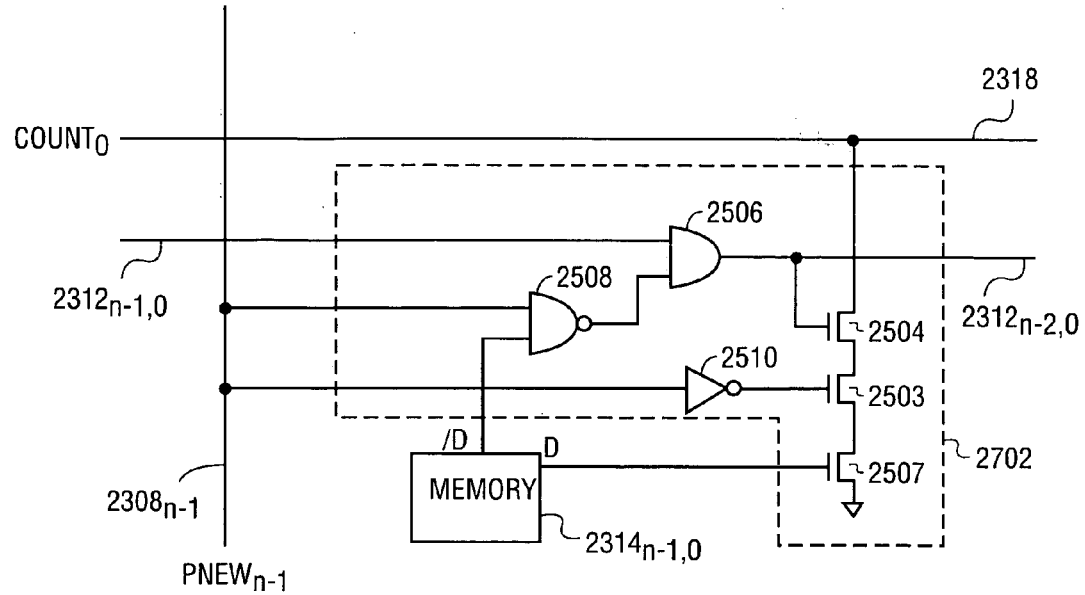
FIG. 27A is one embodiment of a compare circuit of FIG. 26.

Any logic or circuitry may be used to implement the truth table of Table 4. FIG. 27A shows compare circuit 2702 that is one embodiment of compare circuit $2310_{n-1,0}$ for implementing the truth table of Table 4. The embodiment of FIG. 27A may be used to implement all of the compare circuits 2310.

Compare circuit 2702 includes inverter 2510, NAND gate 2508, AND gate 2506, and n-channel transistors 2504, 2503, and 2507 as in FIG. 25A. NAND gate 2508 has one input coupled to signal line $2308_{n-1}$, and another input coupled to receive the /D stored in memory element $2314_{n-1,0}$. AND gate has one input coupled to the output of NAND gate 2508, another input coupled to control line segment $2312_{n-1,0}$, and an output coupled to control line segment $2312_{n-2,0}$. Transistor 2504 has its drain coupled to the signal line 2318, its gate coupled to the output of AND gate 2506, and its source coupled to the drain of transistor 2503. Transistor 2503 also has its gate controlled by signal line $2308_{n-1}$ via inverter 2510, and its source coupled to the drain of transistor 2507. Transistor 2507 also has its gate coupled to receive D from memory $2314_{n-1,0}$, and its source coupled to ground.

Figure 27B:
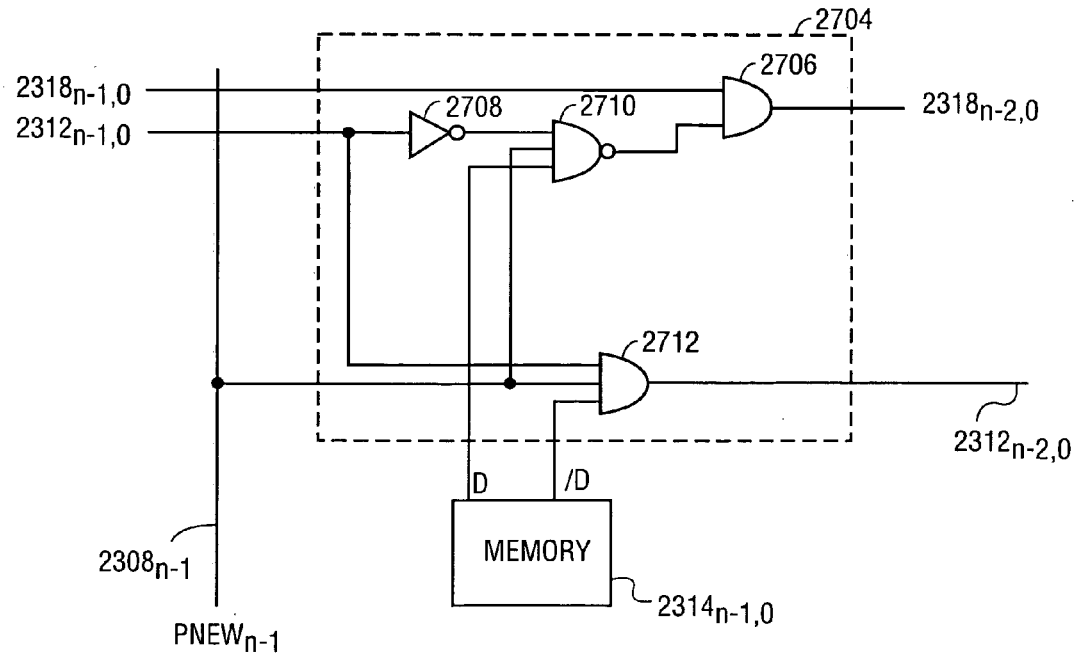
FIG. 27B is another embodiment of a compare circuit of FIG. 26.

FIG. 27B shows compare circuit 2704 that is another embodiment of compare circuit $2310_{n-1,0}$ for implementing the truth table of Table 4. In this embodiment, signal line 2318 is segmented into separate control line segments. The embodiment of FIG. 27B may be used to implement all of the compare circuits 2310.

Compare circuit 2704 includes inverter 2708, NAND gate 2710, and AND gates 2706 and 2712. NAND gate 2710 has a first input coupled to signal line $2308_{n-1}$, a second input coupled to D of memory $2314_{n-1,0}$, and a third input coupled to control line segment $2312_{n-1,0}$ via inverter 2708. AND gate 2706 has one input coupled to count line segment $2318_{n-1,0}$, another input coupled to the output of NAND gate 2710, and an output coupled to count line segment $2318_{n-2,0}$. AND gate 2712 has a first input coupled to control line segment $2312_{n-1,0}$, a second input coupled to /D of memory $2314_{n-1,0}$, a third input coupled to signal line $2308_{n-1}$, and an output coupled to control line segment $2312_{n-2,0}$.

The embodiments of FIGS. 17–27 show that a new policy statement having a priority greater than or equal to an existing policy statement, can be added to the DSP without having to physically reorder or reload the CAM array storing the policy statements, or the memory storing the priority numbers. Instead, inequality circuits update the appropriate existing priority numbers. Since the updating function can be performed without the need to physically reorder or reload the policy statements in the CAM array, or to physically reorder or reload the priority numbers in the priority index table, this can reduce the hardware and/or software needed for table management of the CAM array, and can increase the performance of a router incorporating the DSP.

Policy statements may also be deleted from CAM array 604 using priority index table 606 of FIG. 17. When a policy statement is deleted, the corresponding priority number in priority memory 608 is also deleted. The policy statements and priority numbers can be deleted by setting one or more valid bits to an appropriate state for the row of CAM array 604 that stores the policy statement to be deleted. The valid bit(s) may be stored in CAM array 604, priority memory 608, or in each of the memory arrays.

When a priority number is deleted, the remaining priority numbers in priority memory 608 can be left unchanged. This may leave gaps in the priority numbers stored in the priority memory. These gaps may be filled in by new priority numbers associated with new policy statements to be added to the DSP, or they may remain as unused gaps. For another embodiment, remaining priority numbers in the priority memory can be updated by the inequality and counter circuits. If the priority numbers are assigned in ascending priority order, and one of the priority numbers is deleted or invalidated, then any other priority numbers that are greater than the deleted number can be decremented by the inequality circuits. For example, if priority memory 608 stores priority numbers 0, 1, and 2, and priority number 1 is invalidated, then priority number 2 can be decremented to 1. Similarly, if the priority numbers are assigned in descending priority order, and one of the priority numbers is deleted or invalidated, then any other priority numbers that are less than the deleted number can be incremented by the inequality and counter circuits. For example, if priority memory 608 stores priority numbers 0, 1, and 2, and priority number 1 is invalidated, then priority number 0 can be incremented to 1. Updating the priority numbers can help to avoid unused gaps in priority memory 608.

Figure 28:
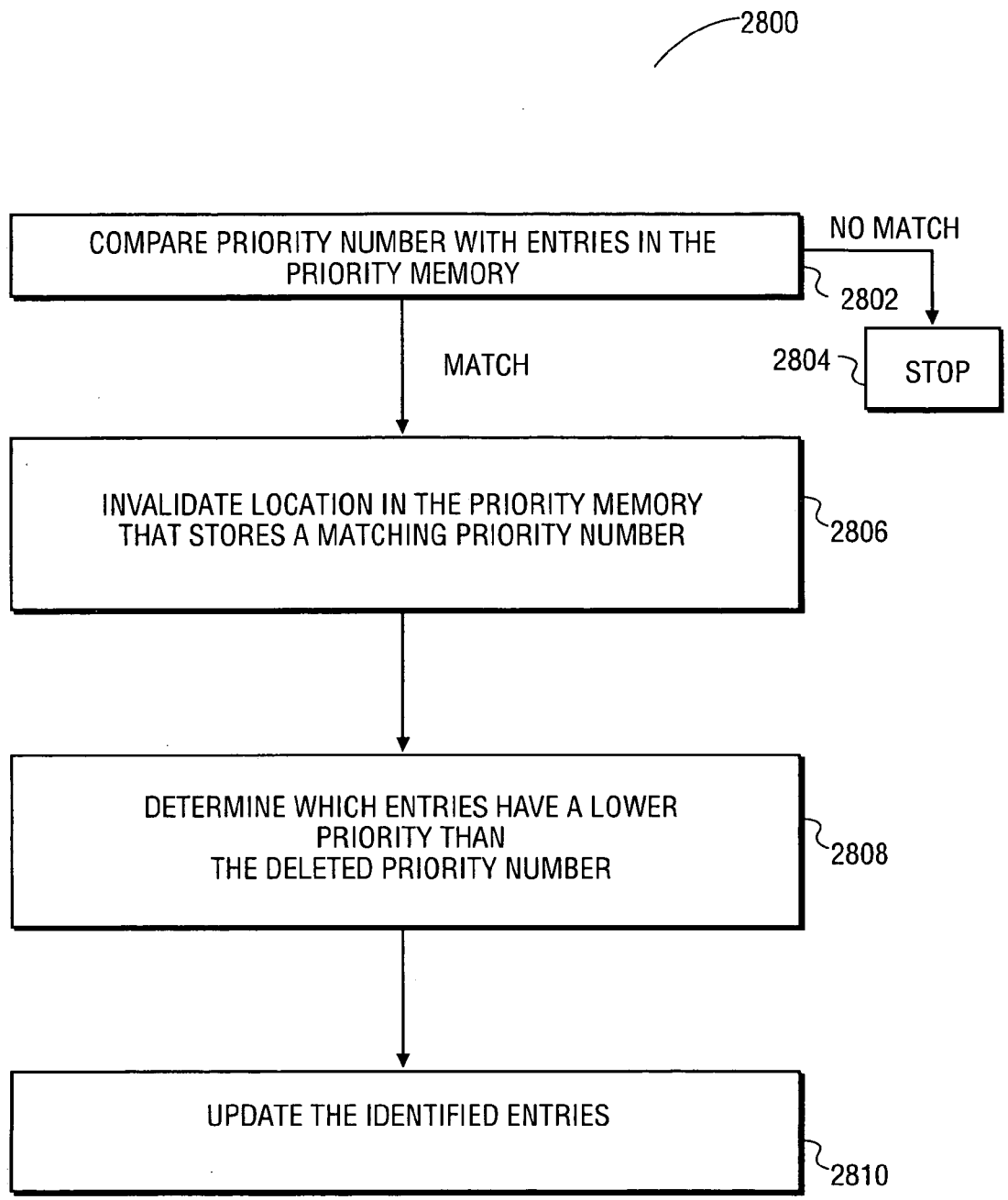
FIG. 28 is one embodiment of a process of deleting or invalidating policy statements and their associated priority numbers from the digital signal processor of FIG. 17.

FIG. 28 shows one embodiment of a process 2800 for deleting or invalidating policy statements and their associated priority numbers. At step 2802, the priority number to be deleted is compared with the entries in the priority memory. For this embodiment, priority memory 608 is a CAM, or has one or more compare circuits external to the memory to perform the comparison. For an alternative embodiment, step 2802 may compare the policy statement with the existing entries in CAM array 604. For this embodiment, priority memory 608 may not be a CAM.

If there is no match at step 2802, the process stops at step 2804. The process could also stop if there was more than one match, and an error flag such as a multiple match flag may be asserted. Alternatively, the process may continue to delete all identified matches. If there is a match, both the policy statement and the priority number are invalidated or deleted at step 2806. As described above, this may be accomplished by setting a valid bit(s) to an appropriate state for that row in priority memory 608. If the valid bit(s) is located in CAM array 604, and is inaccessible by priority memory 608, then priority logic 610 can then identify the location of the matching entry (as described above), and provide the indication to $IAD_0$–$IAD_{N-1}$. These signal lines can then be provided through encoder 612 back to CAM array 604 (e.g., through a decoder) to address the appropriate location and invalidate the policy statement. Alternatively, the signal lines $IAD_0$–$IAD_{N-1}$ can be provided directly to CAM array 604 to access the appropriate location for invalidation.

The process may stop after step 2806 and potentially leave gaps in the priority numbers. Alternatively, the process may proceed to step 2808 to update the remaining entries in the priority memory. When the process continues, the deleted priority number is provided to the inequality circuits $1704_0$–$1704_{N-1}$, at step 2808, to determine which entries in the priority memory have a lower priority than the deleted priority number. The inequality and counter circuits may then update the identified numbers, at step 2810, as previously described.

Figure 29:
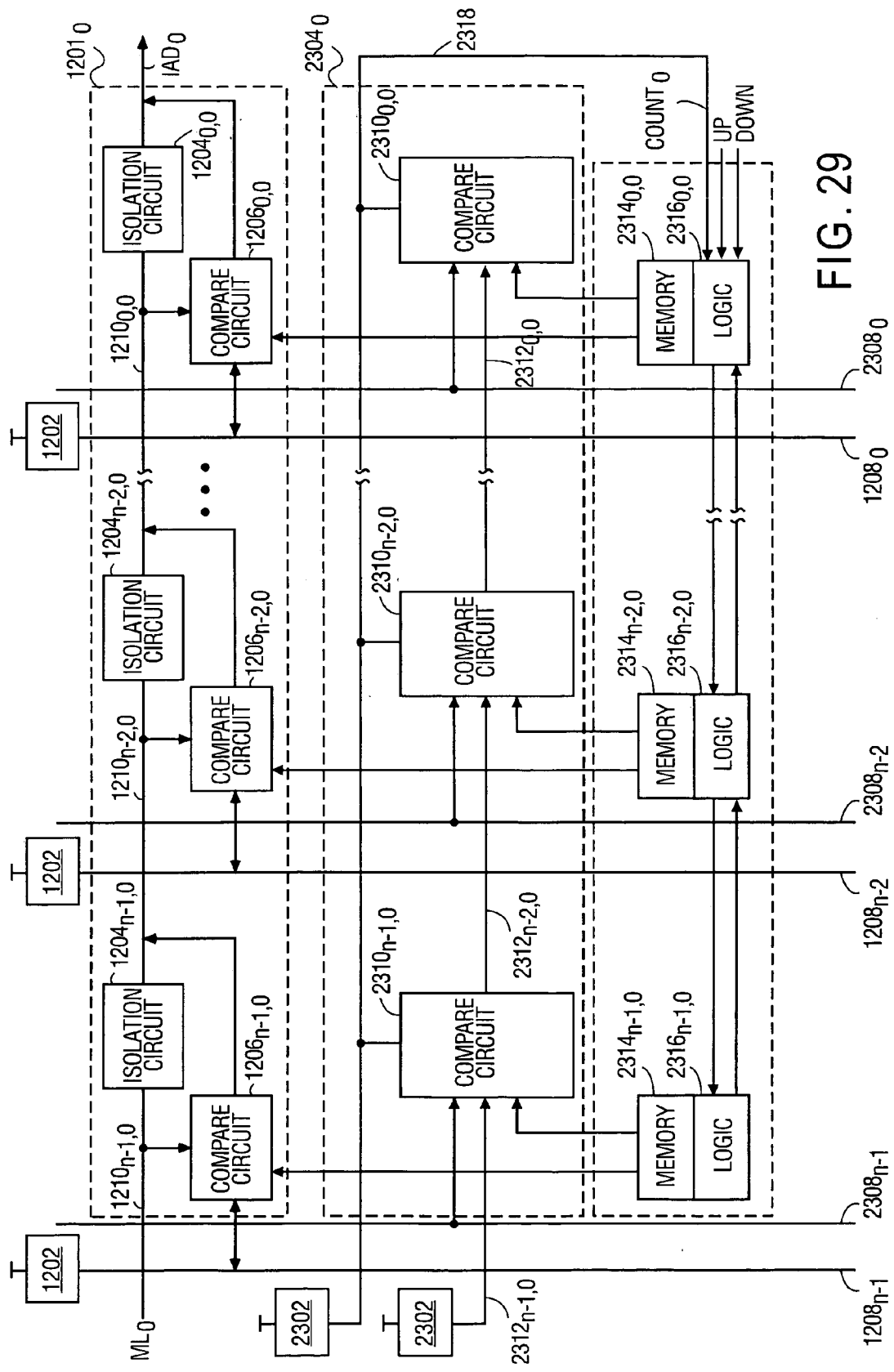
FIG. 29 is one embodiment of priority index table of FIG. 17.

The delete functions illustrate one example of the DSP 602 utilizing both the inequality circuits and the priority logic to operate on the priority numbers stored in priority memory 608. FIG. 29 shows one example of combining an inequality circuit with a priority logic circuit into a single array such that each circuit operates on the priority numbers on a bit-by-bit basis. The embodiment of FIG. 29 combines row $1201_0$ of priority logic elements from FIG. 12A with inequality circuit $2304_0$ and counter $2306_0$ of FIG. 23 to form row zero in priority index table 606 of FIG. 17. For an alternative embodiment, row $1201_0$ from FIG. 12B may also be used. The priority logic elements and inequality circuits share memory elements $2314_{0,0}$–$2314_{n-1,0}$. Memory elements $2314_{0,0}$–$2314_{n-1,0}$ also correspond to memory elements $1102_{0,0}$–$1102_{n-1,0}$. Conventional bit lines, word lines, read and write circuits, and optional comparand data lines and match lines (i.e., when memory elements $2314_{0,0}$–$2314_{n-1,0}$ are CAM cells) are not shown so as not to obscure the teachings of the figure.

Figure 30:
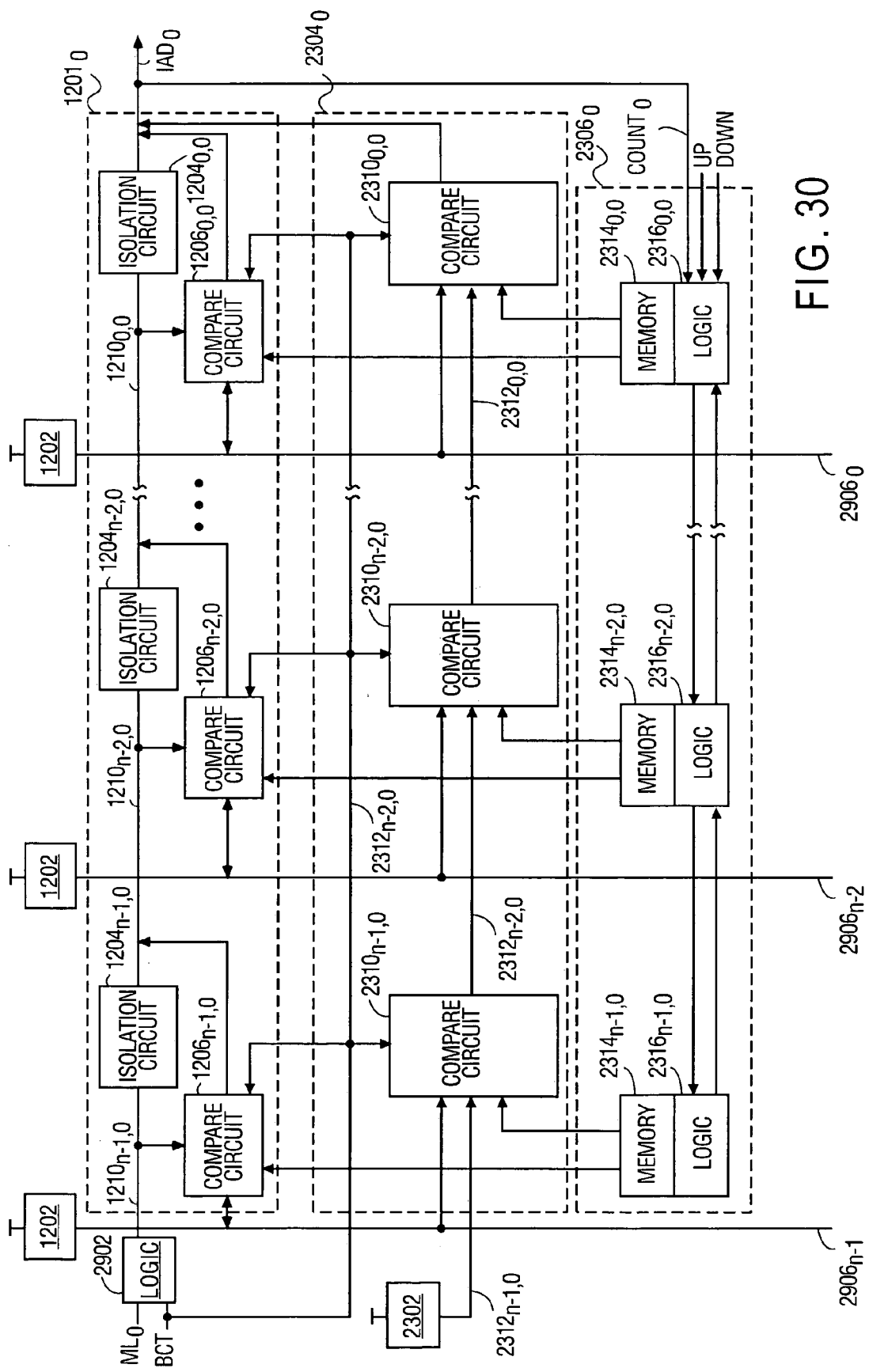
FIG. 30 is another embodiment of priority index table of FIG. 17.

FIG. 30 shows another embodiment of combining the row $1201_0$ of priority logic elements from FIG. 12A with the inequality circuit $2304_0$ of FIG. 23 to form row zero in priority index table 1706 of FIG. 17. In this embodiment, signal lines $1208_{n-1}$–$1208_0$ and $2308_{n-1}$–$2308_0$ are replaced with a single set of signal lines $2906_{n-1}$–$2906_0$ that can be used to determine the most significant priority number PNUM, or used to carry PNEW. Also, for this embodiment, match line segments $1210_{n-1,0}$–$1210_{0,0}$ serve a dual function to operate as match line segments when determining the most significant priority number, and as control line segments (i.e., $2312_{n-1,0}$–$2312_{0,0}$ of FIG. 23) to generate $COUNT_0$ when determining when a new priority number has a priority that is greater than or equal to the priority number stored in counter 2306. Thus, compare circuit $2310_{n-1,0}$ is coupled to match line segment $1210_{n-2,0}$, compare circuit $2310_{n-2,0}$ is coupled to match line segment $1210_{n-3,0}$, and so forth, and $COUNT_0$ is provided on signal line $IAD_0$. For an alternative embodiment, compare circuits 2310 may provide control signals to isolation circuits 1204 instead of directly controlling the match line segments.

A control signal BCT indicates whether the priority index table uses the row of priority logic elements $1201_0$ to determine the most significant priority number in priority memory 608, or whether the priority index table uses the inequality circuit $2304_0$ to determine if a new priority number has a priority that is greater than or equal to the priority number stored in counter 2306. BCT may be provided by an instruction decoder in DSP 602 that interprets and decodes instructions provided to the DSP. When BCT is a low logic state, the priority logic elements perform their priority function; and when BCT is a high logic state, the inequality circuits perform their inequality function. Thus, when BCT is low, compare circuit $1206_{n-1,0}$ is enabled, compare circuit $2310_{n-1,0}$ is disabled, and logic 2902 provides the state of $ML_0$ to match line segment $1210_{n-1,0}$. When BCT is high, compare circuit $1206_{n-1,0}$ is disabled, compare circuit $2310_{n-1,0}$ is enabled, and logic 2902 drives match line segment $1210_{n-1,0}$ to a high logic state such that match line segments $1210_{n-1,0}$–$1210_{0,0}$ function as control line segments $2312_{n-1,0}$–$2312_{0,0}$ of FIG. 23. Logic 2902 may be any logic that performs this function.

For another embodiment of FIG. 30, row $1201_0$ of priority logic elements from FIG. 12B may be combined with the inequality circuit $2304_0$ of FIG. 23 to form row zero in priority index table 1706 of FIG. 17.

The logic and circuitry for implementing the priority logic elements and the inequality circuits illustrated in FIGS. 29 and 30 may be those that implement the truth tables shown in Tables 1, 2, 3, and 4 above. For example, the logic and circuits illustrated in FIGS. 14, 15, 25A, 25B, 27A, and 27B may be used.

For one embodiment, the priority numbers are assigned in ascending priority order in priority memory 608. For this embodiment, logic and circuitry that implements the truth table shown in Table 1 (e.g., the logic and circuitry of FIG. 14 or 15) may be used for the priority logic elements to determine the lowest priority number as the most significant priority number. Also for this embodiment, the logic and circuitry shown in the truth table shown in Table 3 (e.g., the logic and circuitry of FIG. 25A or 25B) may be used for the inequality circuits to determine if a new priority number has a priority that is greater than or equal to the priority number stored in counter 2306.

Figure 31:
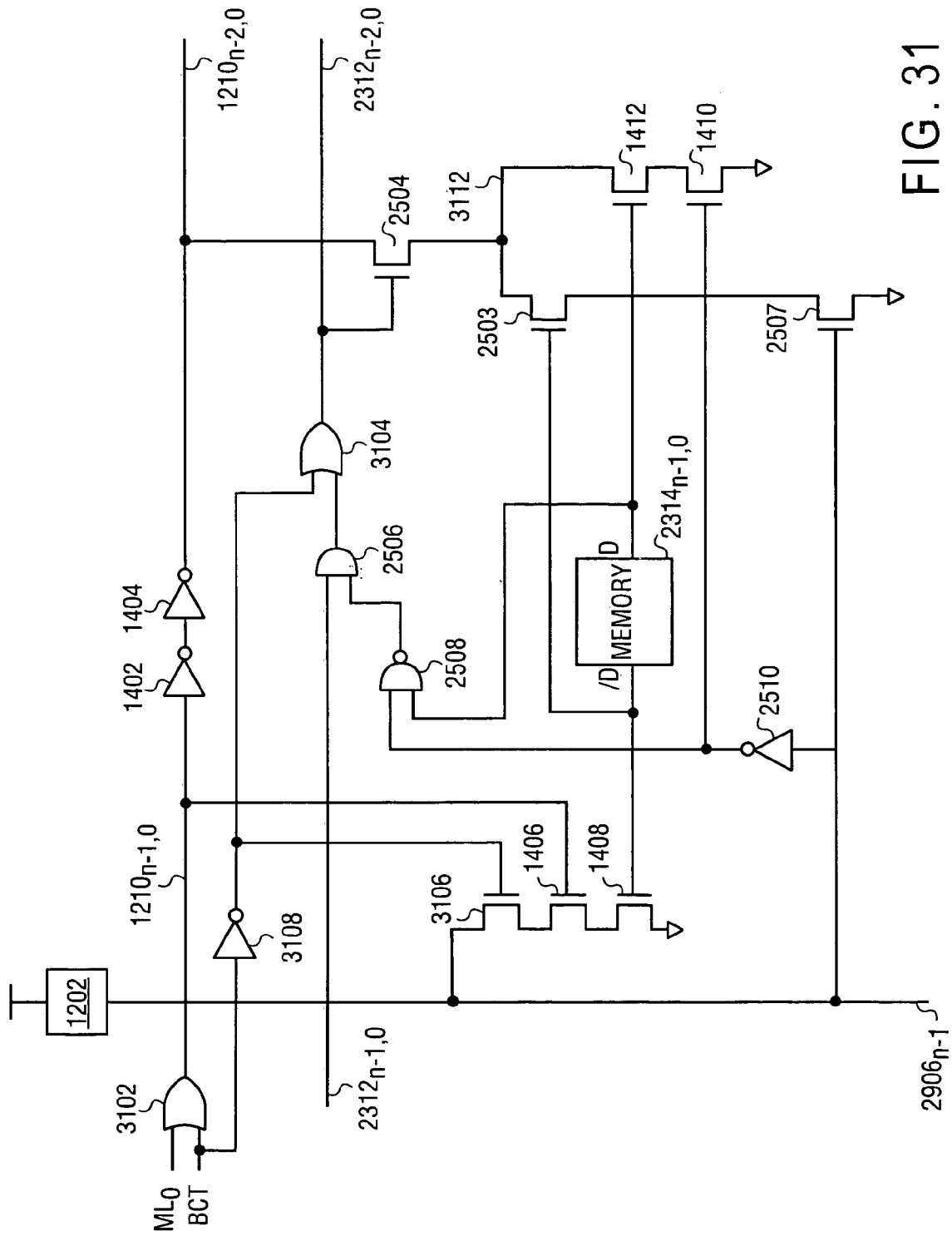
FIG. 31 is one embodiment of an inequality circuit element, a priority logic element and a memory element of FIG. 17.

FIG. 31 shows one example of combining the logic and circuitry of FIGS. 14 and 25 to implement the embodiment of FIG. 30 when the priority numbers are assigned in ascending priority order in priority memory 608. For this example, OR gate 3102 is one embodiment of logic 2902. OR gate 3102 has one input coupled to $ML_0$, and another input coupled to BCT. BCT is also coupled to the gate of n-channel transistor 3106 and one input of OR gate 3104 via inverter 3108. Transistor 3106 has its drain coupled to signal line $2906_{n-1}$, and its source coupled to the drain of transistor 1406. OR gate 3104 has another input coupled to the output of AND gate 2506, and has its output coupled to the gate of transistor 2504. Transistor 2504 is coupled between line segment $1210_{n-2,0}$ and node 3112. Transistor pairs 1410/1412 and 2503/2507 are each coupled in series between node 3112 and ground.

Figure 32:
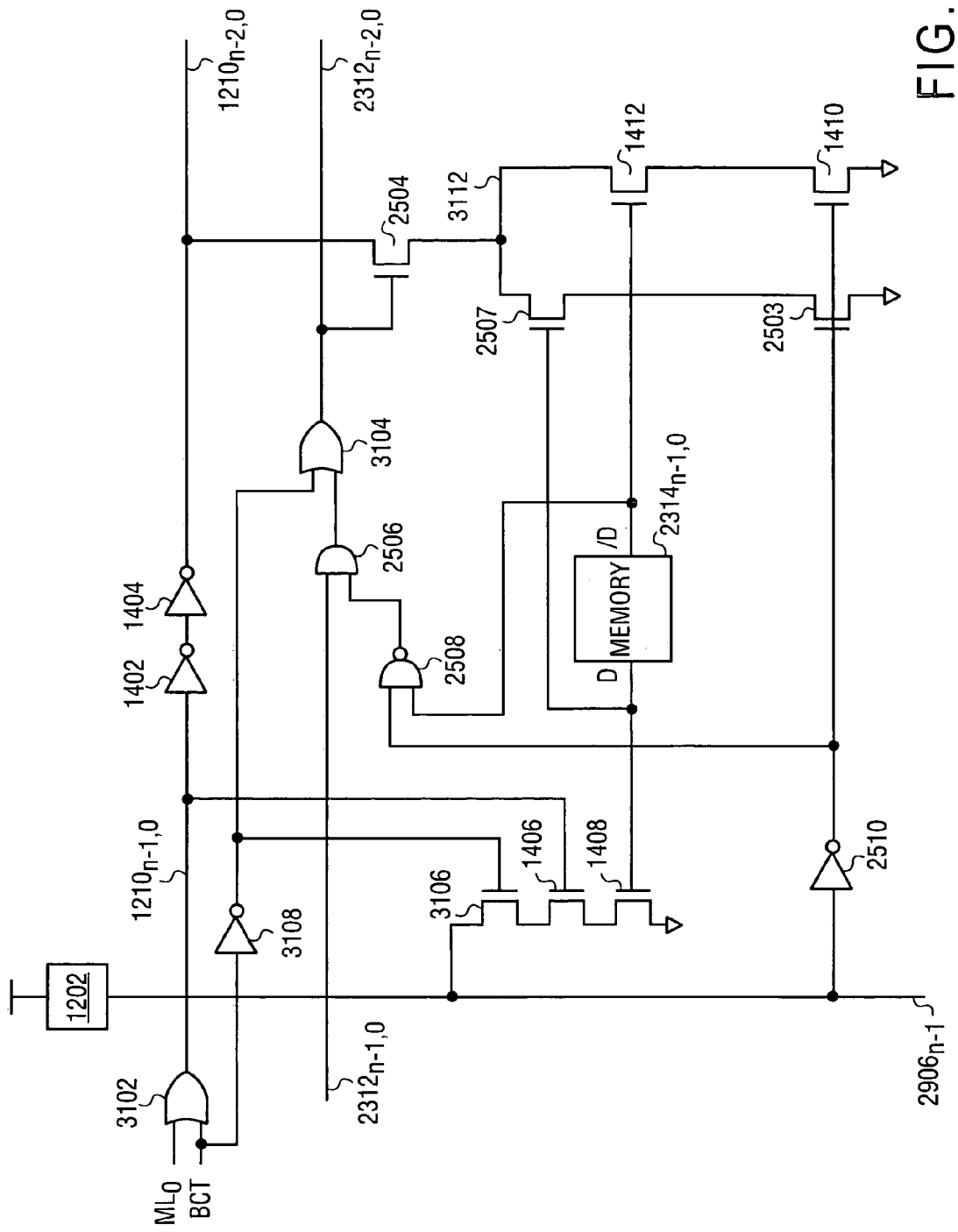
FIG. 32 is another embodiment of an inequality circuit element, a priority logic element and a memory element of FIG. 17.

For another embodiment, the priority numbers are assigned in descending priority order in priority memory 608. For this embodiment, logic and circuitry that implements the truth table shown in Table 2 (e.g., the logic and circuitry of FIG. 14 or 15 modified as indicated above) may be used for the priority logic elements to determine the lowest priority number as the most significant priority number. Also for this embodiment, the logic and circuitry shown in the truth table shown in Table 4 (e.g., the logic and circuitry of FIG. 27A or 27B) may be used for the inequality circuits to determine if a new priority number has a priority that is less than or equal to the priority number stored in counter 2306. FIG. 32 shows one example of combining the logic and circuitry of FIGS. 14 and 27 to implement the embodiment of FIG. 30 when the priority numbers are assigned in descending priority order in priority memory 608.

The embodiments of FIGS. 17–32 include additional inequality circuits to compare PNEW with the priority numbers already stored in the priority index table. For another embodiment, priority logic 610 itself can be used to determine whether to update existing priority numbers stored in the priority index table in response to an insert or delete instruction. As with the previously described embodiments above, the new policy statement and PNEW do not need to be physically inserted between the existing entries; rather, they can be loaded into any desirable address (e.g., the next free address) in the CAM array and priority memory, and the priority numbers of the existing policy statements updated accordingly. Similarly, when a policy statement is removed (i.e., invalidated or overwritten) from the CAM array, the priority logic may update the priority numbers of the previously stored policy statements. These updating functions can be performed by the priority logic without the need to physically reorder the policy statements in the CAM array, or to physically reorder the priority numbers in the priority index table. This can reduce the hardware and/or software needed for table management of the CAM array, and can increase the performance of a router incorporating the DSP.

When the priority numbers are assigned in ascending priority order and PNEW is to be added to any free location in memory 608, priority logic 610 can determine whether the priority numbers already stored in memory 608 should be incremented as follows. PNEW is decremented by one (or another value) and then compared with the existing priority numbers stored in memory 608 by priority logic 610. For this embodiment, the priority numbers in memory 608 are not compared with each other, but with the decremented PNEW. Since priority logic 610 determines which compared number is the lowest numerical value, it can also determine the logical converse; that is, it can determine which of the stored priority numbers are greater than the decremented PNEW. Each priority number that is greater than the decremented PNEW is then incremented by the priority logic. PNEW is then added to memory 608.

Figure 33:
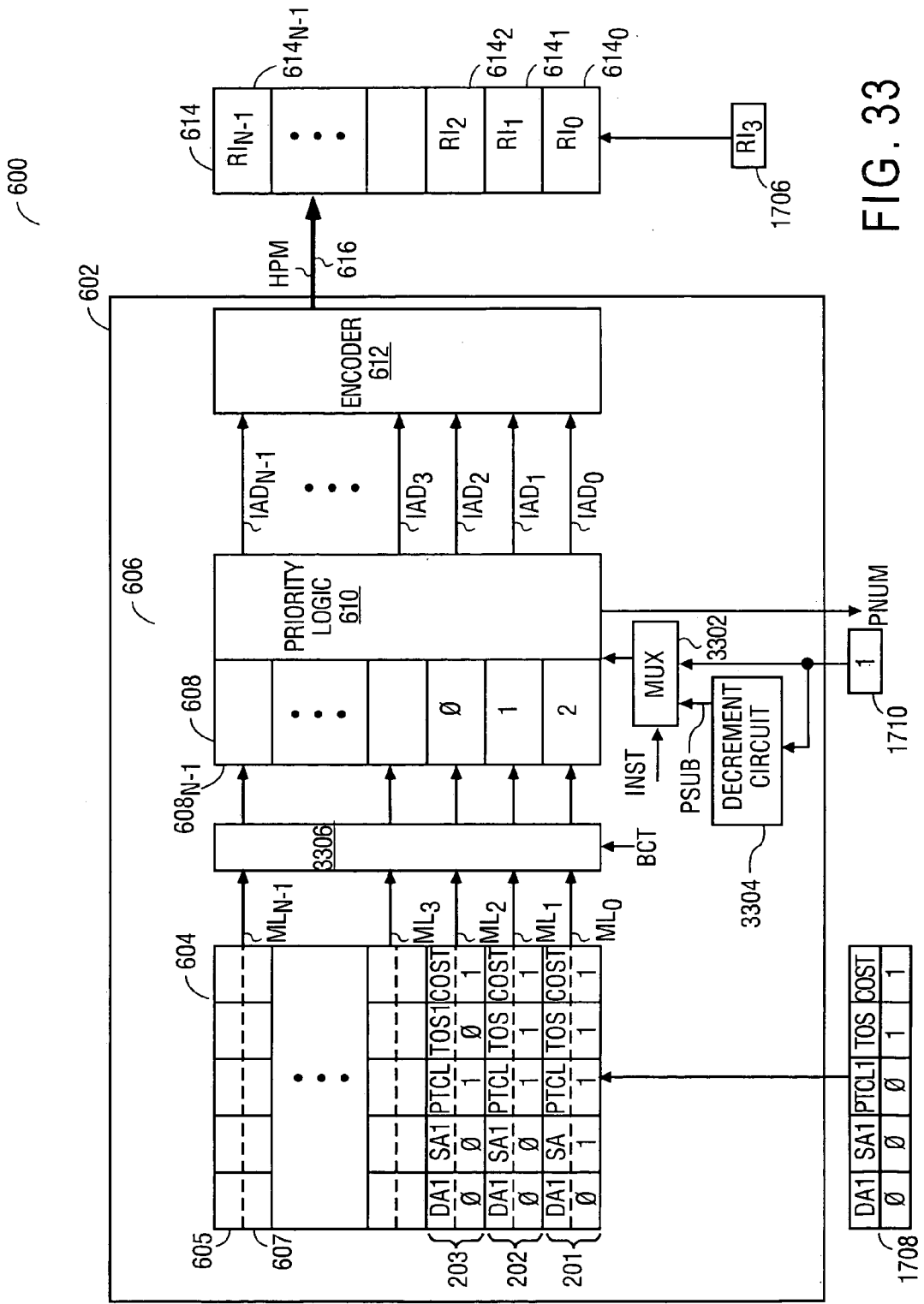
FIG. 33 is another embodiment of the priority index table of FIG. 6 including a decrement circuit and storing a policy.

FIG. 33 shows one example of inserting policy statement 1708 and PNEW into memory 608 having priority numbers 0, 1, and 2 assigned in ascending priority order. This is the same example shown in FIGS. 18 and 19, except that priority logic 610 is used to control updating of the priority numbers stored in memory 608. PNEW, having a value of 1, is decremented by 1 by decrement circuit 3304 to form PSUB having a value of zero. PSUB is then provided to priority table 606 via multiplexer 3302. Decrement circuit 3304 may be any subtraction circuit that decrements PNEW by one or another value. Multiplexer 3302 provides PSUB to priority index table 606 in response to control signal INST, which indicates that an insert function is to take place. INST may be generated by an instruction decoder (not shown) that receives an insert (write) instruction.

PSUB is compared with the stored priority numbers by priority logic 610. In response to control signal BCT, logic 3306 asserts all match lines $ML_0$–$ML_{N-1}$ to a particular logic state to indicate that all stored policy statements match policy statement 1708 (even though no actual comparison takes place) such that the priority logic will compare all of the priority numbers in memory 608 with PSUB. Logic 3306 may be any logic circuit including, for example, AND, OR, XOR, or inverter circuits. BCT is a control signal that indicates an insert or delete function is being performed by DSP 602. BCT may be generated by an instruction decoder (not shown). BCT may also be provided to priority logic 610 to indicate that priority logic 610 should compare PSUB with each entry in memory 608 rather than comparing each entry in memory 608 with each other as in the classification function of FIG. 7.

Priority logic 610 determines that stored priority number 0 is equal to PSUB, and leaves this stored number unchanged. Priority logic 610 also determines that stored priority numbers 1 and 2 are larger than PSUB, and increments these numbers to 2 and 3, respectively. Policy statement 1708 and PNEW are then loaded into a free address in array 604 and memory 608, respectively. The modified table entries after the insertion are shown in FIG. 34.

Note that if the priority number 0 is to be inserted, then decrement circuit 3304 would generate a negative number. For one embodiment, only priority numbers greater than 0 may be used. For another embodiment, offset circuitry may be included in DSP 602 to add an offset value to PNEW before it is provided to decrement circuit 3304 and/or multiplexer 3302. The offset circuitry may also be used to subtract the offset value when reading priority numbers from memory 608 such that the offset function is transparent to the user of DSP 602. For yet another embodiment, DSP 602 can detect that PNEW is equal to zero when an insert instruction is received by DSP 602, or when an underflow condition occurs in decrement circuit 3304. PNEW can then be incremented by one and be provided to decrement circuit 3304, or PNEW can be provided directly to priority index table 606 by multiplexer 3302. After all the priority numbers greater than zero are detected and updated by priority logic 610, then memory 608 can be searched for any existing entry that already has priority number 0. If so, this number can be incremented (i.e., by using the COUNT and UP signals, or by overwriting priority number 0 with priority number 1), and then PNEW added to memory 608.

A policy statement and its priority number may also be deleted or removed using priority logic 610. For example, policy statement 1708 may be removed from array 604, and its priority number 1 may be removed from memory 608 as follows. In response to a delete instruction, the priority number (3308) to be deleted is provided to policy index table 606 via multiplexer 3302 (INST logic low), and is compared with the entries in the priority memory. For this embodiment, priority memory 608 is a CAM, or has one or more compare circuits external to the memory to perform the comparison. For an alternative embodiment, the policy statement associated with priority number 3308 may be compared with the existing entries in CAM array 604. Since location 6083 matches priority number 3308, both the policy statement and the priority number are invalidated or deleted. As described above, this may be accomplished by setting a valid bit(s) to an appropriate state for that row in priority memory 608. If the valid bit(s) is located in CAM array 604, and is inaccessible by priority memory 608, then priority logic 610 can then identify the location of the matching entry (as described above), and provide the indication to $IAD_0$–$IAD_{N-1}$. These signal lines can then be provided through encoder 612 back to CAM array 604 (e.g., through a decoder) to address the appropriate location and invalidate the policy statement. Alternatively, the signal lines $IAD_0$–$IAD_{N-1}$ can be provided directly to CAM array 604 to access the appropriate location for invalidation. The delete process may stop at this point and potentially leave gaps in the priority numbers. Alternatively, the process may update the remaining entries in the priority memory. When the process continues, the deleted priority number 3308 is provided to policy index table 606 via multiplexer 3302, to determine which entries in the priority memory have a lower priority than the deleted priority number. Priority logic 610 identifies priority numbers 2 and 3 as having lower priorities (i.e., larger numerical values), and these numbers are decremented. The resultant table entries are as shown in FIG. 33.

Figure 34:
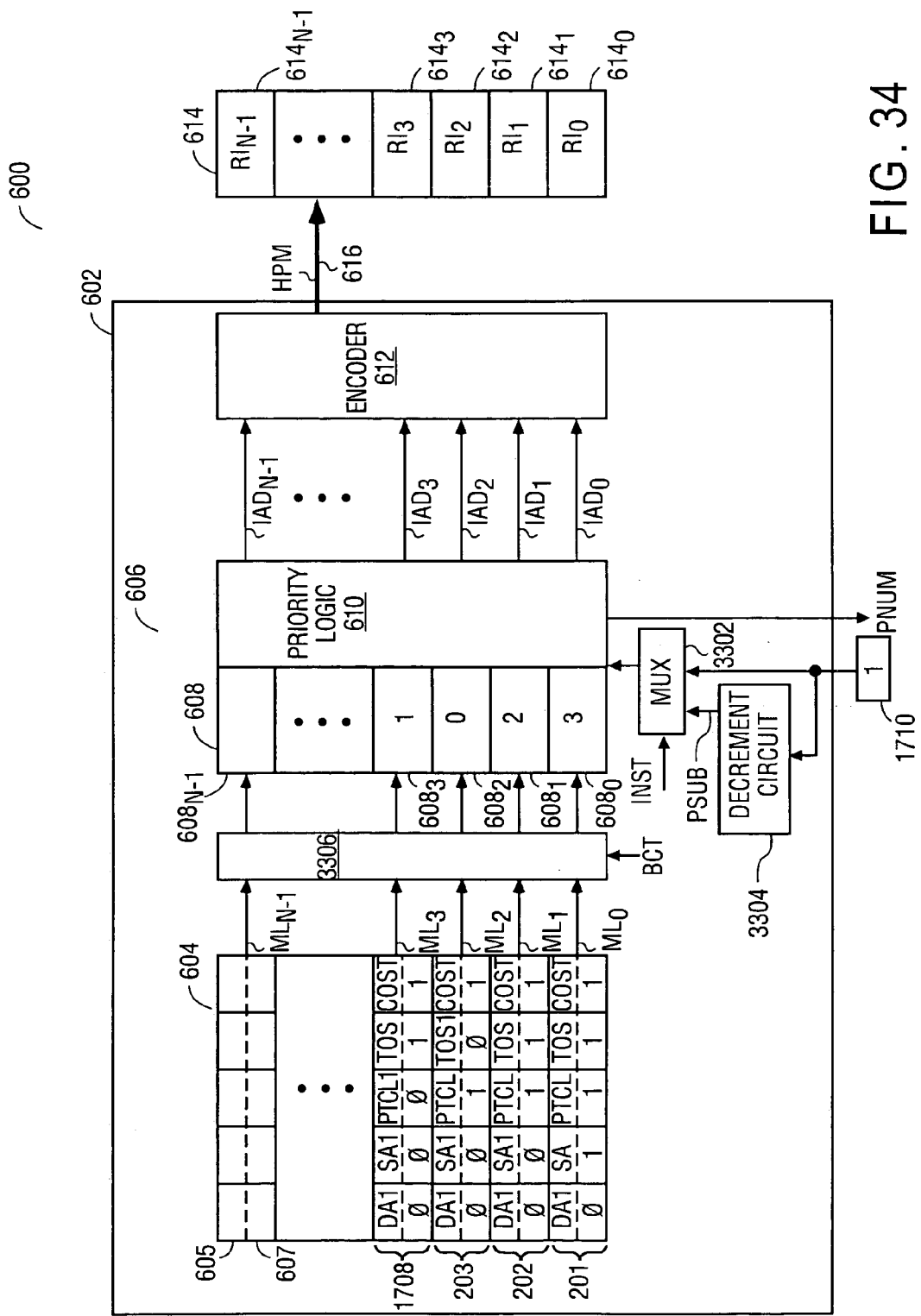
FIG. 34 is one example of loading a new policy statement into the digital signal processor of FIG. 33.

The comparison and updating functions described with respect to FIGS. 33 and 34 may also be performed by priority logic 610 on priority numbers assigned in descending priority order. For this embodiment, decrement circuit 3304 may be replaced with an increment circuit that increments PNEW prior to supplying it to priority index table 606 for comparison as part of an insert function.

Note that if the largest priority number $2n-1$ (where n is the number of bits in a row of memory 608) is to be inserted, then the increment circuit would generate a number larger than can be handled by priority index table 606. For one embodiment, only priority numbers less than $2n-1$ may be used. For another embodiment, offset circuitry may be included in DSP 602 to subtract an offset value to PNEW before it is provided to the increment circuit and/or multiplexer 3302. The offset circuitry may also be used to add the offset value when reading priority numbers from memory 608 such that the offset function is transparent to the user of DSP 602. For yet another embodiment, DSP 602 can detect that PNEW is equal to $2^n-1$ when an insert instruction is received by DSP 602, or when an overflow condition occurs in the increment circuit. PNEW can then be decremented by one and be provided to the increment circuit, or PNEW can be provided directly to priority index table 606 by multiplexer 3302. After all the priority numbers greater than $2^n-1$ are detected and updated by priority logic 610, then memory 608 can be searched for any existing entry that already has priority number $2^n-1$. If so, this number can be decremented (i.e., by using the COUNT and DOWN signals, or by overwriting priority number $2^n-1$ with priority number $2^n-2$), and then PNEW added to memory 608.

Figure 35:
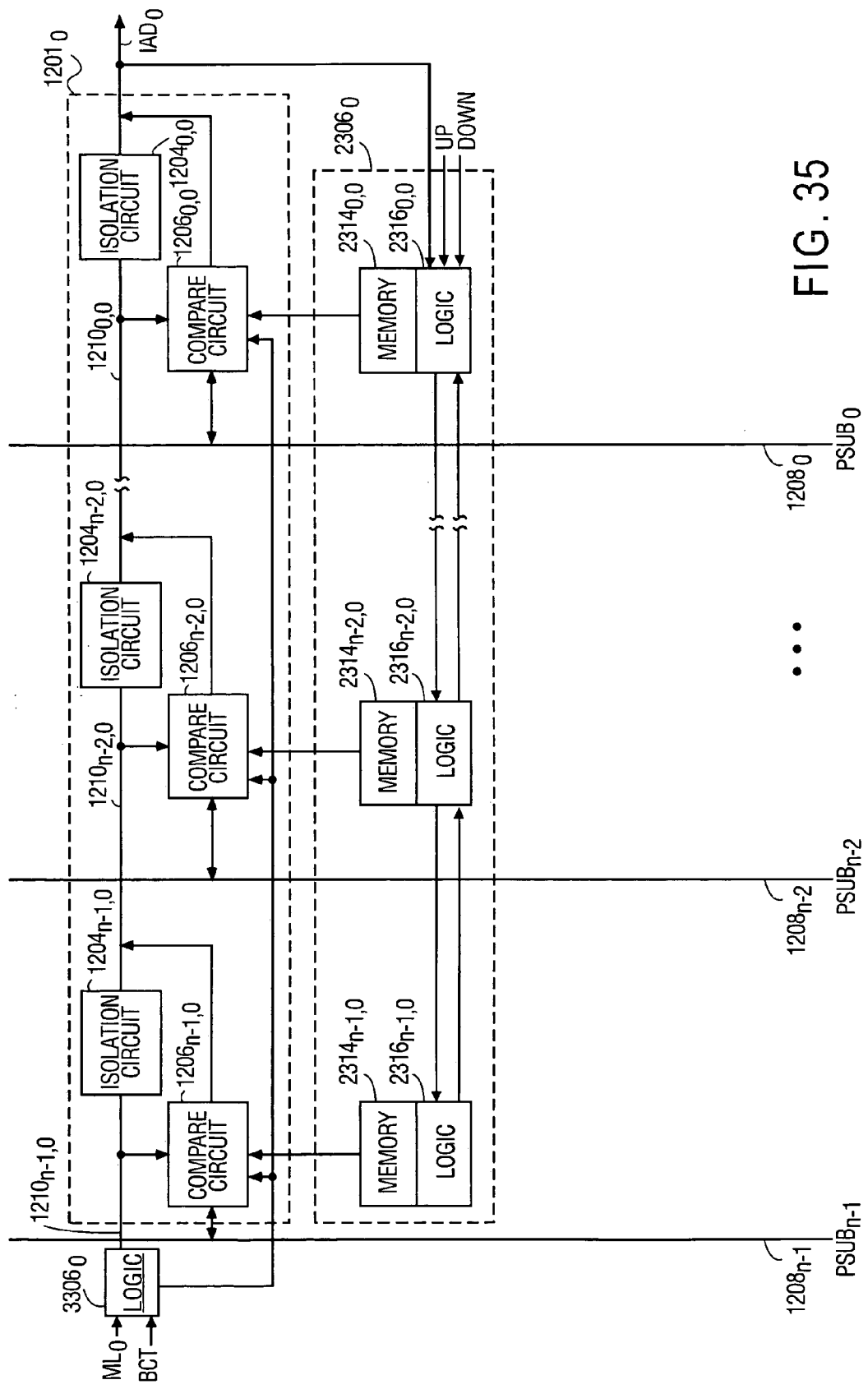
FIG. 35 is one embodiment of a row of the priority index table in FIG. 33.

The embodiments described above in FIGS. 33 and 34 include the ability of priority logic 610 to increment and/or decrement the priority numbers stored in priority memory 608. Priority memory 608 may be formed as counters that store the priority numbers. FIG. 35 shows one embodiment of a row of priority memory 608 in which the priority logic 610 includes a separate priority logic element for each bit of a priority number. For this embodiment, the priority logic includes row $1201_0$ of priority logic elements from FIG. 12A, coupled to receive priority number bits stored in counter $2306_0$ from FIG. 23. PSUB bits $PSUB_{n-1}$–$PSUB_0$ are provided on signal lines $1208_{n-1}$–$1208_0$, respectively, for comparison by compare circuits $1206_{n-1,0}$–$1206_{0,0}$ with the priority bits stored in memory elements $2314_{n-1,0}$–$2314_{0,0}$.

When BCT is asserted to a high logic state, logic $3306_0$ drives match line segment $1210_{n-1,0}$ to a high logic state, and PSUB is provided on signal lines 1208. BCT is also provided to each of compare circuits 1206 such that the circuits do not provide their compare results back to signal lines 1208. Thus, only PSUB will be supplied on signal lines 1208. For an alternative embodiment, a separate set of signal lines may be used for the updating functions and the classification function. When BCT is asserted to a low logic state, $ML_0$ is provided to match lines segment $1210_{n-1,0}$ and the classification function of FIG. 7 may be performed.

For this embodiment, the logical state of $IAD_0$ indicates the comparison result between PSUB and the priority number stored in counter $2306_0$. If $IAD_0$ indicates that PSUB has a more significant priority than the priority number stored in counter $2306_0$, then counter $2306_0$ is incremented. If, however, $IAD_0$ indicates that PSUB is equal to or has a less significant priority number than the priority number in counter $2306_0$, then counter $2306_0$ is not incremented.

Figure 36:
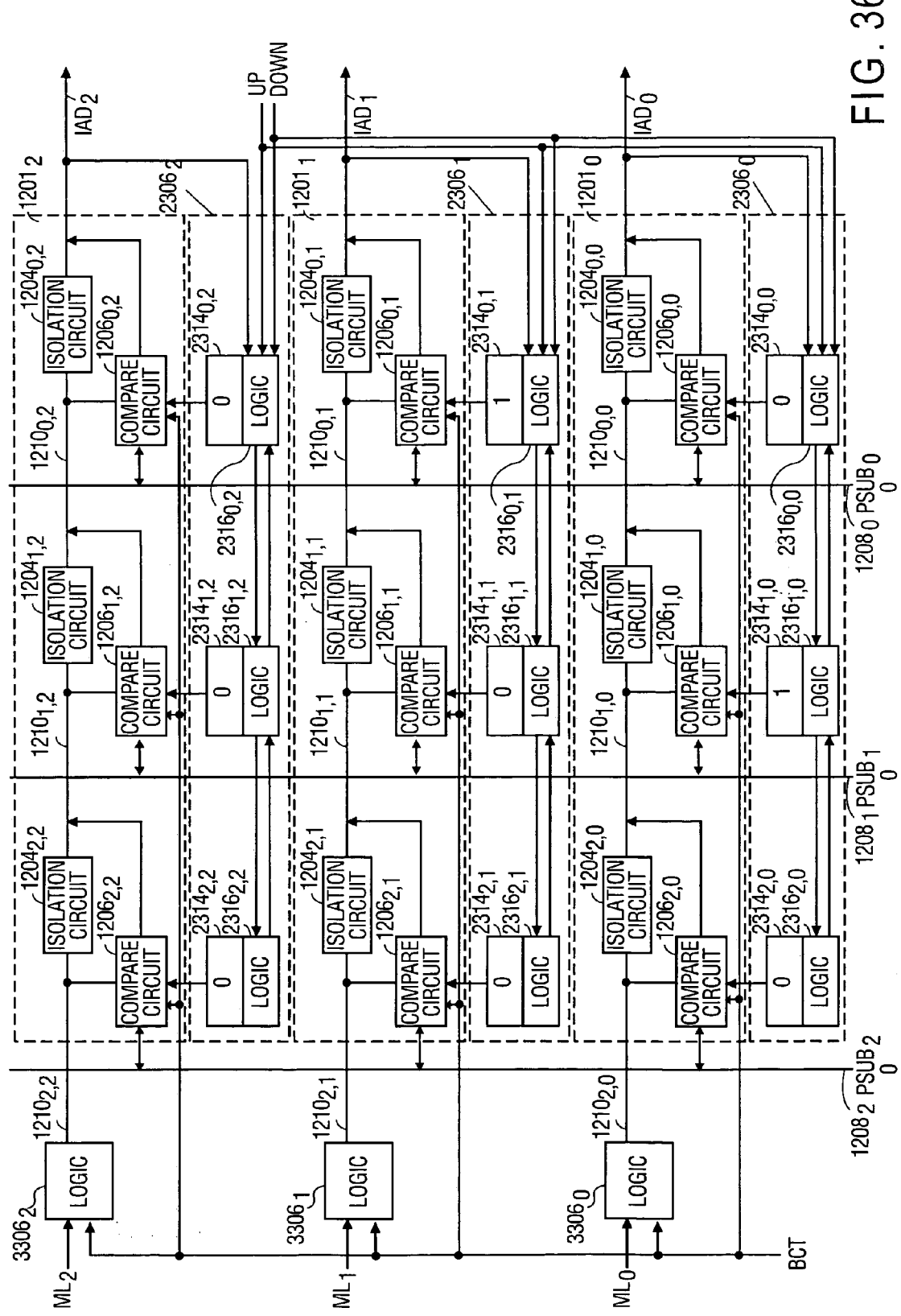
FIG. 36 is one example, of determining whether a new number is greater than or equal to priority numbers stored in the priority memory of FIG. 33.

The operation of the embodiment of FIG. 35 to update priority numbers in response to an insert instruction can be illustrated with the example shown in FIG. 36. In this example, a 3×3 matrix of rows and columns stores three priority numbers. For other embodiments, any numbers of rows and columns can be used. Row 0 stores priority number 010 having the decimal equivalent of the number 2, row 1 stores priority number 001 having the decimal equivalent of the number 1, and row 2 stores priority number 000 having the decimal equivalent of the number 0. For this example, the priority numbers are assigned in ascending priority order such that 000 is the most significant priority number, 001 is the next most significant priority number, and 010 is the least significant priority number.

When a new policy statement having new a priority number PNEW 001 is to be loaded into CAM array 604, BCT is asserted to a high logic state, the control signals on match line segments $1210_{2,2}$, $1210_{2,1}$, and $1210_{2,0}$ are asserted to a high logic state, and priority logic elements $1201_2$–$1201_0$ compare PSUB 000 (PNEW decremented by 1) with their corresponding priority numbers stored in counters $2306_2$–$2306_0$, respectively. Priority logic $1201_2$ determines that 000 is equal to PSUB; priority logic $1201_1$ determines that 001 is greater than PSUB; and priority logic $1201_0$ determines that 010 is greater than PSUB. Priority logic $1201_2$ leaves unchanged the priority number stored in counter $2306_2$. Circuits $1201_1$ and $1201_0$ cause counters $2306_1$ and $2306_0$ to increment by one their existing priority numbers. The new policy statement and PNEW can then be loaded into CAM array 604 and priority memory 608, respectively.

The comparisons of the most significant bit $PSUB_2$ with the most significant bits stored in counters $2306_2$–$2306_0$ are resolved first. When an individual compare circuit determines that its corresponding memory storage element stores the same logic state as the PSUB bit, the compare circuit leaves the control signal of the next match line segment unaffected such that it has the same logical state of the previous match line segment. Since each of memory storage elements $2314_{2,2}$, $2314_{2,1}$, and $2314_{2,0}$ store a logic zero and $PSUB_2$ is a logic zero, the control signals on match line segments $1210_{1,2}$, $1210_{1,1}$, and $1210_{1,0}$ remain asserted to a high logic state.

The comparison of the next most significant bit $PSUB_1$ with priority number bits stored in memory elements $2314_{1,0}$, $2314_{1,1}$ and $2314_{1,2}$ is then resolved. Since memory elements $2314_{1,2}$ and $2314_{1,1}$ store the same logic states as $PSUB_1$, the control signals on match line segments $1210_{0,2}$ and $1210_{0,1}$ remain in a high logic state. Compare circuit $1206_{1,0}$, however, determines that the priority number stored in counter $2306_0$ is greater than PSUB because: (1) memory element $2314_{1,0}$ stores a logic one; (2) match line segment $1210_{1,0}$ is a high logic state; and (3) $PSUB_1$ is a logic zero on signal line $1208_1$. When compare circuit $1206_{1,0}$ makes this determination, it discharges match line segment $1210_{0,0}$ to a low logic state. When a match line segment is discharged, all subsequent match line segments in that row are discharged to a low logic state such that IAD for that row is discharged to a low logic state. For this embodiment, when IAD is a low logic state, the counter associated with that row will be incremented when UP is asserted. Thus, $IAD_0$ will cause counter $2306_0$ to be incremented when UP is asserted.

Lastly, the comparison of the least significant bit $PSUB_0$ with priority number bits stored in memory elements $2314_{0,0}$, $2314_{0,1}$ and $2314_{0,2}$ is resolved. As indicated above, priority logic $1201_0$ has already determined that 010 is greater than 000 and thus $IAD_0$ remains asserted to a low logic state. Since the control signal on match line segment $1210_{0,2}$ is in a high logic state, compare circuit $1206_{0,2}$ compares the logic zero stored in memory element $2314_{0,2}$ with the logic zero of $PSUB_0$, and determines that PSUB is the same number as that stored in counter $2306_2$. In response, $IAD_2$ remains in a high logic state such that counter $2306_2$ is not updated. Compare circuit $1206_{0,1}$, however, determines that $PSUB_0$ is less than the logic one stored in memory element $2314_{0,1}$. Since the control signal is high on match line segment $1210_{0,0}$, compare circuit $1206_{0,1}$ discharges $IAD_1$ such that the priority number 001 stored in counter $2306_1$ will be incremented. After a sufficient amount of time has passed such that all of the bit comparisons have had time to resolve, the UP signal can be asserted such that the priority numbers in counters $2306_1$ and $2306_0$ are incremented. For one embodiment, the IAD signals can be latched prior to providing the UP signal. Subsequently, PNEW can be added to memory 608.

Figure 37:
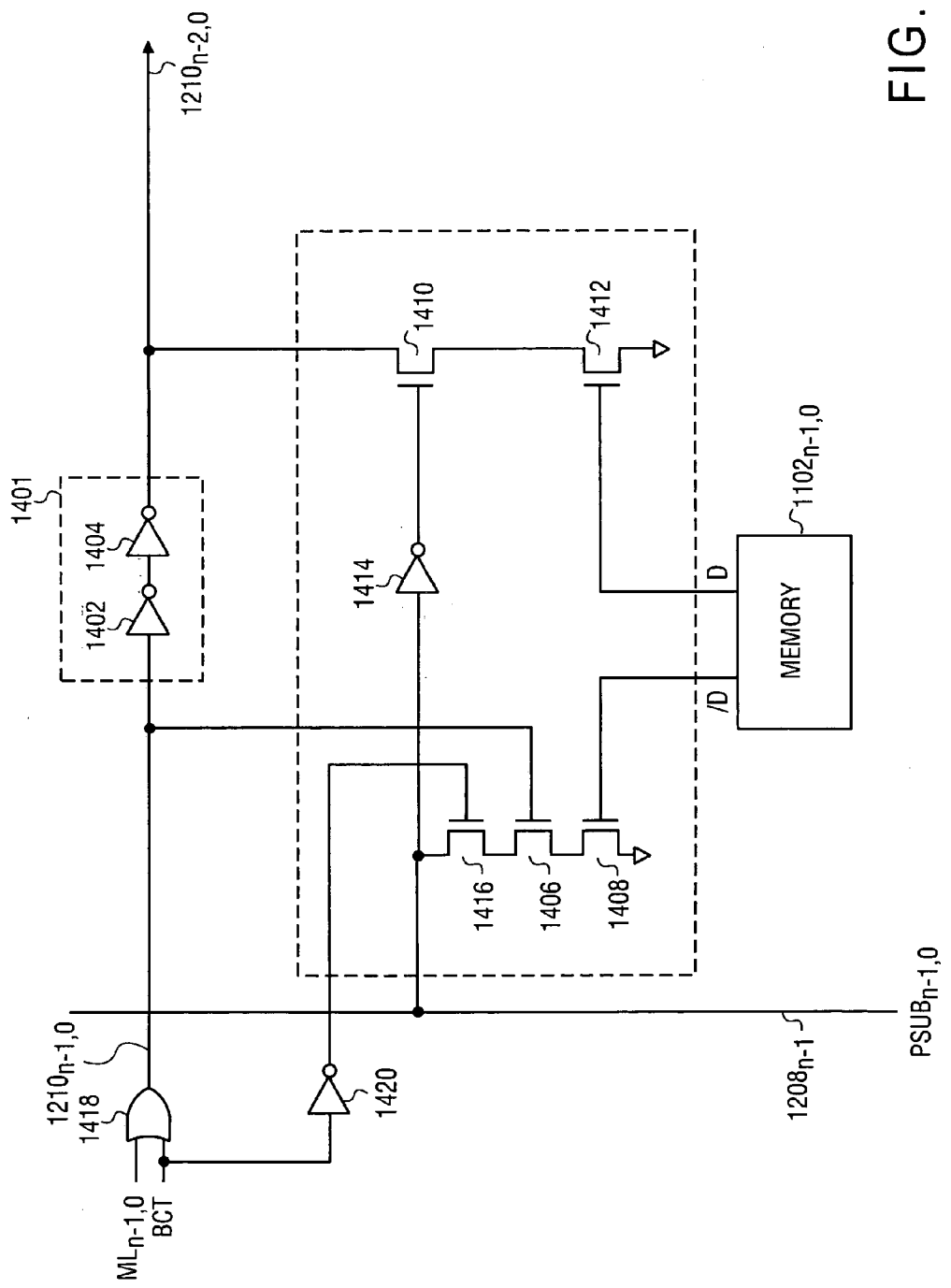
FIG. 37 is one embodiment of compare circuit and an isolation circuit for a priority logic element of FIG. 35.

Any compare circuits may be used for compare circuits 1206 to implement the process illustrated above. For example, the compare circuits illustrated above that implement Table 1 can be used with additional control for the BCT control signal. One embodiment of the modified circuit of FIG. 14 is shown in FIG. 37. In FIG. 37, transistor 1416 is included in series with transistors 1406 and 1408 between signal line $1208_{n-1}$ and ground. The gate of transistor 1416 is controlled by BCT via inverter 1420. A similar modification can be made to any of the other embodiments of the compare circuits 2314. OR gate 1418 is one embodiment of logic 3302.

While FIG. 36 shows an embodiment of inserting a new priority number into memory 608, the priority numbers can be decremented for a delete function by asserting the DOWN signal after all of the IAD signals are resolved.

Figure 38:
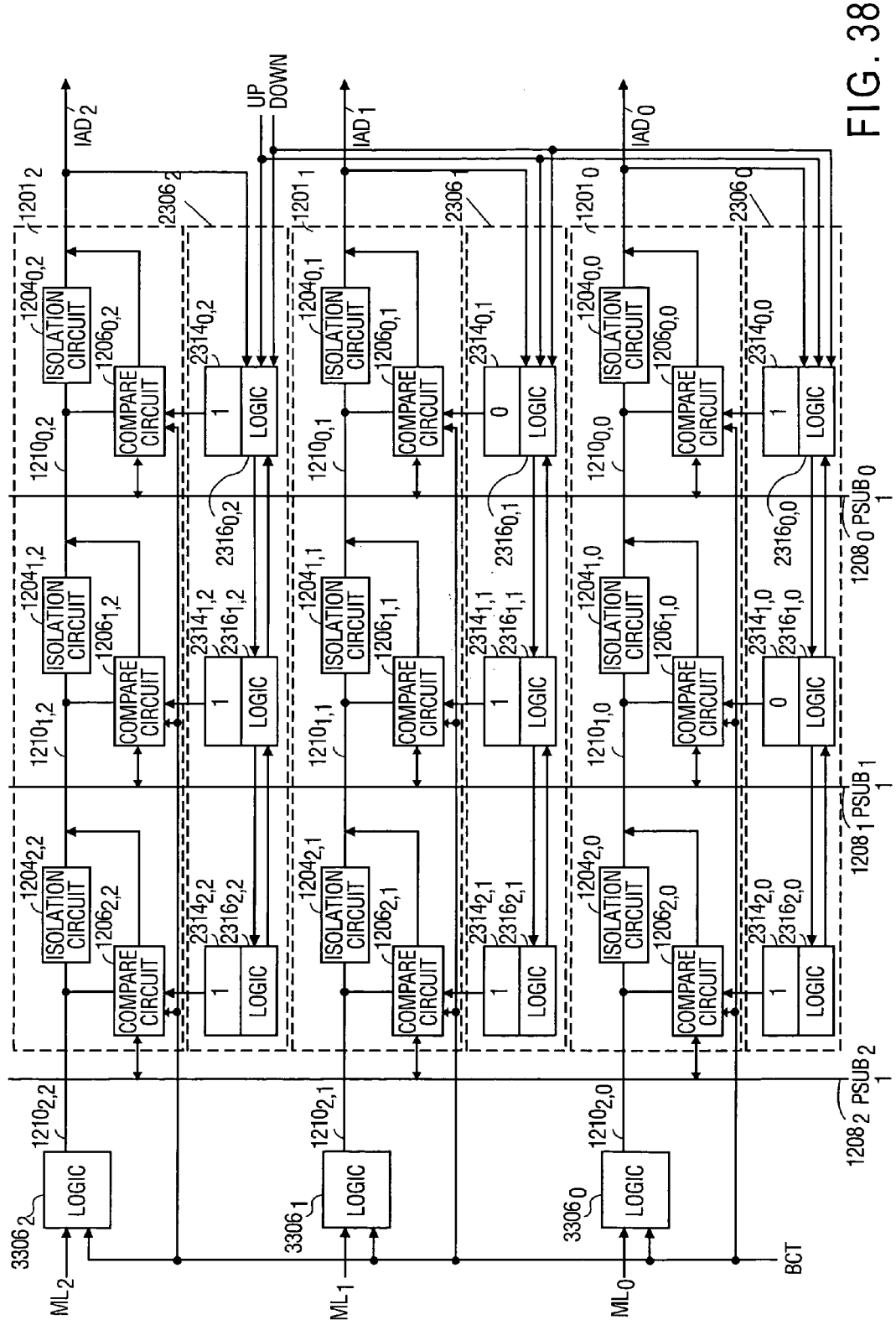
FIG. 38 is one example, of determining whether a new number is less than or equal to priority numbers stored in the priority memory of FIG. 33.

The embodiment of FIG. 35 can also insert and delete priority numbers assigned in descending priority order. FIG. 38 shows such an example with of a 3×3 matrix in which row 0 stores priority number 111 having the decimal equivalent of the number 7, row 1 stores priority number 110 having the decimal equivalent of the number 6, and row 2 stores priority number 101 having the decimal equivalent of the number 5. Thus, 111 is the most significant priority number, 110 is the next most significant priority number, and 101 is the least significant priority number.

When a new policy statement having a new priority number PNEW 110 is to be loaded into CAM array 604, BCT is asserted to a high logic state, control signals on match line segments $1210_{2,2}$, $1210_{2,1}$, and $1210_{2,0}$ are asserted to a high logic state, and priority logic elements $1201_2$–$1201_0$ compare PSUB 111 (PNEW incremented by 1) with their corresponding priority numbers stored in counters $2306_2$–$2306_0$, respectively. Priority logic $1201_2$ determines that 111 is equal to PSUB; priority logic $1201_1$ determines that 110 is less than PSUB; and priority logic $1201_0$ determines that 101 is less than PSUB. Priority logic $1201_2$ leaves unchanged the priority number stored in counter $2306_2$. Circuits $1201_1$ and $1201_0$ cause counters $2306_1$ and $2306_0$ to decrement by one their existing priority numbers. The new policy statement and PNEW can then be loaded into CAM array 604 and priority memory 608, respectively.

The comparisons of the most significant bit $PSUB_2$ with the most significant bits stored in counters $2306_2$–$2306_0$ are resolved first. When an individual compare circuit determines that its corresponding memory storage element stores the same logic state as the PSUB bit, the compare circuit leaves the control signal of the next match line segment unaffected such that it has the same logical state of the previous match line segment. Since each of memory storage elements $2314_{2,2}$, $2314_{2,1}$, and $2314_{2,0}$ store a logic one and $PSUB_2$ is a logic one, the control signals on match line segments $1210_{1,2}$, $1210_{1,1}$, and $1210_{1,0}$ remain asserted to a high logic state.

The comparison of the next most significant bit $PSUB_1$ with priority number bits stored in memory elements $2314_{1,0}$, $2314_{1,1}$ and $2314_{1,2}$ is then resolved. Since memory elements $2314_{1,2}$ and $2314_{1,1}$ store the same logic states as $PSUB_1$, the control signals on match line segments $1210_{0,2}$ and $1210_{0,1}$ remain in a high logic state. Compare circuit $1206_{1,0}$, however, determines that the priority number stored in counter $2306_0$ is less than PSUB because: (1) memory element $2314_{1,0}$ stores a logic zero; (2) match line segment $1210_{1,0}$ is a high logic state; and (3) $PSUB_1$ is a logic one on signal line $1208_1$. When compare circuit $1206_{1,0}$ makes this determination, it discharges match line segment $1210_{0,0}$ to a low logic state. When a match line segment is discharged to a low logic state, all subsequent match line segments in that row are discharged such that IAD for that row is discharged to a low logic state. When IAD is a low logic state, the counter associated with that row will be decremented when DOWN is asserted. Thus, $IAD_0$ will cause counter $2306_0$ to be decremented when DOWN is asserted.

Lastly, the comparison of the least significant bit $PSUB_0$ with priority number bits stored in memory elements $2314_{0,0}$, $2314_{0,1}$ and $2314_{0,2}$ is resolved. As indicated above, priority logic $1201_0$ has already determined that 101 is less than 111 and thus $IAD_0$ remains discharged to a low logic state. Since the control signal on match line segment $1210_{0,2}$ is in a high logic state, compare circuit $1206_{0,1}$ compares the logic one stored in memory element $2314_{0,2}$ with the logic one of $PSUB_0$, and determines that PSUB is the same number as that stored in counter $2306_2$. In response, $IAD_2$ remains in a high logic state such that counter $2306_2$ is not updated. Compare circuit $1206_{0,1}$, however, determines that $PSUB_0$ is greater than the logic zero stored in memory element $2314_{0,1}$. Since the control signal is asserted on match line segment $1210_{0,1}$, compare circuit $1206_{0,1}$ discharges IAD1 such that the priority number 110 stored in counter $2306_1$ will be decremented. After a sufficient amount of time has passed such that all of the bit comparisons have had time to resolve, the DOWN signal can be asserted such that the priority numbers in counters $2306_1$ and $2306_0$ are decremented. For one embodiment, the IAD signals can be latched prior to providing the DOWN signal. Subsequently, PNEW can be added to memory 608.

Any compare circuits may be used for compare circuits 1206 to implement the process illustrated in FIG. 38. For example, the compare circuits illustrated above that implement Table 3 can be used with additional control for the BCT control signal as illustrated in FIG. 37. While FIG. 38 shows an embodiment of inserting a new priority number into memory 608, the priority numbers can be incremented for a delete function by asserting the UP signal after all of the IAD signals are resolved.

DSP 602 can perform the updating functions described above with respect to FIGS. 17–38 asynchronously or synchronously. When DSP 602 operates synchronously, it receives a clock signal that may be used to clock in the policy search key and an instruction that causes the updating functions to be performed by DSP 602. DSP 602 may implement the updating functions in one or more clock cycles.

Depth Cascading DSP Devices

As described above, DSP 602 stores policy statements in CAM array 604 and identifies the highest priority matching policy statement without having to presort or prearrange the policy statements in the CAM array. DSP 602 may also be included in a system that has multiple DSPs connected in a depth cascade configuration that expands the number of memory locations in CAM array 604 and priority memory 608 to accommodate more policy statements and their associated priority numbers.

Figure 39:
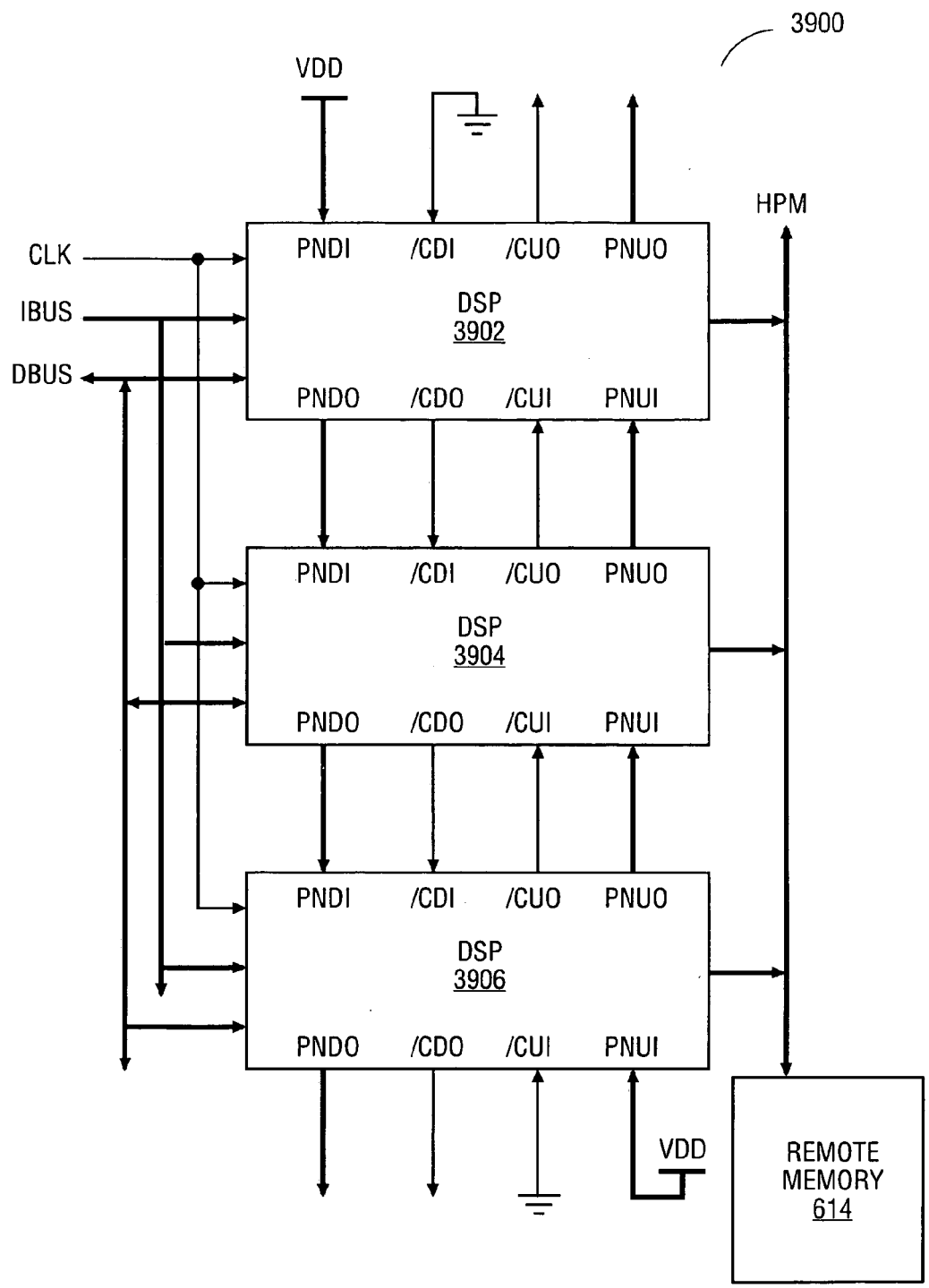
FIG. 39 is a block diagram of one embodiment of depth cascading digital signal processors.

FIG. 39 shows a CAM system 3900 that includes three DSPs 3902, 3904, and 3906 interconnected in a depth cascade configuration. Policy statements may be arbitrarily stored in DSPs 3902–3906 without initially presorting or prearranging the statements. When a classification or filtering operation, such as that described in FIG. 7, is performed by each of the DSPs in system 3900, the DSP that stores the highest priority matching statement for system 3900, as a whole, may be determined as will be described in more detail below. The DSP that includes the highest priority matching statement for system 3900 may be determined regardless of the number of CAM locations filled or occupied in each CAM array of each DSP (i.e., regardless of whether one or more CAM arrays of DSPs 3902–3906 is full, empty, or partially full).

Any number of DSPs may be depth cascaded as shown in FIG. 39. The total memory size of system 3900 is larger than the individual memory sizes of each of the CAM arrays in each DSP 3902–3906. For example, if each CAM array is a 16 k×144 bit CAM array, then system 3900 may operate as a DSP that includes a 48 k×144 bit CAM array. Any other size of CAM arrays may be used. Also, CAM arrays of different widths may be depth cascaded together. Additionally, system 3900 may be formed from stand-alone DSPs, or may be formed from integrated circuits on a common substrate.

Each DSP receives in parallel a clock signal CLK, policy statements and priority numbers on data bus DBUS, and instructions on instruction bus IBUS. For alternative embodiments, the policy statements and priority numbers may be provided on different buses. Other input signals may also be simultaneously provided to each of DSPs 3902–3906 including word enable signals, reset signals, chip enable signals, and the like. DSPs 3902–3906 also output their external address signal to a common HPM bus. When performing the classification function of FIG. 7, the DSP that has the highest priority matching policy statement will take control of the HPM bus. Each DSP 3902–3906 may include any of the embodiments of DSP 602 described above.

DSPs 3902–3906 may each include a cascade down input /CDI, a cascade down output /CDO, a cascade up input /CUI, a cascade up output /CUO, priority number down inputs PNDI, priority number down outputs PNDO, priority number up inputs PNUI, and priority number up outputs PNUO. The PNDO and PNUO outputs provide the most significant priority number PNUM generated by the priority logic in each priority index table in each of DSP 3902–3906. The cascade up and down outputs provide signals that indicate when PNUM is valid on the PNDO and PNUO outputs. For other embodiments, the cascade inputs and outputs may be omitted and CLK or match flag up and down signals may be used to validate the PNUM outputs. For an alternative embodiment, match flag up and down signals generated by flag logic coupled to CAM array 604 may be used to validate the PNUM outputs. Additional outputs or inputs such as full flag up and down pins may also be included.

Each CAM DSP generally has its /CDO output coupled to the /CDI input of the next DSP, its /CUO output coupled to the /CUI of the previous DSP, its /CDI input coupled to the /CDO of the previous DSP, its /CUI input coupled to the /CUO of the next DSP, its PNDO outputs coupled to the PNDI inputs of the next DSP, its PNDI inputs coupled to the PNDO outputs of the previous DSP, its PNUI inputs coupled to the PNUO outputs of the next DSP, and its PNUO outputs coupled to the PNUI inputs of the previous DSP.

DSP 3902 may be designated as the DSP that has the lowest logical system addresses by connecting its /CDI input to ground, and its PNDI inputs to VDD. For another embodiment, the PNDI inputs may be connected to ground and/or the /CDI inputs of DSP 3902 may be connected to VDD. DSP 3902 has the lowest logical or numerical addresses of, for example, zero to N−1. DSP 3904 has logical addresses N to M−1, and DSP 3906 has logical addresses M to W−1, where system 3900 has a total of W ternary CAM words available for storing policy statements. DSP 3906 may be designated as the last DSP in the cascade by connecting its PNUI inputs to VDD, and its /CUI input to ground. For another embodiment, the PNUI inputs of DSP 3906 may be connected to ground, and/or the /CUI input may be connect to VDD.

The operation of system 3900 for implementing the classification or filtering function of FIG. 7 is as follows. Initially, one or more of DSPs 3902–3906 is loaded with policy statements and corresponding priority numbers. In response to an instruction provided on the IBUS and the policy search key provided on the DBUS, each DSP 3902–3906 compares the policy search key with the policy statements stored in its CAM array 604 (step 702). The priority logic in each priority index table identifies its most significant priority number PNUM associated with one of its matching policy statements. Each DSP also determines the address of its PNUM in its priority memory 608 (steps 706 and 708). Each DSP then compares the priority numbers provided on its PNDI and PNUI pins with its own PNUM to determine whether it has a more significant priority number. If a DSP has a more significant or equal priority number than that provided on its PNUI pins, then the DSP outputs its own PNUM to its PNUO pins. If, however, a DSP has a lower priority PNUM than those provided on the PNUI pins, then the DSP outputs the priority number from its PNUI pins to its PNUO pins. Similarly, if a DSP has a more significant priority number than that provided on its PNDI pins, then the DSP outputs its own PNUM to its PNDO pins. If, however, a DSP has an equal or lower priority PNUM than those provided on the PNDI pins, then the DSP outputs the priority number from its PNDI pins to its PNDO pins.

By simultaneously providing and comparing priority numbers both down and up through system 3900, each DSP will ultimately determine whether it has the most significant priority number in the entire system. When a device has the most significant priority number for the system, it may take control of the HPM bus and output address information to access a location in route memory 614. For this embodiment, route memory 614 is as deep as the number of CAM memory location in system 3900.

Each of DSPs 3902–3906 can also update their own policy statement tables and priority memories as needed in response to an insertion or deletion instruction provided to system 3900. A new policy statement and priority number, for example, may be loaded into the DSP that has the next free address of system 3900 as determined by full flag signals (not shown).

Figure 40:
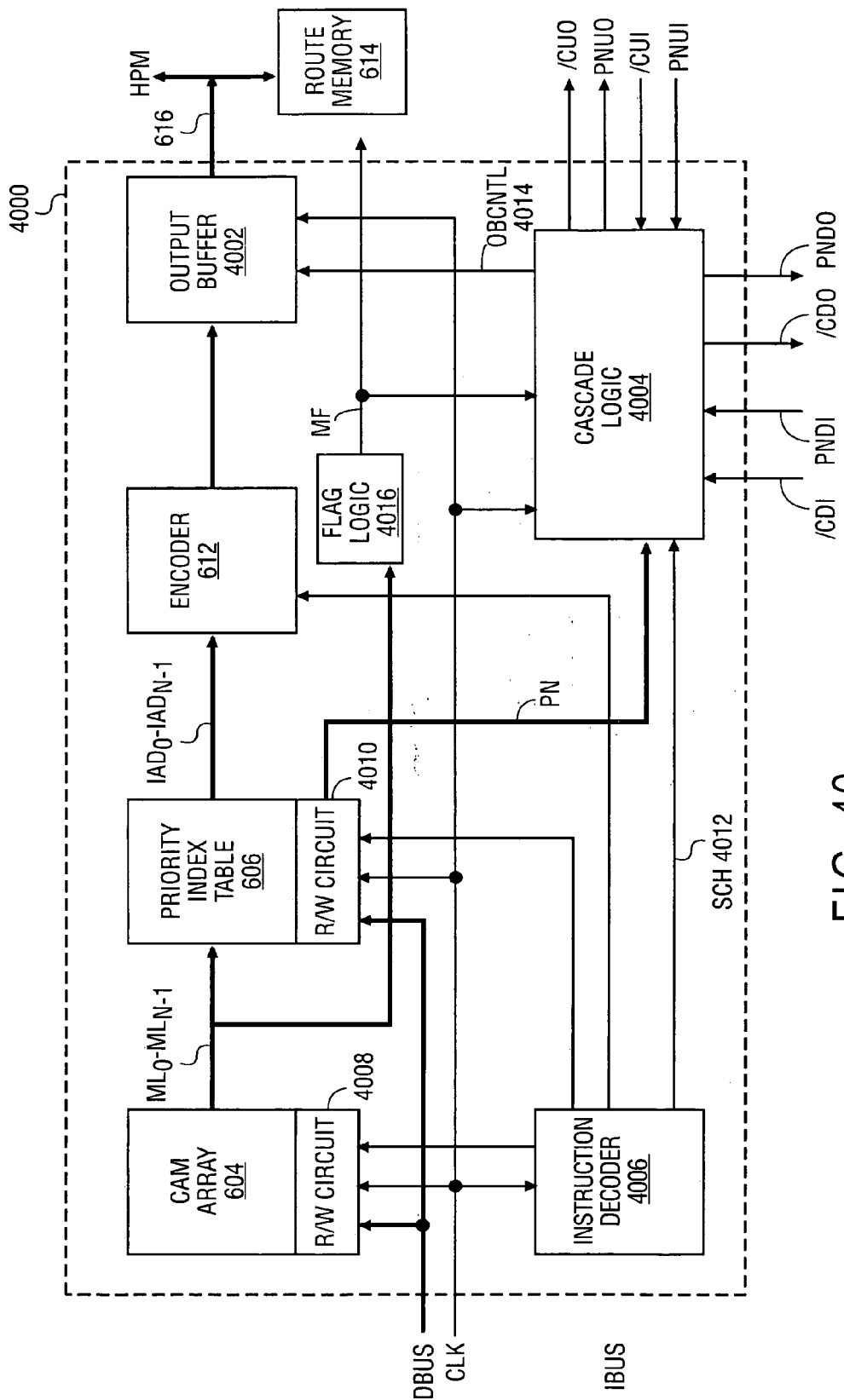
FIG. 40 is a block diagram of one embodiment of a digital signal processor including cascade logic.

FIG. 40 shows DSP 4000 that is one embodiment of DSPs 3902–3906. DSP 4000 is any of the embodiments of DSP 602 that further includes cascade logic 4004, output buffer 4002, instruction decoder 4006, read and write (R/W) circuits 4008 and 4010, and flag logic 4016. DSP 4000 may also include registers to store the policy statements and priority numbers prior to use by CAM array 604 and priority index table 606. Cascade logic 4004 is coupled to the /CDI, /CUI, PNDI, and PNUI inputs, and to the /CDO, /CUO, PNDO, and PNUO outputs. For another embodiment, the cascade inputs and outputs (i.e., /CDI, /CDO, /CUI, and /CUO) may be omitted and thus not coupled to cascade logic 4004. Cascade logic 4004 may also receive and output match flag and full flag cascade signals.

Cascade logic 4004 receives a search signal SCH on line 4012 from instruction decoder 4006 indicating that the classification or filtering operation will be performed by DSP 4000. Cascade logic 4004 may also receive a match flag signal /MF from flag logic 4016 indicating whether CAM array 604 has an address that matches a policy search key. Cascade logic 4004 compares the priority number on its PNDI inputs with its own most significant priority number PNUM from priority index table 606, and outputs the more significant number from among these two priority numbers to its PNDO outputs. Similarly, cascade logic 4004 compares the priority number on its PNUI inputs with its own PNUM, and outputs the more significant number from among these two priority numbers to its PNUO outputs. If DSP 4000 has the most significant priority number for the entire system 3900, then it asserts its output buffer control signal OBCNTL on signal line 4014 to enable output buffer 4002 to take control of the HPM bus.

Figure 41:
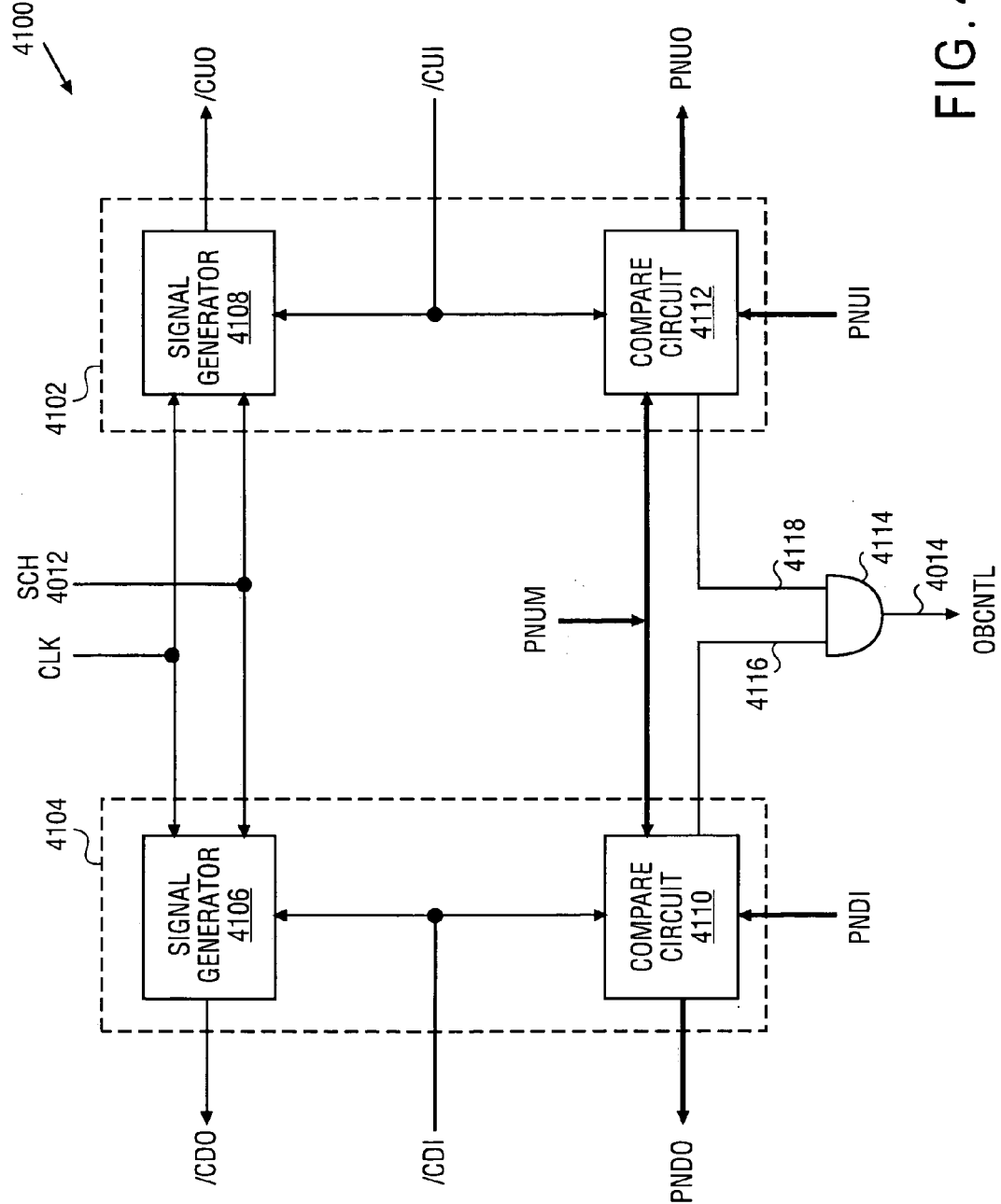
FIG. 41 is a block diagram of one embodiment of the cascade logic of FIG. 39.

FIG. 41 is a block diagram of cascade logic 4100 that is one embodiment of cascade logic 4004 of FIG. 40. Cascade logic 4100 includes cascade down logic 4104 and cascade up logic 4102. Cascade down logic 4104 generates signals for the /CDO and PNDO outputs in response to /CDI, PNDI inputs, and SCH. Cascade up logic 4102 generates signals on the /CUO and PNUO outputs in response to /CUI, PNUI inputs, and SCH. Other embodiments of cascade logic 4004 may be used. For example, match flag signals may be used.

Cascade down logic 4104 includes signal generator 4106 and compare circuit 4110. Signal generator 4106 receives CLK and SCH from instruction decoder 4006. SCH indicates that the classification of filtering function is to be performed by DSP 4000. Signal generator 4106 asserts /CDO to a low logic state after /CDI is asserted to a low logic state and when the priority number on the PNDO outputs is valid. Signal generator 4106 may be any logic circuit that performs this function. For an alternative embodiment, SCH may be omitted and signal generator 4106 may generate /CDO in response to CLK only. Compare circuit 4110 compares the internal most significant priority number PNUM with the priority number from the PNDI inputs. If the priority number on the PNDI inputs is equal to or more significant than PNUM, then compare circuit 4110 outputs the priority number from its PNDI inputs to its PNDO outputs and asserts signal line 4116 to a low logic state. If, however, PNUM is more significant than the priority number on the PNDI inputs, then compare circuit 4110 outputs PNUM to its PNDO outputs and asserts line 4116 to a high logic state.

Cascade up logic 4102 includes signal generator 4108 and compare circuit 4112. Signal generator 4108 receives CLK and SCH from instruction decoder 4006. Signal generator 4108 asserts /CUO to a low logic state after /CUI is asserted to a low logic state and when the priority number on the PNUO outputs is valid. Signal generator 4108 may be any logic circuit that performs this function. For an alternative embodiment, SCH may be omitted and signal generator 4108 may generate /CUO in response to CLK only. Compare circuit 4112 compares PNUM with the priority number from the PNUI inputs. If the priority number on its PNUI inputs is more significant than PNUM, then compare circuit 4112 outputs the priority number from its PNUI inputs to its PNUO outputs and asserts signal line 4118 to a low logic state. If, however, PNUM is equal to or more significant than the priority number on its PNUI inputs, then compare circuit 4112 outputs PNUM to the PNUO outputs and asserts line 4118 to a high logic state. When signal lines 4116 and 4118 are both at high logic states, AND gate 4114 asserts OBCNTL on line 4014 to a high state to enable output buffer 4002 to take control of the HPM bus.

For an alternative embodiment in which the cascade inputs (/CDI and /CUI) and cascade outputs (/CDO and /CUO) are omitted, signal generators 4106 and 4108 may also be omitted. For yet another embodiment in which multiple /CDI-/CDO and /CUI-/CUO pins are included, multiple pairs of signal generators may also be included, and/or match flag signals may be included.

Classless Inter Domain Routing (CIDR)

DSP 602 can also be used to process Internet Protocol (IP) packets that use the Classless Inter Domain Routing (CIDR) scheme. With CIDR, an IP address has a generalized network prefix of a particular number bits of 32-bit IPv4 or a 128-bit IPv6 address. The network prefix or mask indicates the number of left-most contiguous bits in the IP address that are used to filter an IP address in a routing table. That is, the network prefix indicates the number of higher-order or left-most contiguous bits in the IP address that participate in an address comparison with the routing table.

Conventional ternary CAM devices such as CAM 300 of FIG. 3 can store the IP addresses in rows 305, and their corresponding prefixes in rows 310. Routing information associated with a particular IP address is loaded into a corresponding address location in route memory 308. Due to the operation of priority encoder 306, IP addresses are generally presorted or prearranged prior to entry into a CAM device such that the IP address with the longest network prefix is located in the lowest logical address of the CAM array, and the IP address with the shortest network prefix is located in the highest logical address of the CAM array.

When the IP addresses are presorted, a search on the CAM array for a particular IP address will identify the IP address that has the longest corresponding prefix, that is, will identify the best match.

A considerable amount of time is generally required to prearrange all of the CIDR address entries prior to loading the entries into a CAM device. Additionally, a considerable amount of time and overhead is also generally required to maintain the order of the routing table when entries are deleted or overwritten, or when new entries are to be added. Other architectures have been proposed that increase the size of the CAM array by adding additional logic in the CAM array itself and another match coupled to the rows of mask cells.

DSP 602 of FIG. 6 can be used to process IP addresses without adding additional logic or signal lines to ternary CAM array 604. IP addresses can be loaded into CAM cell rows 605, and the corresponding decoded prefix data can be loaded into mask rows 607. Decoding logic can be provided in DSP 602 to decode the prefix number. Additionally, the prefix data is encoded into a binary number and stored in corresponding locations in priority memory 608. Encoding logic can be provided in DSP 602 to encode the prefix number into a binary (or other code) number.

When a search is performed for the IP address with the longest prefix, all matching locations in CAM array 604 will assert their corresponding match lines $ML_0$–$ML_{N-1}$. Priority logic 610 then compares, with each other, the encoded prefix numbers associated with the matching IP address. Priority logic 610 identifies the most significant encoded prefix number (i.e., the highest prefix number), and identifies its location in priority memory 608 to $IAD_0$–$IAD_{N-1}$. The encoded most significant prefix number may also be output from DSP 600. Encoder 612 then encodes the identified location into an address for output to HPM bus 616. The corresponding route information can then be accessed in route memory 614. As in the previous embodiments described above, route memory 614 may also be included within DSP 602.

For another embodiment, there may more than one identical most significant priority numbers identified by priority logic 610. For this embodiment, encoder 612 may be a conventional priority encoder that determines which address to output based on a predetermined priority (i.e., based on logical address locations).

DSP 602 can process the CIDR based IP addresses without preloading the IP addresses in the CAM array in a predetermined order. Additionally, new IP address may be added at the next free address or any other designated address in CAM array 604 without reordering or reloading the CAM array. This can reduce the hardware and/or software needed for table management of the CAM array, and can increase the performance of a router incorporating the DSP.

Figure 42:
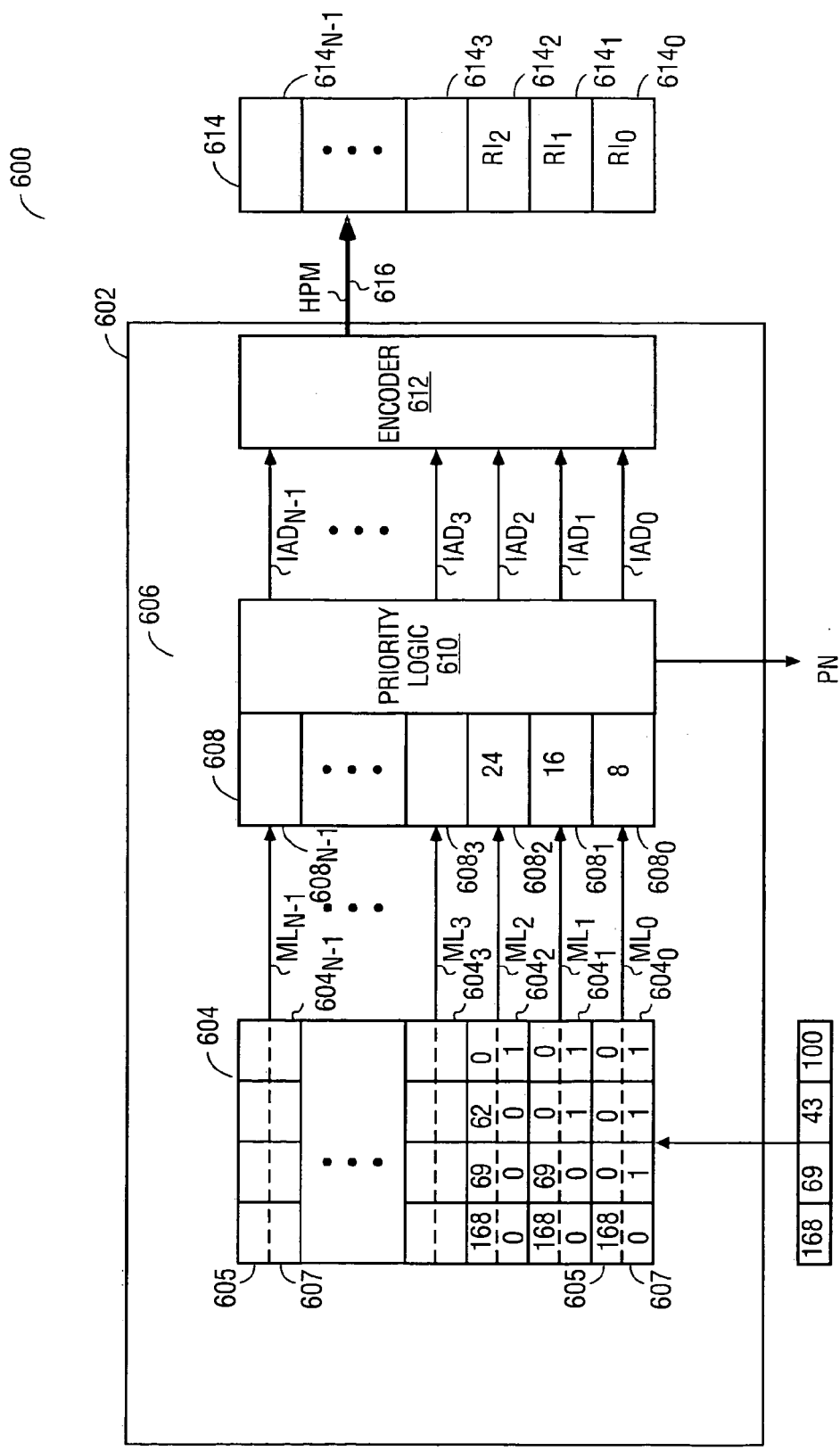
FIG. 42 is one example of processing Internet protocol addresses based on a classless inter domain routing scheme in the digital signal processor of FIG. 6.

The operation of DSP 602 for processing CIDR based IP addresses can be illustrated by the example of FIG. 42. In FIG. 42, ternary CAM array 604 has IP address 168.0.0.0/8 stored at location $604_0$, 168.69.0.0/16 stored at location $604_1$, and 168.69.62.0/24 stored at location 6042. For this embodiment, each IP address is stored in array 604 as four eight-bit binary numbers. Also for this embodiment, when the decoded prefix data is a logic zero it does not mask the corresponding bits of the IP address. Priority memory 608 stores the prefixes 8, 16, and 24 at locations $608_0$, $608_1$, and $608_2$, and the corresponding routing information $RI_0$, $RI_1$, and $RI_2$ are stored at locations $614_0$, $614_1$, and $614_2$ of route memory 614.

A search key of 168.69.43.100 is provided to CAM array 604, and the IP address with the best match (i.e., the longest prefix data) is determined as follows. When the search key is compare with the IP addresses, 168.69.0.0/16 and 168.0.0.0/8 are both identified as matches and $ML_0$ and $ML_1$ asserted. Between these two IP addresses, 168.69.0.0/16 is the best match as it has a longer prefix. Priority logic 610 compares the prefixes 16 and 8 stored at locations $608_0$ and $608_1$ and determines that 16 is greater than 8. The priority logic outputs 16 as the longest matching prefix to PNUM, and also identifies location $608_1$ by asserting $IAD_1$. Encoder 612 then encodes $IAD_0$–$IAD_{N-1}$ and generates an address of 1 on HPM bus 616 to access route information $RI_1$ in route memory 614.

Any of the embodiments of DSP 602 described above can be used to implement priority logic 610 to process CIDR based IP addresses and their prefix numbers. Additionally, multiple DSPs can be depth cascaded as described in FIGS. 39–41 to implement a system that provides a sufficient number of CAM array locations for storing IP addresses.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A method of adding a new policy statement to a plurality of policy statements stored in a first memory, comprising:
    comparing a new priority number associated with the new policy statement
    to a plurality of priority numbers stored in a second memory, the plurality of priority numbers each associated with a respective one of the plurality of policy statements stored in the first memory;
    determining that the new priority number is more significant than one of the plurality of priority numbers stored in the second memory;
    updating the one of the plurality of priority numbers in the second memory without changing its physical location in the second memory;
    writing the new priority number to an available location in the second memory; and
    writing the new policy statement to an available location in the first memory.

2. The method of claim 1, wherein the new priority number is more significant than the one of the plurality of priority numbers when the new priority number is greater than or equal to the one of the plurality of priority numbers.

3. The method of claim 1, wherein the new priority number is more significant than the one of the plurality of priority numbers when the new priority number is less than or equal to the one of the plurality of priority numbers.

4. A method of adding a new policy statement to a plurality of policy statements stored in a first memory, comprising:
    altering a new priority number associated with the new policy statement;
    comparing the altered new priority number to a plurality of priority numbers stored in a second memory, the plurality of priority numbers each associated with a respective one of the plurality of policy statements stored in the first memory;

determining that the altered new priority number is more significant than one of the plurality of priority numbers stored in the second memory;

updating the one of the plurality of priority numbers in the second memory without changing its physical location in the second memory;

writing the unaltered new priority number to an available location in the second memory; and writing the new policy statement to an available location in the first memory.

5. The method of claim 4, wherein the altered new priority number is more significant than the one of the plurality of priority numbers when the altered new priority number is greater than the one of the plurality of priority numbers.

6. The method of claim 4, wherein the altered new priority number is more significant than the one of the plurality of priority numbers when the altered new priority number is less than the one of the plurality of priority numbers.

7. The method of claim 4, wherein altering the new priority number comprises decrementing the new priority number.

8. The method of claim 4, wherein altering the new priority number comprises incrementing the new priority number.

* * * * *